(12) United States Patent
Miyake et al.

(10) Patent No.: US 9,048,117 B2
(45) Date of Patent: *Jun. 2, 2015

(54) PULSE OUTPUT CIRCUIT, DISPLAY DEVICE, AND ELECTRONIC DEVICE

(71) Applicant: SEMICONDUCTOR ENERGY LABORATORY CO., LTD., Atsugi-shi, Kanagawa-ken (JP)

(72) Inventors: Hiroyuki Miyake, Kanagawa (JP); Kei Takahashi, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 31 days.

This patent is subject to a terminal disclaimer.

(21) Appl. No.: 13/709,377

(22) Filed: Dec. 10, 2012

(65) Prior Publication Data

US 2013/0093025 A1   Apr. 18, 2013

Related U.S. Application Data

(63) Continuation of application No. 12/699,929, filed on Feb. 4, 2010, now Pat. No. 8,330,702.

(30) Foreign Application Priority Data

Feb. 12, 2009   (JP) ................................ 2009-029477

(51) Int. Cl.
*G11C 19/00* (2006.01)
*H01L 27/088* (2006.01)
*G09G 3/36* (2006.01)
(Continued)

(52) U.S. Cl.
CPC ............ *H01L 27/088* (2013.01); *G09G 3/3677* (2013.01); *G09G 2300/0408* (2013.01); *G09G 2310/0286* (2013.01); *G09G 2320/043* (2013.01); *G11C 19/28* (2013.01);
(Continued)

(58) Field of Classification Search
None
See application file for complete search history.

(56) References Cited

U.S. PATENT DOCUMENTS

| 4,409,134 A | 10/1983 | Yamazaki |
| 5,410,583 A | 4/1995 | Weisbrod et al. |

(Continued)

FOREIGN PATENT DOCUMENTS

| EP | 1978502 A | 10/2008 |
| JP | 61-033016 | 2/1986 |

(Continued)

OTHER PUBLICATIONS

Jang.Y et al., "Integrated Gate Driver Circuit Using a-Si TFT with Dual Pull-down Structure.,", IDW '04 : Proceedings of the 11th International Display Workshops, Dec. 8, 2004, pp. 333-336.

*Primary Examiner* — Tuan T Lam
(74) *Attorney, Agent, or Firm* — Nixon Peabody LLP; Jeffrey L. Costellia

(57) ABSTRACT

An object of the present invention is to suppress deterioration in the thin film transistor. A plurality of pulse output circuits each include first to eleventh thin film transistors is formed. The pulse output circuit is operated on the basis of a plurality of clock signals which control each transistor, the previous stage signal input from a pulse output circuit in the previous stage, the next stage signal input from a pulse output circuit in the next stage, and a reset signal. In addition, a microcrystalline semiconductor is used for a semiconductor layer serving as a channel region of each transistor. Therefore, degradation of characteristics of the transistor can be suppressed.

21 Claims, 30 Drawing Sheets

(51) Int. Cl.
*G11C 19/28* (2006.01)
*H01L 29/04* (2006.01)
*H01L 29/786* (2006.01)
*H01L 27/12* (2006.01)

(52) U.S. Cl.
CPC .............. *G11C 19/285* (2013.01); *H01L 29/04* (2013.01); *H01L 29/78696* (2013.01); *H01L 27/1288* (2013.01)

(56) References Cited

U.S. PATENT DOCUMENTS

| | | | |
|---|---|---|---|
| 5,517,542 A | 5/1996 | Huq | |
| 5,812,284 A | 9/1998 | Mizutani et al. | |
| 5,949,271 A | 9/1999 | Fujikura | |
| 6,064,713 A | 5/2000 | Lebrun et al. | |
| 6,300,928 B1 | 10/2001 | Kim | |
| 6,426,743 B1 | 7/2002 | Yeo et al. | |
| 6,556,646 B1 | 4/2003 | Yeo et al. | |
| 6,690,347 B2 | 2/2004 | Jeon et al. | |
| 6,813,332 B2 | 11/2004 | Nagao et al. | |
| 6,845,140 B2 | 1/2005 | Moon et al. | |
| 6,876,353 B2 | 4/2005 | Morosawa et al. | |
| 6,928,135 B2 | 8/2005 | Sasaki et al. | |
| 7,050,036 B2 | 5/2006 | Kim et al. | |
| 7,057,598 B2 | 6/2006 | Azami et al. | |
| 7,116,748 B2 | 10/2006 | Nagao et al. | |
| 7,250,788 B2 | 7/2007 | Lee et al. | |
| 7,268,756 B2 | 9/2007 | Koyama et al. | |
| 7,289,593 B2 | 10/2007 | Tobita et al. | |
| 7,382,347 B2* | 6/2008 | Sasaki et al. | 345/100 |
| 7,403,586 B2 | 7/2008 | Tobita et al. | |
| 7,443,944 B2 | 10/2008 | Tobita et al. | |
| 7,446,570 B2 | 11/2008 | Lee et al. | |
| 7,486,269 B2 | 2/2009 | Moon | |
| 7,511,709 B2 | 3/2009 | Koyama et al. | |
| 7,633,477 B2 | 12/2009 | Jang et al. | |
| 7,687,808 B2 | 3/2010 | Umezaki | |
| 7,710,384 B2 | 5/2010 | Azami et al. | |
| 7,800,576 B2* | 9/2010 | Jinta | 345/100 |
| 7,859,510 B2 | 12/2010 | Umezaki | |
| 7,932,888 B2 | 4/2011 | Miyake | |
| 7,978,274 B2 | 7/2011 | Umezaki et al. | |
| 8,031,160 B2 | 10/2011 | Chen et al. | |
| 8,054,279 B2 | 11/2011 | Umezaki et al. | |
| 8,164,555 B2 | 4/2012 | Miyake et al. | |
| 8,179,357 B2 | 5/2012 | Otose | |
| 8,264,445 B2 | 9/2012 | Azami et al. | |
| 8,310,474 B2 | 11/2012 | Koyama et al. | |
| 8,552,948 B2 | 10/2013 | Miyake et al. | |
| 8,786,533 B2 | 7/2014 | Azami et al. | |
| 2004/0090412 A1 | 5/2004 | Jeon et al. | |
| 2005/0220262 A1 | 10/2005 | Moon | |
| 2006/0001637 A1 | 1/2006 | Pak et al. | |
| 2006/0139292 A1 | 6/2006 | Yoon et al. | |
| 2006/0220587 A1 | 10/2006 | Tobita et al. | |
| 2006/0280279 A1 | 12/2006 | Nagao et al. | |
| 2007/0040792 A1 | 2/2007 | Kwag et al. | |
| 2007/0070020 A1 | 3/2007 | Edo et al. | |
| 2007/0079191 A1 | 4/2007 | Shin | |
| 2007/0086558 A1 | 4/2007 | Wei et al. | |
| 2007/0247932 A1 | 10/2007 | Tobita | |
| 2007/0274433 A1 | 11/2007 | Tobita | |
| 2008/0002805 A1 | 1/2008 | Tobita et al. | |
| 2008/0007296 A1 | 1/2008 | Umezaki | |
| 2008/0062112 A1 | 3/2008 | Umezaki | |
| 2008/0088555 A1 | 4/2008 | Shin et al. | |
| 2008/0246717 A1 | 10/2008 | Miyake et al. | |
| 2008/0253201 A1 | 10/2008 | Gen-Chi | |
| 2009/0224245 A1 | 9/2009 | Umezaki | |
| 2010/0026619 A1 | 2/2010 | Umezaki | |
| 2010/0245307 A1 | 9/2010 | Kimura et al. | |
| 2010/0245335 A1 | 9/2010 | Kimura et al. | |
| 2010/0246750 A1 | 9/2010 | Kimura et al. | |
| 2012/0127068 A1 | 5/2012 | Otose | |
| 2012/0146978 A1* | 6/2012 | Park et al. | 345/211 |
| 2013/0156148 A1* | 6/2013 | Sasaki et al. | 377/64 |
| 2013/0251091 A1* | 9/2013 | Nagao et al. | 377/64 |
| 2014/0023173 A1* | 1/2014 | Miyake | 377/54 |

FOREIGN PATENT DOCUMENTS

| | | |
|---|---|---|
| JP | 2002-335153 A | 11/2002 |
| JP | 2004-226429 | 8/2004 |
| JP | 2005-037842 A | 2/2005 |
| JP | 2005-050502 | 2/2005 |
| JP | 2006-309893 A | 11/2005 |
| JP | 2006-024350 | 1/2006 |
| JP | 2006-107692 A | 4/2006 |
| JP | 2006-277860 A | 10/2006 |
| JP | 2007-151092 | 6/2007 |
| JP | 2007-207413 | 8/2007 |
| JP | 2008-134311 A | 6/2008 |
| JP | 2008-276188 A | 11/2008 |
| JP | 2009-075542 A | 4/2009 |
| JP | 2010-130576 | 6/2010 |

* cited by examiner

T1

T2

T3

T4

T5-1

T5-2

T1

T2

T3

T4

T5-1

T5-2

PULSE OUTPUT CIRCUIT, DISPLAY DEVICE, AND ELECTRONIC DEVICE

BACKGROUND OF THE INVENTION

1. Field of the Invention

This invention relates to a driver circuit, a display device including a driver circuit formed over a common substrate with a pixel portion, or an electronic device including the display device.

2. Description of the Related Art

With the widespread use of large display devices such as liquid crystal televisions, display devices are required to be higher-value-added and thus under development. Particularly, a technique to configure a driver circuit such as a gate driver over a common substrate with a pixel portion using thin film transistors (TFTs) whose channel region is made from an amorphous semiconductor is actively developed because the technique helps a reduction in cost and an improvement in reliability a lot.

A thin film transistor whose channel region is formed from an amorphous semiconductor causes deterioration such as an increase in threshold voltage or a decrease in field-effect mobility. If deterioration in the thin film transistor proceeds, there arises a problem such that a driver circuit may have difficulty in operation and may fail to display an image. Therefore, a shift register capable of suppressing deterioration in a transistor is disclosed in Patent Document 1. In the Patent Document 1, in order to suppress degradation of transistor characteristics, two transistors are provided and the transistors are connected between an output terminal of a flip-flop and a wiring to which a low-voltage power supply potential VSS is supplied. Thus, the transistors become conducting in turn. In such a manner, a period during which each of the transistors is conducting can be shortened by approximately half in a frame period; therefore, degradation of transistor characteristics of the transistors can be suppressed to some extent.

REFERENCE

[Patent Document 1] Japanese Published Patent Application No. 2005-050502

SUMMARY OF THE INVENTION

An object of an embodiment of the invention is to provide a deriver circuit and a display device which can suppress degradation of characteristics of a thin film transistor.

One embodiment of the invention is a driver circuit including a plurality of pulse output circuits. Each of the plurality of pulse output circuits includes a first thin film transistor to an eleventh thin film transistor. Each of the plurality of pulse output circuits is electrically connected to a first signal line to a seventh signal line, a first power supply line to a second power supply line. As for the first thin film transistor, a first terminal is electrically connected to the first power supply line, a second terminal is electrically connected to a gate of the third thin film transistor, a gate of the fourth thin film transistor, a gate of the fifth thin film transistor, a second terminal of the ninth thin film transistor, and a first terminal of the tenth thin film transistor, and a gate is electrically connected to the second signal line. As for the second thin film transistor, a first terminal is electrically connected to a first terminal of the third thin film transistor and a second terminal of the eighth thin film transistor, a second terminal is electrically connected to a gate of the sixth thin film transistor and a gate of the seventh thin film transistor, and a gate is electrically connected to the first power supply line. As for the third thin film transistor, the first terminal is electrically connected to a first terminal of the second thin film transistor and the second terminal of the eighth thin film transistor, a second terminal is electrically connected to the second power supply line, and the gate is electrically connected to the second terminal of the first thin film transistor, the gate of the fourth thin film transistor, the gate of the fifth thin film transistor, the second terminal of the ninth thin film transistor and the first terminal of the tenth thin film transistor. As for the fourth thin film transistor, a first terminal is electrically connected to the seventh signal line and a second terminal of the sixth thin film transistor, a second terminal is electrically connected to the second power supply line, and the gate is electrically connected to the second terminal of the first thin film transistor, the gate of the third thin film transistor, the gate of the fifth thin film transistor, the second terminal of the ninth thin film transistor and the first terminal of the tenth thin film transistor. As for the fifth thin film transistor, a first terminal is electrically connected to the sixth signal line, a second terminal of the seventh thin film transistor and a first terminal of the eleventh thin film transistor, a second terminal is electrically connected to the second power supply line, and the gate is electrically connected to the second terminal of the first thin film transistor, the gate of the third thin film transistor, the gate of the fourth thin film transistor, the second terminal of the ninth thin film transistor and the first terminal of the tenth thin film transistor. As for the sixth thin film transistor, a first terminal is electrically connected to the first signal line, the second terminal is electrically connected to the seventh signal line and the first terminal of the fourth thin film transistor, and the gate is electrically connected to the second terminal of the second thin film transistor and the gate of the seventh thin film transistor. As for the seventh thin film transistor, a first terminal is electrically connected to the first signal line, the second terminal is electrically connected to the sixth signal line, the first terminal of the fifth thin film transistor, and the first terminal of the eleventh thin film transistor, and the gate is electrically connected to the second terminal of the second thin film transistor and the gate of the sixth thin film transistor. As for the eighth thin film transistor, a first terminal is electrically connected to the first power supply line, the second terminal is electrically connected to the first terminal of the second thin film transistor and the first terminal of the third thin film transistor, and a gate is electrically connected to the fourth signal line. As for the ninth thin film transistor, a first terminal is electrically connected to the first power supply line, the second terminal is electrically connected to a second terminal of the first thin film transistor, the gate of the third thin film transistor, the gate of the fourth thin film transistor, the gate of the fifth thin film transistor, and the first terminal of the tenth thin film transistor, and a gate is electrically connected to the fifth signal line. As for the tenth thin film transistor, the first terminal is electrically connected to the second terminal of the first thin film transistor, the gate of the third thin film transistor, the gate of the fourth thin film transistor, the gate of the fifth thin film transistor, and the second terminal of the ninth thin film transistor, a second terminal is electrically connected to the second power supply line, and a gate is electrically connected to the fourth signal line. As for the eleventh thin film transistor, a first terminal is electrically connected to the sixth signal line, the first terminal of the fifth thin film transistor, and the second terminal of the seventh thin film transistor, a second terminal is electrically connected to the second power supply line, and a gate is electrically connected to the third signal line.

One embodiment of the invention is a driver circuit including a plurality of pulse output circuits. Each of the plurality of pulse output circuits includes a first thin film transistor to an eleventh thin film transistor. Each of the plurality of pulse output circuits is electrically connected to a first signal line to a seventh signal line, a first power supply line, a second power supply line, and a third power supply line. As for the first thin film transistor, a first terminal is electrically connected to the first power supply line, a second terminal is electrically connected to a gate of the third thin film transistor, a gate of the fourth thin film transistor, a gate of the fifth thin film transistor, a second terminal of the ninth thin film transistor, and a first terminal of the tenth thin film transistor, and a gate is electrically connected to the second signal line. As for the second thin film transistor, a first terminal is electrically connected to a first terminal of the third thin film transistor and a second terminal of the eighth thin film transistor, a second terminal is electrically connected to a gate of the sixth thin film transistor and a gate of the seventh thin film transistor, and a gate is electrically connected to the third power supply line. As for the third thin film transistor, the first terminal is electrically connected to a first terminal of the second thin film transistor and the second terminal of the eighth thin film transistor, a second terminal is electrically connected to the second power supply line, and the gate is electrically connected to the second terminal of the first thin film transistor, the gate of the fourth thin film transistor, the gate of the fifth thin film transistor, the second terminal of the ninth thin film transistor and the first terminal of the tenth thin film transistor. As for the fourth thin film transistor, a first terminal is electrically connected to the seventh signal line and a second terminal of the sixth thin film transistor, a second terminal is electrically connected to the second power supply line, and the gate is electrically connected to the second terminal of the first thin film transistor, the gate of the third thin film transistor, the gate of the fifth thin film transistor, the second terminal of the ninth thin film transistor and the first terminal of the tenth thin film transistor. As for the fifth thin film transistor, a first terminal is electrically connected to the sixth signal line, a second terminal of the seventh thin film transistor and a first terminal of the eleventh thin film transistor, a second terminal is electrically connected to the second power supply line, and the gate is electrically connected to the second terminal of the first thin film transistor, the gate of the third thin film transistor, the gate of the fourth thin film transistor, the second terminal of the ninth thin film transistor and the first terminal of the tenth thin film transistor. As for the sixth thin film transistor, a first terminal is electrically connected to the first signal line, the second terminal is electrically connected to the seventh signal line and the first terminal of the fourth thin film transistor, and the gate is electrically connected to the second terminal of the second thin film transistor and the gate of the seventh thin film transistor. As for the seventh thin film transistor, a first terminal is electrically connected to the first signal line, the second terminal is electrically connected to the sixth signal line, the first terminal of the fifth thin film transistor, and the first terminal of the eleventh thin film transistor, and the gate is electrically connected to the second terminal of the second thin film transistor and the gate of the sixth thin film transistor. As for the eighth thin film transistor, a first terminal is electrically connected to the first power supply line, the second terminal is electrically connected to the first terminal of the second thin film transistor and the first terminal of the third thin film transistor, and a gate is electrically connected to the fourth signal line. As for the ninth thin film transistor, a first terminal is electrically connected to the first power supply line, the second terminal is electrically connected to a second terminal of the first thin film transistor, the gate of the third thin film transistor, the gate of the fourth thin film transistor, the gate of the fifth thin film transistor, and the first terminal of the tenth thin film transistor, and a gate is electrically connected to the fifth signal line. As for the tenth thin film transistor, the first terminal is electrically connected to the second terminal of the first thin film transistor, the gate of the third thin film transistor, the gate of the fourth thin film transistor, the gate of the fifth thin film transistor, and the second terminal of the ninth thin film transistor, a second terminal is electrically connected to the second power supply line, and a gate is electrically connected to the fourth signal line. As for the eleventh thin film transistor, a first terminal is electrically connected to the sixth signal line, the first terminal of the fifth thin film transistor, and the second terminal of the seventh thin film transistor, a second terminal is electrically connected to the second power supply line, and a gate is electrically connected to the third signal line.

In the driver circuit, a reset signal may be supplied to the second signal line, the previous stage signal may be supplied to the fourth signal line, the next stage signal may be supplied to the fifth signal line, and a first output signal and a second output signal may respectively be output from the sixth signal line and the seventh signal line. A clock signal may be supplied to the first signal line of each of the plurality of pulse output circuits in odd-numbered stages and an inverted clock signal may be supplied to the third signal line of each of the plurality of pulse output circuits in odd-numbered stages. The inverted clock signal may be supplied to the first signal line of each of the plurality of pulse output circuits in even-numbered stages and the clock signal may be supplied to the third signal line of each of the plurality of pulse output circuits in even-numbered stages.

In the driver circuit, the inverted clock signal may be delayed from the clock signal by half of a cycle.

In the driver circuit, the reset signal may be supplied to the second signal line, the previous stage signal may be supplied to the fourth signal line, the next stage signal may be supplied to the fifth signal line, and the first output signal and the second output signal may respectively be output from the sixth signal line and the seventh signal line. A first clock signal may be supplied to the first signal line of each of the plurality of pulse output circuits in (J−3)th stage (J is preferably a multiple of 4 which is 4 or more) and a second clock signal may be supplied to the third signal line of each of the plurality of pulse output circuits in (J−3)th stage. The second clock signal may be supplied to the first signal line of each of the plurality of pulse output circuits in (J−2)th stage and the third clock signal may be supplied to the third signal line of each of the plurality of pulse output circuits in (J−2)th stage. The third clock signal may be supplied to the first signal line of each of the plurality of pulse output circuits in (J−1)th stage and the fourth clock signal may be supplied to the third signal line of each of the plurality of pulse output circuits in (J−1)th stage. The fourth clock signal may be supplied to the first signal line of each of the plurality of pulse output circuits in J-th stage and the first clock signal may be supplied to the third signal line of each of the plurality of pulse output circuits in J-th stage.

In the driver circuit, the fourth clock signal may be delayed from the third clock signal by a fourth of a cycle, the third clock signal may be delayed from the second clock signal by a fourth of a cycle, the second clock signal may be delayed from the first clock signal by a fourth of a cycle, the first clock signal may be delayed from the fourth clock signal by a fourth of a cycle.

The driver circuit may include a capacitor. One electrode is electrically connected to a second terminal of the first thin film transistor, the gate of the third thin film transistor, the gate of the fourth thin film transistor, the gate of the fifth thin film transistor, a second terminal of the thin film transistor, and the first terminal of the tenth thin film transistor. The other electrode is electrically connected to the second power supply line.

The driver circuit may include a twelfth thin film transistor. A first terminal is electrically connected to the second terminal of the first thin film transistor, the gate of the third thin film transistor, the gate of the fourth thin film transistor, the gate of the fifth thin film transistor, the second terminal of the ninth thin film transistor, and the first terminal of the tenth thin film transistor. A second terminal is electrically connected to the second power supply line. A gate is electrically connected to the seventh signal line.

In the driver circuit, the first thin film transistor to the eleventh thin film transistor may each include a microcrystalline silicon in a channel region.

According to one embodiment of the present invention, it is possible to provide a driver circuit in which degradation of characteristics of the thin film transistor can be suppressed.

BRIEF DESCRIPTION OF THE DRAWINGS

FIGS. 22A-1, 22A-2, 22B-1, and 22B-2 are diagrams showing multi-tone masks applicable to a method for manufacturing a driver circuit.

DETAILED DESCRIPTION OF THE INVENTION

Figure 1A:
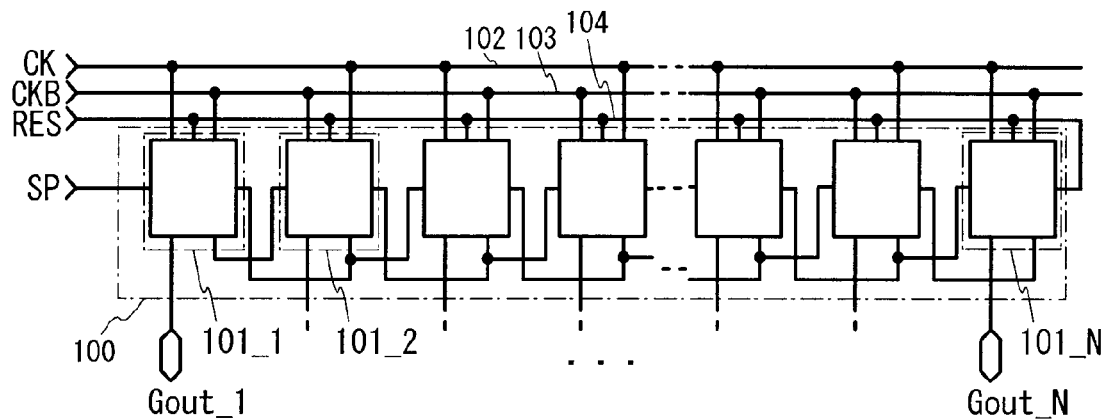
FIGS. 1A to 1D are circuit diagrams of a driver circuit.

Hereinafter, embodiments of the present invention will be described with reference to the accompanying drawings. Note that the embodiments can be implemented in many different modes, and it is to be easily understood by those skilled in the art that modes and details of the present invention can be variously changed without departing from the spirit and the scope of the present invention. Therefore, the present invention should not be construed as being limited to the description of the following embodiments. Note that in structures described below, reference numerals denoting the same portions or portions having similar functions are used in common in different drawings, and detailed description thereof is not repeated.

Note that as for some components shown in some of the drawings, etc. for the embodiments, the size, the layer thickness, and distortion in signal waveforms are exaggerated for purposes of clarity and are thus not necessarily limit the actual sizes of those components.

Note that the terms such as "first", "second", and "third" in this specification are used in order to avoid confusion between components and do not set a limitation on number.

Embodiment 1

In this embodiment, an embodiment of a driver circuit and a structure of a thin film transistor are described.

First, a structure of the driver circuit is described. The driver circuit in this embodiment can function as a shift register used for a gate driver, a source driver, or a display device, for example.

A driver circuit which functions as a shift register is described with reference to FIGS. 1A to 1D, FIGS. 2A and 2B, FIGS. 3A and 3B, FIGS. 4A and 4B, FIGS. 5A and 5B, FIGS. 6A and 6B, FIGS. 28A and 28B, and FIG. 29. A shift register 100 includes first to N-th pulse output circuits 101_1 to 101_N (N≥3) (see FIG. 1A). A clock signal CK, an inverted clock signal CKB, and a reset signal RES are input respectively from a first wiring 102, a second wiring 103, and a third wiring 104 to each of the first to N-th pulse output circuits 101_1 to 101_N in the shift register 100 shown in FIG. 1A. A start pulse SP or a signal, referred to as the previous stage signal Lin, which is from the pulse output circuit in the previous stage, is input to the pulse output circuit in each stage. In addition, a signal, referred to as the next stage signal Rin, which is from the pulse output circuit in the next stage, is input to the pulse output circuit in each stage. The pulse output circuit in each stage outputs a first output signal Gout to a gate line, a data line, etc. and outputs a second output signal SRout to the pulse output circuit in the previous and/or next stage. Note that the pulse output circuit in a dummy stage for outputting a signal which does not affect display in a display portion may be provided. For example, in the structure where the plurality of pulse output circuits are used as a shift register in a gate driver and output pulses sequentially to n gate lines, N stages (n≤N) may be provided.

Figure 1B:
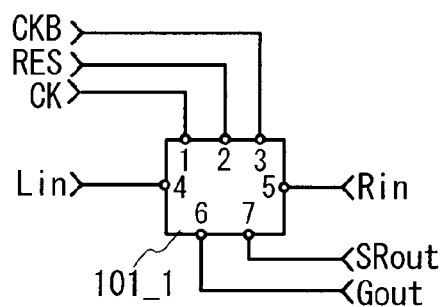
Figure 1C:
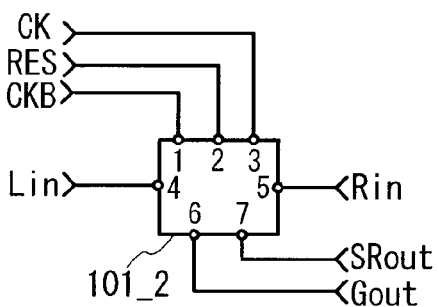

Note that terminals to which the clock signal CK and the inverted clock signal CKB are input are different between the odd-numbered stages and the even-numbered stages of the plurality of pulse output circuits. Specifically, if the odd-numbered stages of the pulse output circuit 101_1 has a structure as shown in FIG. 1B in which the clock signal CK is input to a first terminal, the reset signal RES is input to a second terminal, the inverted clock signal CKB is input to a third terminal, the previous stage signal Lin is input to a fourth terminal, the next stage signal Rin is input to a fifth terminal, a first output signal Gout is output from a sixth terminal, and a second output signal SRout is output from a seventh terminal, the even-numbered stages of the pulse output circuit 101_2 has a structure as shown in FIG. 1C in which the inverted clock signal CKB is input to a first terminal, the reset signal RES is input to a second terminal, the clock signal CK is input to a third terminal, the previous stage signal Lin is input to a fourth terminal, the next stage signal Rin is input to a fifth terminal, an output signal Gout is output from a sixth terminal, and a second output signal SRout is output from a seventh terminal. Note that the clock signal CK and the inverted clock signal CKB become an H-level signal (high power supply potential level) and an L-level signal (low power supply potential level) repeatedly at a regular interval. Here, the inverted clock signal is delayed from the clock signal CK by half of a cycle.

Note that a voltage indicates a potential difference between a potential and a reference potential (e.g., a ground potential) in many cases. Therefore, in this specification, a voltage and a potential can be interchanged with each other for explanation.

Next, a specific example of the circuit structure of the pulse output circuit is described with reference to FIG. 1D. Note that in FIG. 1D, a structure of the pulse output circuit in the odd-numbered stage is described as an example. Note that a difference between the plurality of pulse output circuits in the odd-numbered stages and that in the even-numbered stages is, as described above, in the terminals to which the clock signal CK and the inverted clock signal CKB are input.

The pulse output circuit includes a first thin film transistor 111 to an eleventh thin film transistor 121. In addition, FIG. 1D shows the case where a high-voltage power supply potential VDD is supplied through a first power supply line 131 and a low-voltage power supply potential VSS is supplied through a second power supply line 132 besides the signals which are input to a first terminal to a seventh terminal. Note that in FIG. 1D, a wiring for inputting the clock signal CK to a first terminal is a first signal line 151, a wiring for inputting the reset signal RES to a second terminal is a second signal line 152, a wiring for inputting the inverted clock signal to a third terminal is a third signal line 153, a wiring for inputting the previous stage signal Lin to a fourth terminal is a fourth signal line 154, a wiring for inputting the next stage signal Rin to a fifth terminal is a fifth signal line 155, and a wiring through which a sixth terminal outputs a first output signal Gout is a sixth signal line 156, a wiring through which a seventh terminal outputs a second output signal SRout is a seventh signal line 157.

As for the first thin film transistor 111, a first terminal is connected to the first power supply line 131, a second terminal is connected to a gate of the third thin film transistor 113, a gate of the fourth thin film transistor 114, a gate of the fifth thin film transistor 115, a second terminal of the ninth thin film transistor 119, and a first terminal of the tenth thin film transistor 120, and a gate is connected to the second signal line 152. As for the second thin film transistor 112, a first terminal is connected to a first terminal of the third thin film transistor 113 and a second terminal of the eighth thin film transistor 118, a second terminal is connected to a gate of the sixth thin film transistor 116 and a gate of the seventh thin film transistor 117, and a gate is connected to the first power supply line 131. As for the third thin film transistor 113, the first terminal is connected to the first terminal of the second thin film transistor 112 and the second terminal of the eighth thin film transistor 118, a second terminal is connected to the second power supply line 132, and the gate is connected to the second terminal of the first thin film transistor 111, the gate of the fourth thin film transistor 114, the gate of the fifth thin film transistor 115, the second terminal of the ninth thin film transistor 119, and the first terminal of the tenth thin film transistor 120. As for the fourth thin film transistor 114, a first terminal is connected to the seventh signal line 157 and a second terminal of the sixth thin film transistor 116, a second terminal is connected to the second power supply line 132, and the gate is connected to the second terminal of the first thin film transistor 111, the gate of the third thin film transistor 113, the gate of the fifth thin film transistor 115, the second terminal of the ninth thin film transistor 119, and the first terminal of the tenth thin film transistor 120. As for the fifth thin film transistor 115, a first terminal is connected to the sixth signal line 156, a second terminal of the seventh thin film transistor 117, and a first terminal of the eleventh thin film transistor 121, a second terminal is connected to the second power supply line 132, and the gate is connected to the second terminal of the first thin film transistor 111, the gate of the third thin film transistor 113, the gate of the fourth thin film transistor 114, the second terminal of the ninth thin film transistor 119, and the first terminal of the tenth thin film transistor 120. As for the sixth thin film transistor 116, a first terminal is connected to the first signal line 151, the second terminal is connected to the seventh signal line 157 and the first terminal of the fourth thin film transistor 114, and the gate is connected to the second terminal of the second thin film transistor 112 and the gate of the seventh thin film transistor 117. As for the seventh thin film transistor 117, a first terminal is connected to the first signal line 151, the second terminal is connected to the sixth signal line 156, the first terminal of the fifth thin film transistor 115, and the first terminal of the eleventh thin film transistor 121, and the gate is connected to the second terminal of the second thin film transistor 112 and the gate of the sixth thin film transistor 116. As for the eighth thin film transistor 118, a first terminal is connected to the first power supply line 131, the second terminal is connected to the first terminal of the second thin film transistor 112 and the first terminal of the third thin film transistor 113, and a gate is connected to the fourth signal line 154. As for the ninth thin film transistor 119, a first terminal is connected to the first power supply line 131, the second terminal is connected to a second terminal of the first thin film transistor 111, the gate of the third thin film transistor 113, the gate of the fourth thin film transistor 114, the gate of the fifth thin film transistor 115, and the first terminal of the tenth thin film transistor 120, and a gate is connected to the fifth signal line 155. As for the tenth thin film transistor 120, the first terminal is connected to the second terminal of the first thin film transistor 111, the gate of the third thin film transistor 113, the gate of the fourth thin film transistor 114, the gate of the fifth thin film transistor 115, and the second terminal of the ninth thin film transistor 119, a second terminal is connected to the second power supply line 132, and a gate is connected to the fourth signal line 154.

As for the eleventh thin film transistor 121, a first terminal is connected to the sixth signal line 156, the first terminal of the fifth thin film transistor 115, and the second terminal of the seventh thin film transistor 117, a second terminal is connected to the second power supply line 132, and a gate is connected to the third signal line 153.

Note that between the gate and the second terminal of the sixth thin film transistor 116 and between the gate and the second terminal of the seventh thin film transistor 117, capacitors may additionally be provided which perform a bootstrap operation by making each of the gates of the sixth thin film transistor 116 and the seventh thin film transistor 117 in a floating state. Alternatively, if the bootstrap operation can be realized by a gate capacity of the sixth thin film transistor 116 and a gate capacity of the seventh thin film transistor 117, the capacitor can be removed.

Note that a thin film transistor is an element having at least three terminals of a gate, a drain, and a source. The thin film transistor has a channel region between a drain region and a source region, and current can flow through the drain region, the channel region, and the source region. Here, since the source and the drain of the thin film transistor may interchange depending on the structure, the operating condition, and the like of the thin film transistor, it is difficult to define which is a source or a drain. Thus, a region which serves as a source or a drain is not referred to as a source or a drain in some cases. In such a case, one of the source and the drain may be referred to as a first terminal and the other may be referred to as a second terminal, for example. Alternatively, one of the source and the drain may be referred to as a first electrode and the other may be referred to as a second electrode, for example. Further alternatively, one of the source and the drain may be referred to as a first region and the other may be referred to as a second region, for example.

Note that a structure of a thin film transistor can employ various modes without being limited to a specific stricture. For example, a multi-gate structure having two or more gate electrodes can be used.

As another example, a structure where gate electrodes are formed above and below a channel region can be used. Note that the structure where gate electrodes are formed above and below a channel region is substantially equivalent to a structure where a plurality of thin film transistors is connected in parallel.

A structure where a gate electrode is formed above a channel region, a structure where a gate electrode is formed below a channel region, a staggered structure, an inverted staggered structure, a structure where a channel region is divided into a plurality of regions, or a structure where channel regions are connected in parallel or in series can be used. In addition, a structure where a source electrode or a drain electrode overlaps with a channel region (or part thereof) can be used.

Note that when it is explicitly described that "A and B are connected", the case where A and B are electrically connected, the case where A and B are functionally connected, and the case where A and B are directly connected are included therein. Here, each of A and B is an object (e.g., a device, an element, a circuit, a wiring, an electrode, a terminal, a conductive film, or a layer). Accordingly, another element may be interposed between elements having a connection relation illustrated in drawings and texts, without limitation to a predetermined connection relation, for example, the connection relation illustrated in the drawings and the texts.

For example, in the case where A and B are electrically connected, one or more elements which enable electrical connection between A and B (e.g., a switch, a thin film transistor, a capacitor, an inductor, a resistor, and/or a diode) may be connected between A and B. Alternatively, in the case where A and B are functionally connected, one or more circuits which enable functional connection between A and B (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing a potential level of a signal; a voltage source; a current source; a switching circuit; an amplifier circuit such as a circuit which can increase signal amplitude, the amount of current, or the like, an operational amplifier, a differential amplifier circuit, a source follower circuit, or a buffer circuit; a signal generation circuit; a memory circuit; and/or a control circuit) may be connected between A and B. For example, in the case where a signal output from A is transmitted to B even when another circuit is interposed between A and B, A and B are functionally connected.

Note that when it is explicitly described that "A and B are electrically connected", the case where A and B are electrically connected (i.e., the case where A and B are connected with another element or another circuit interposed therebetween), the case where A and B are functionally connected (i.e., the case where A and B are functionally connected with another circuit interposed therebetween), and the case where A and B are directly connected (i.e., the case where A and B are connected without another element or another circuit interposed therebetween) are included therein. That is, when it is explicitly described that "A and B are electrically connected", the description is the same as the case where it is explicitly only described that "A and B are connected".

Note that a thin film transistor in this embodiment is a thin film transistor (TFT) formed using microcrystalline (also referred to as microcrystal, nanocrystal, or semi-amorphous) silicon for a channel layer. Therefore, a driver circuit can be made in which degradation of characteristics of the thin film transistor can be suppressed.

Note that instead of being thin film transistors, the first to third thin film transistors and the eighth to eleventh thin film transistors may be switches turned into a conduction state (an on state) or a non-conduction state (an off state) depending on an input signal.

Note that a variety of switches can be used as a switch. For example, an electrical switch, a mechanical switch, or the like can be used. That is, any element can be used as long as it can control a current flow, without limitation to a certain element. For example, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), or the like can be used as a switch. Alternatively, a logic circuit in which such elements are combined can be used as a switch.

Next, operation of a shift register shown in FIGS. 1A to 1D is described with reference to FIGS. 2A and 2B, FIGS. 3A and 3B, FIGS. 4A and 4B, FIGS. 5A and 5B, and FIGS. 6A and 6B. For explanation, note that a connection node of the second terminal of the second thin film transistor 112, the gate of the sixth thin film transistor 116, and the gate of the seventh thin film transistor 117 is a node A. Further, in order to specifically describe the operation of the shift register, a first period T1, a second period T2, a third period T3, a fourth period T4, and a fifth period T5, which are shown in a timing chart in FIG. 2B, are separately explained. Note that in the following description, the first to eleventh thin film transistors 111 to 121 are N-channel thin film transistors and are in a conduction state when a gate-source voltage Vgs exceeds a threshold voltage (Vth). Also note that in FIG. 2B, the first to eleventh thin film transistors 111 to 121 serve as a shift register included in a gate driver, and a period 201 is a vertical retrace period and a period 202 is a gate selection period. Further, the timing chart in FIG. 2B shows a specific example of the waveforms of the clock signal CK, the inverted clock signal CKB, the reset signal RES, the previous stage signal Lin, the next stage signal Rin, and second output signal SRout of each of the stages (e.g., SRout1 of the first stage). Furthermore, a high power supply potential level and a low power supply potential level of each of the signals are respectively VDD and VSS, except the node A. In addition, a first output signal Gout1 is omitted because it has a wave form same as the second output signal SRout1.

Figure 2A:
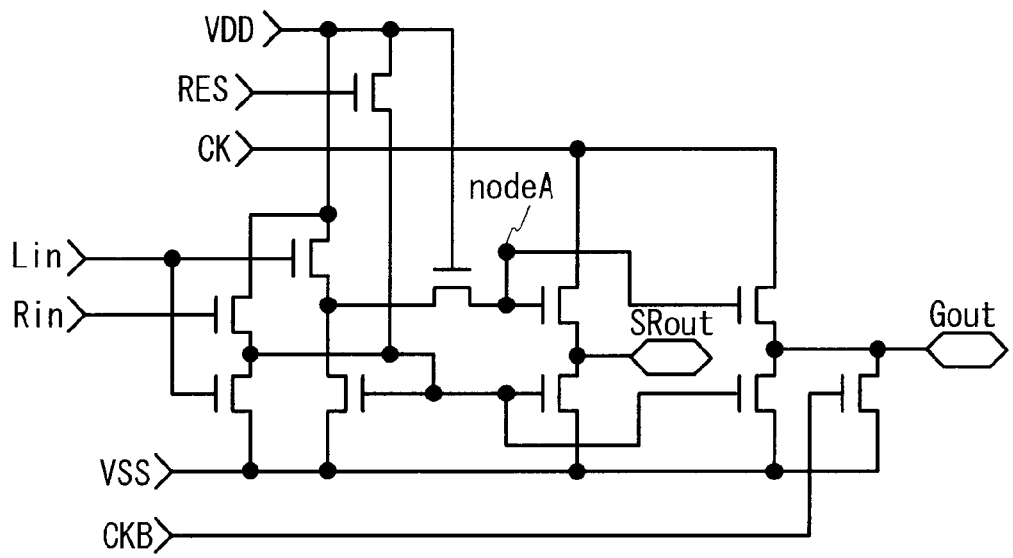
FIGS. 2A and 2B are a circuit diagram of a driver circuit and a timing chart for an explanation of operation of the driver circuit.
Figure 2B:
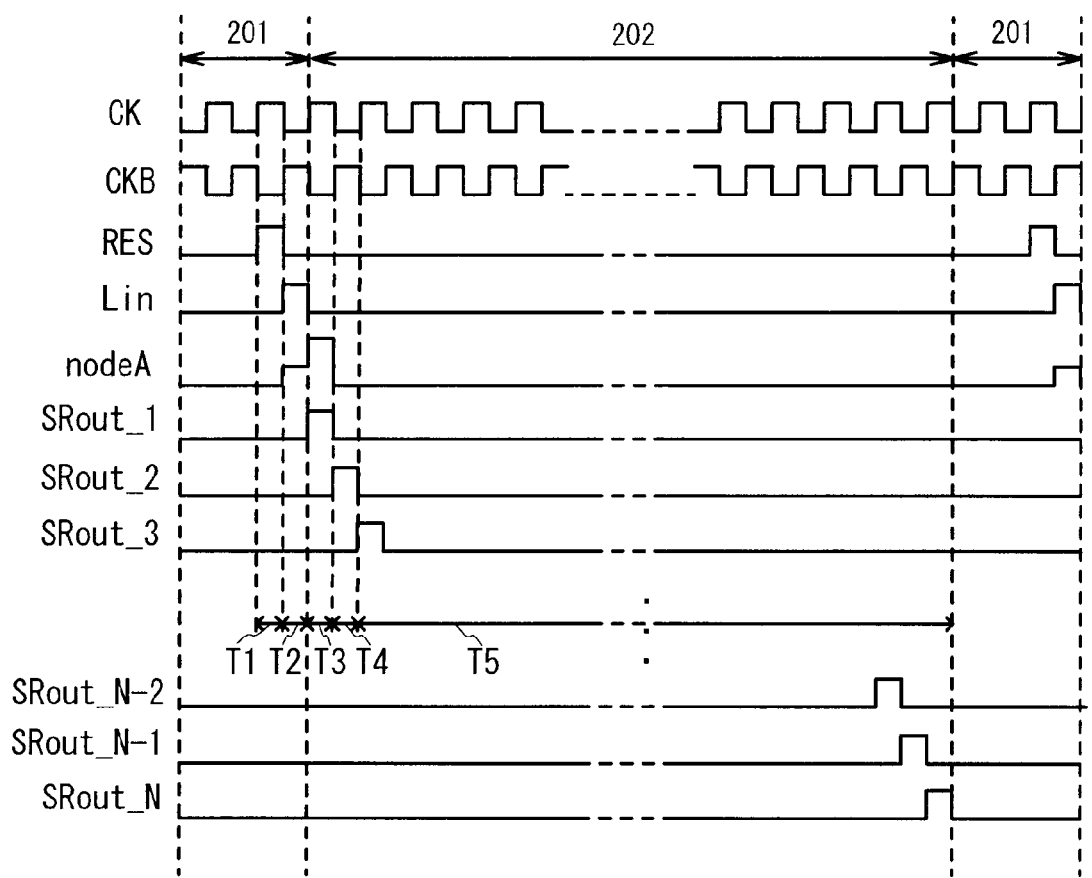
Figure 3A:
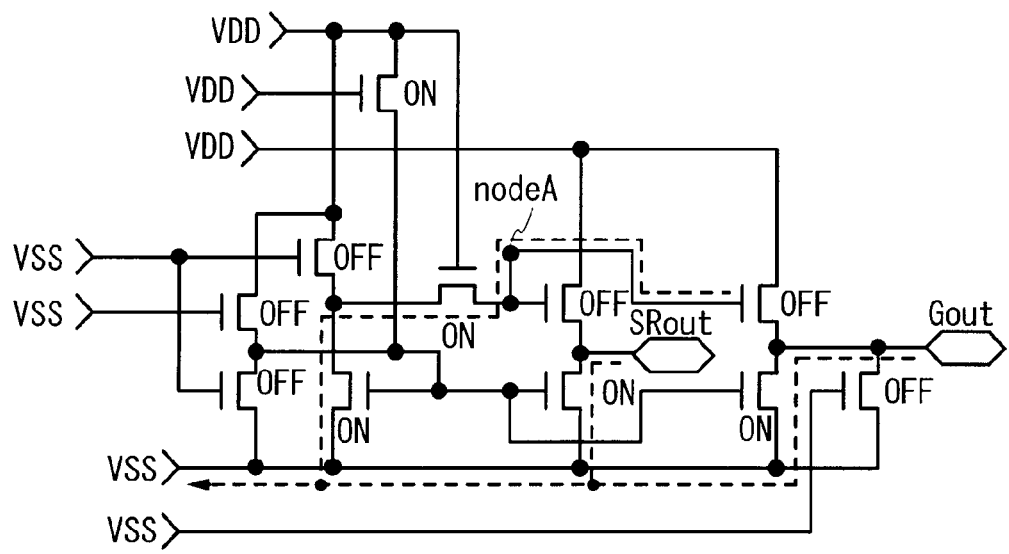
FIGS. 3A and 3B are schematic diagrams showing operation of a driver circuit.

In the first period T1, the reset signal RES becomes an H-level signal and the first thin film transistor 111 whose gate is connected to the second signal line 152 are conducting. At the time, the clock signal CK is an H-level signal, and the inverted clock signal CKB, the previous stage signal Lin, and the next stage signal Rin are L-level signals. As shown in FIG. 3A, the first thin film transistor 111 becomes conducting, and the second thin film transistor 112, the third thin film transistor 113, the fourth thin film transistor 114, and the fifth thin film transistor 115 become conducting. Therefore, a current flows as shown by a dotted arrow in FIG. 3A, and a potential of each of the wirings in the first period T1 is determined as shown in FIG. 2B. That is, the first period T1 is a period for reset of a potential of each of the wirings (i.e., for setting a potential at VSS) in the pulse output circuit. In addition, in the first period T1, the second output signal SRout1 is an L-level signal.

When the reset signal RES is input to the gate of the first thin film transistor 111 every vertical retrace period which is the period 201, a node of each of the thin film transistors can be set at a potential of VDD or VSS. Therefore, a so-called dynamic circuit in this embodiment, which is driven with the use of a node in a floating state, each node can be reset, whereby the level of noise immunity and operation reliability can be improved to be equal to that of a static circuit.

Figure 3B:
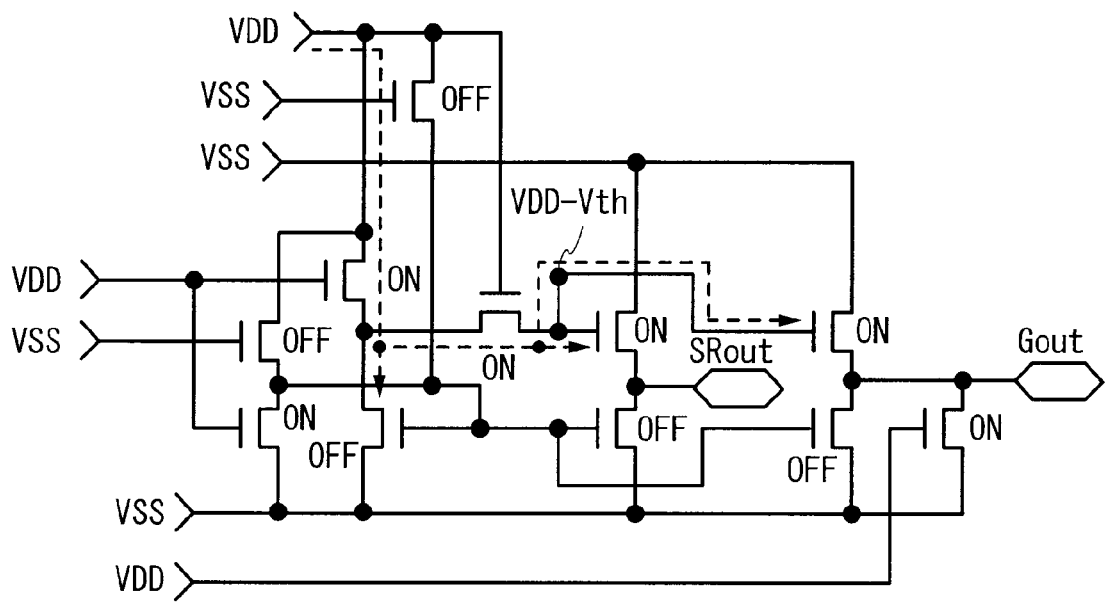

Next, in the second period T2, the previous stage signal Lin is an H-level signal, and the eighth thin film transistor 118 and the tenth thin film transistor 120 whose gates are each connected to the fourth signal line 154 are thus conducting. At the time, the inverted clock signal CKB is an H-level signal, and the clock signal CK, the reset signal RES, and the next stage signal Rin are L-level signals. Further, at the time, the eighth thin film transistor 118 is conducting as illustrated in FIG. 3B. The second thin film transistor 112 are conducting as in the first period T1, and a current flows as shown by a dotted arrow in FIG. 3B. At the time, the node A uses the second terminal of the eighth thin film transistor 118 as the source; therefore, a potential of the node A becomes a value VDD-Vth where a value of a threshold voltage Vth of the eighth thin film transistor 118 is subtracted from a value of a potential of the first power supply line 131. When the second terminal of the eighth thin film transistor 118 has the value VDD-Vth, the thin film transistor 118 is non-conducting and the node A is in a floating state while maintaining the value VDD-Vth. Note that as shown in FIG. 3B, the sixth thin film transistor 116 and the seventh thin film transistor 117 are conducting, but at the same time, since the potential of the first signal line 151 is VSS, a potential of each of the wirings in the second period T2 is determined as in FIG. 2B. That is, the second period T2 is a period where the node A in the pulse output circuit is in a floating state. In addition, in the second period T2, the second output signal SRout1 is an L-level signal.

Figure 4A:
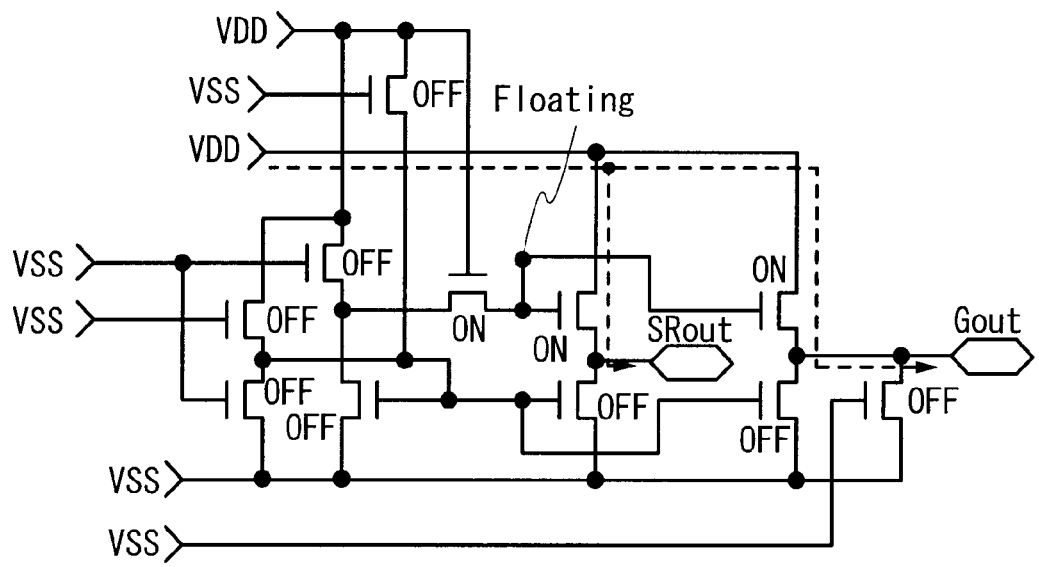
FIGS. 4A and 4B are schematic diagrams showing operation of a driver circuit.
Figure 4B:
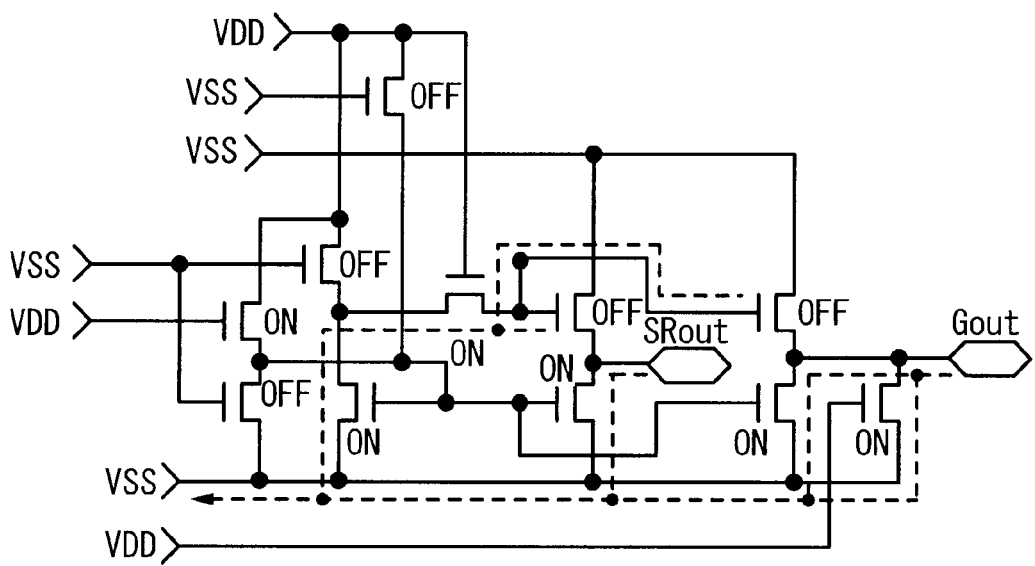

Next, in the third period T3, the clock signal CK becomes an H-level signal. At the time, the inverted clock signal CKB, the reset signal RES, the previous stage signal Lin, and the next stage signal Rin are L-level signals. Further, at the time, as shown in FIG. 4A, the sixth thin film transistor 116 and the seventh thin film transistor 117 are conducting, that is, the sixth thin film transistor 116 and the seventh thin film transistor 117 are in a state where current flows between a source and a drain (as shown by a dotted arrow in FIG. 4A), and a potential of each second terminal (the source side) of the sixth thin film transistor 116 and the seventh thin film transistor 117 starts to increase. There is a capacitive coupling due to parasitic capacitance between a gate and a source of each of the sixth thin film transistor 116 and the seventh thin film transistor 117, so that a potential of the node A in a floating state increases as a potential of the second terminal serving as the source increases (bootstrap operation). The potential of the node A eventually becomes higher than VDD+Vth, and each second terminal of the sixth thin film transistor 116 and the seventh thin film transistor 117 thus has a potential of VDD. Therefore, the second output signal SRout1 becomes an H-level signal in the third period T3, that is, a potential of the node A in a floating state is increased by the bootstrap operation and the first output signal Gout1 and the second output signal SRout1 are output as H-level signals. Then, the second output signal SRout1 is input as the previous stage signal Lin to the pulse output circuit in a second stage.

Figure 1D:
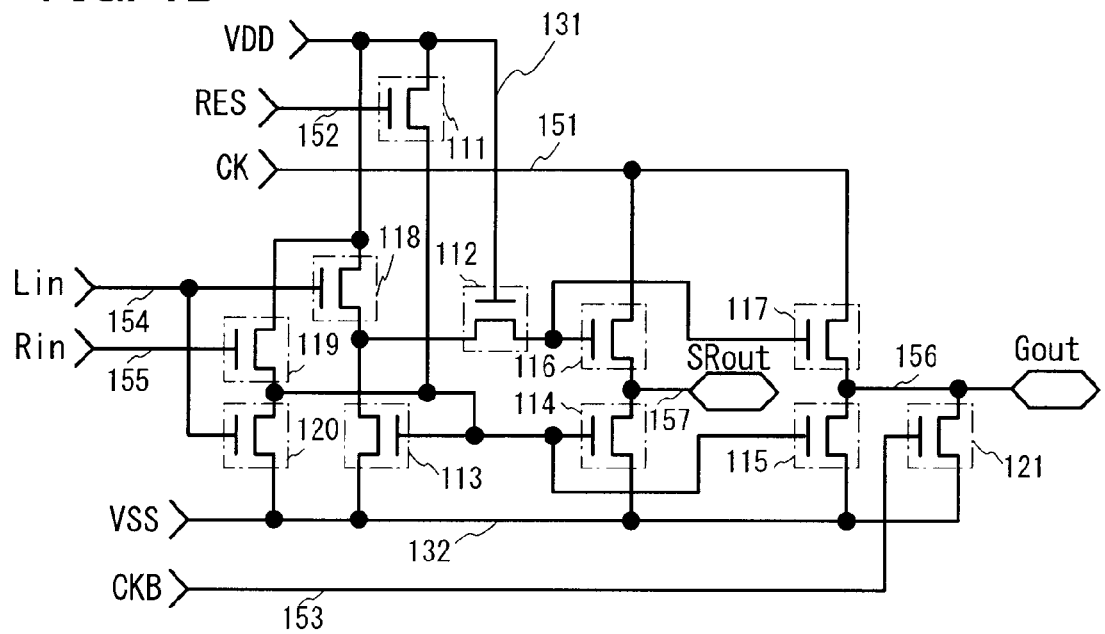

Note that as shown in FIG. 1D, by providing the second thin film transistor 112 whose gate is supplied with the high-voltage power supply potential VDD, advantages described below are obtained.

Without the second thin film transistor 112 whose gate is supplied with the high-voltage power supply potential VDD, if a potential of the node A is raised by bootstrap operation, a potential of a source which is the second terminal of the eighth thin film transistor 118 increases to a value higher than the high-voltage power supply potential VDD. Then, the first terminal of the eighth thin film transistor 118 comes to serve as a source thereof. Therefore, in the eighth thin film transistor 118, a large bias voltage is applied and thus significant stress is applied between a gate and a source and between a gate and a drain in the third period T3, which can cause deterioration in the thin film transistor.

If the second thin film transistor 112 is provided whose gate is supplied with high-voltage power supply potential VDD, a potential of the node A is raised by bootstrap operation, but at the same time, an increase in a potential of the second terminal of the eighth thin film transistor 118 can be prevented. In other words, with the second thin film transistor 112, a negative bias voltage applied between a gate and a source of the eighth thin film transistor 118 can be reduced. Accordingly, with a circuit structure in this embodiment, a negative bias voltage applied between a gate and a source of the eighth thin film transistor 118 can be reduced, so that deterioration in the eighth thin film transistor 118, which is due to stress, can further be restrained.

Note that the second thin film transistor 112 is provided so as to be connected, through the first terminal and the second terminal thereof, between the second terminal of the eighth thin film transistor 118 and the gate of the sixth thin film transistor 116, or between the second terminal of the eighth thin film transistor 118 and the gate of the seventh thin film transistor 117.

Note that since the high-voltage power supply potential VDD is applied to the gate of the second thin film transistor 112, the second thin film transistor 112 is conducting in almost all the periods without application of a large amount of voltage between the gate and a source thereof. Therefore, when channel region of the thin film transistor is formed using an amorphous semiconductor, deterioration in the thin film transistor becomes pronounced, on the other hand, progress in deterioration can further be restrained with the use of microcrystalline silicon, which is a typical example of a microcrystalline semiconductor described in this embodiment, for channel regions of each transistor. Note that with a multi-gate structure where two or more gate electrodes are provided, the second thin film transistor 112 can be redundant; thus, progress in the deterioration can further be restrained.

Figures 28A, 28B:
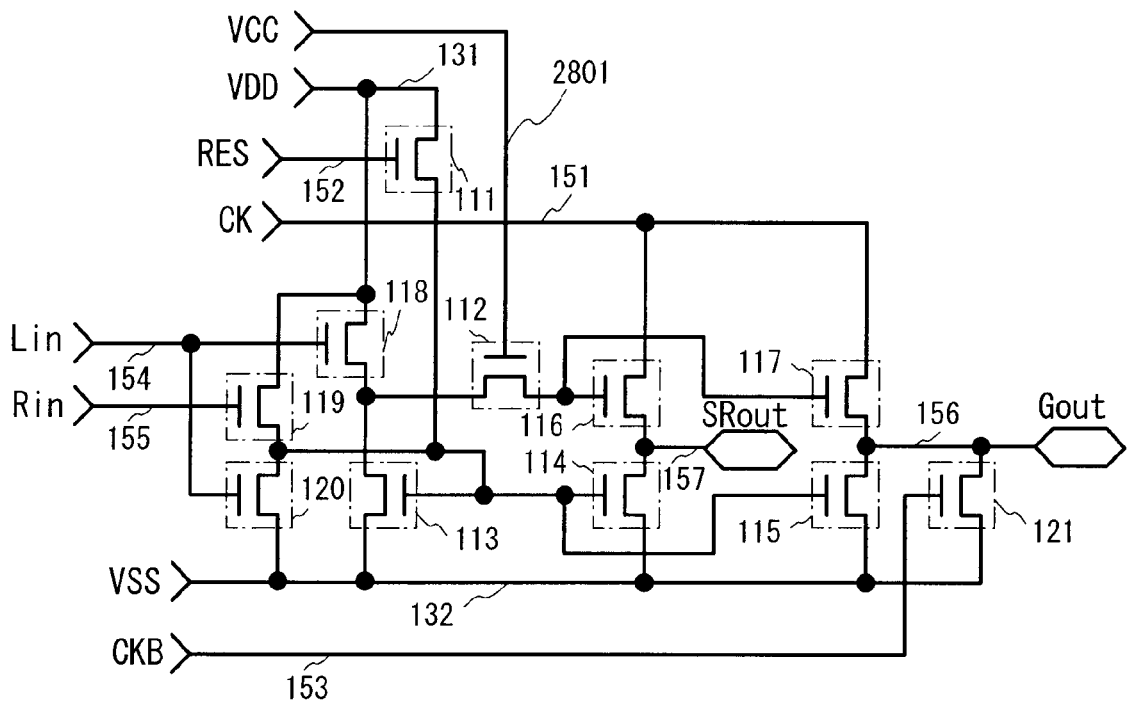
FIGS. 28A and 28B are circuit diagrams of a driver circuit.

Note that although the gate of the second thin film transistor 112 is supplied with high-voltage power supply potential VDD in FIG. 1D, it is acceptable as long as the gate of the second thin film transistor 112 is supplied with a potential which brings the second thin film transistor 112 into conduction. FIG. 28A shows an example of the structure where the gate of the second thin film transistor 112 is connected to a third power supply line 2801 to which a conduction holding potential VCC which brings the second thin film transistor 112 into conduction is applied and which is provided aside from the first power supply line 131 to which the high-voltage power supply potential VDD is applied. Note that it is acceptable as long as the conduction holding potential VCC is in a magnitude relation as follows: VSS<VCC≤VDD, and progress in deterioration in the second thin film transistor 112 can further be restrained in a manner that the conduction holding potential VCC is made smaller in value than the high-voltage power supply potential VDD.

Alternatively, a structure may be used where a twelfth thin film transistor 2802 is added to the structure shown in FIG. 1D (see FIG. 28B). As for the twelfth thin film transistor 2082, a first terminal is connected to the second terminal of the first thin film transistor 111, the gate of the third thin film transistor 113, the gate of the fourth thin film transistor 114, the gate of the fifth thin film transistor 115, the second terminal of the ninth thin film transistor 119, and the first terminal of the tenth thin film transistor 120; a second terminal is connected to the second power supply line 132; and a gate is connected to the seventh signal line 157. Note that the gate of the twelfth thin film transistor 2802 may be connected to the sixth signal line 156. The twelfth thin film transistor 2802 is conducting when the seventh signal line 157 (or the sixth signal line 156) supplies an H-level signal. In other words, in the third period T3 where the seventh signal line 157 (or the sixth signal line 156) supplies an H-level signal, a node to which the second terminal of the first thin film transistor 111, the gate of the third thin film transistor 113, the gate of the fourth thin film transistor 114, the gate of the fifth thin film transistor 115, the second terminal of the ninth thin film transistor 119, and the first terminal of the tenth thin film transistor 120 are connected, and the second power supply line 132 to which VSS is supplied are made to be conducting; thus, it is possible to more reliably bring the third thin film transistor 113, the fourth thin film transistor 114, and the fifth thin film transistor 115 out of conduction. Therefore, malfunction of the driver circuit can be reduced.

Next, in the fourth period T4, the next stage signal Rin (SRout_2 in FIG. 2B) obtained from the pulse output circuit in the second stage becomes an H-level signal, and the ninth thin film transistor 119 whose gate is connected to the fifth signal line 155 is thus conducting. At the time, the inverted clock signal CKB is an H-level signal, and the clock signal CK, the reset signal RES, and the previous stage signal Lin are L-level signals. The third thin film transistor 113, the fourth thin film transistor 114, the fifth thin film transistor 115, and the eleventh thin film transistor 121 are conducting. The second thin film transistor 112 is conducting as in the third period T3, and each gate of the sixth thin film transistor 116 and the seventh thin film transistor 117 is set at VSS; thus, the sixth thin film transistor 116 and the seventh thin film transistor 117 are non-conducting. Therefore, a current flows as shown by a dotted arrow in FIG. 4B, and the potential of each wiring in the fourth period T4 is thus determined as in FIG. 2B. That is, in the fourth period T4, the first output signal Gout1 and the second output signal SRout1 are output as L-level signals.

Figure 5A:
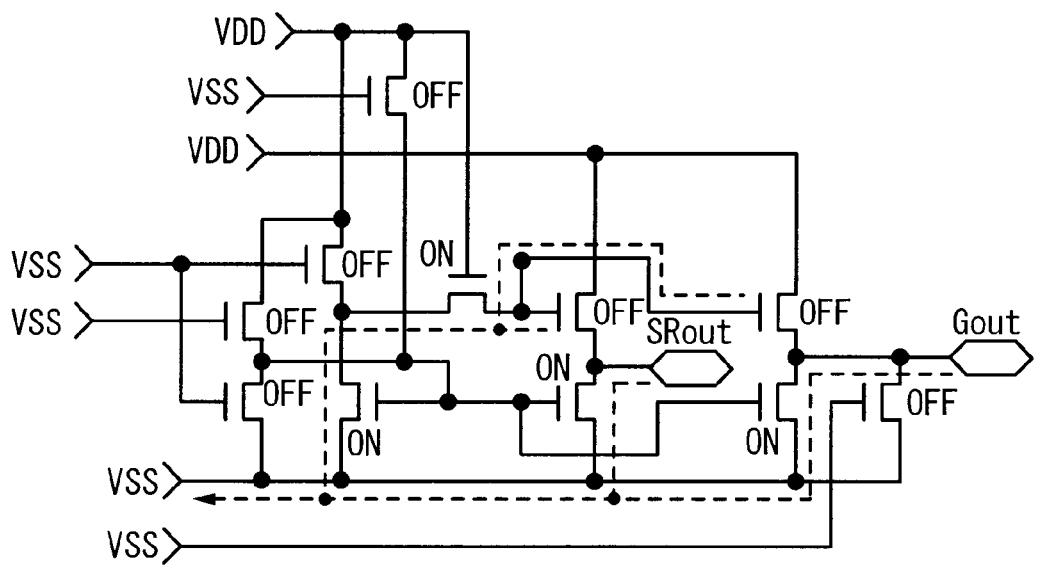
FIGS. 5A and 5B are schematic diagrams showing operation of a driver circuit.
Figure 5B:
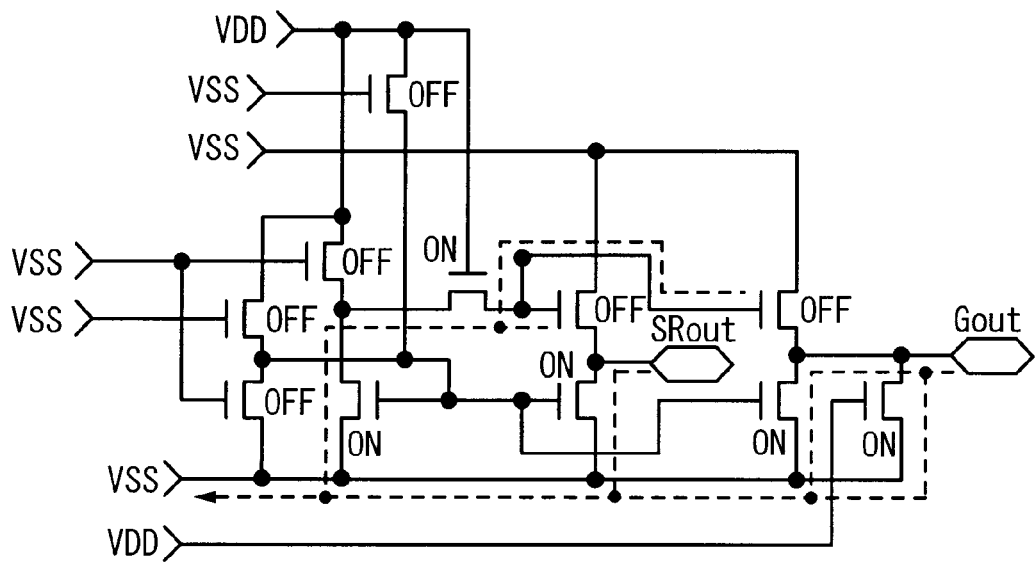

Then, the fifth period T5 is described as a period T5-1 and a period T5-2. The polarities of the clock signal CK and the inverted clock signal CKB are different between in the period T5-1 and the period T5-2. First, the period T5-1 is described. In the period T5-1, the clock signal CK is an H-level signal, and the inverted clock signal CKB, the reset signal RES, the previous stage signal Lin, and the next stage signal Rin are L-level signals. The first thin film transistor 111, the eighth thin film transistor 118, the ninth thin film transistor 119, and the tenth thin film transistor 120 are non-conducting, and the gates of the third thin film transistor 113, the fourth thin film transistor 114, and the fifth thin film transistor 115 are kept in a floating state as well as in the fourth period. That is, the third thin film transistor 113, the fourth thin film transistor 114, and the fifth thin film transistor 115 are kept in a conduction state. Further, the second thin film transistor 112 is conducting as in the fourth period T4, and the gates of the sixth thin film transistor 116 and the seventh thin film transistor 117 are set at VSS; thus, the sixth thin film transistor 116 and the seventh thin film transistor 117 are non-conducting. Furthermore, the eleventh thin film transistor 121 is conducting. Therefore, a current flows as shown by a dotted arrow in FIG. 5A, and a potential of each of the wirings in the period T5-1 is determined as shown in FIG. 5A. Next, in the period T5-2, the inverted clock signal CKB is an H-level signal, and the clock signal CK, the reset signal RES, the previous stage signal Lin, and the next stage signal Rin are L-level signals. As in the period T5-1, the first thin film transistor 111, the eighth thin film transistor 118, the ninth thin film transistor 119, and the tenth thin film transistor 120 are non-conducting; thus, the gates of the third thin film transistor 113, the fourth thin film transistor 114, and the fifth thin film transistor 115 are kept in a floating state as well as in the fourth period. That is, the third thin film transistor 113, the fourth thin film transistor 114, and the fifth thin film transistor 115 are kept in a conduction state. Further, the second thin film transistor 112 is conducting as in the fourth period T4, and each gate of the sixth thin film transistor 116 and the seventh thin film transistor 117 are set at VSS; thus, the sixth thin film transistor 116 and the seventh thin film transistor 117 are non-conducting. Furthermore, the eleventh thin film transistor 121 is conducting. Therefore, a current flows as shown by a dotted arrow in FIG. 5B, and the potentials of the wirings in the period T5-2 are determined as shown in FIG. 2B. That is, in the fifth period T5, the first output signal Gout1 and the second output signal SRout1 are output as L-level signals.

Figure 29:
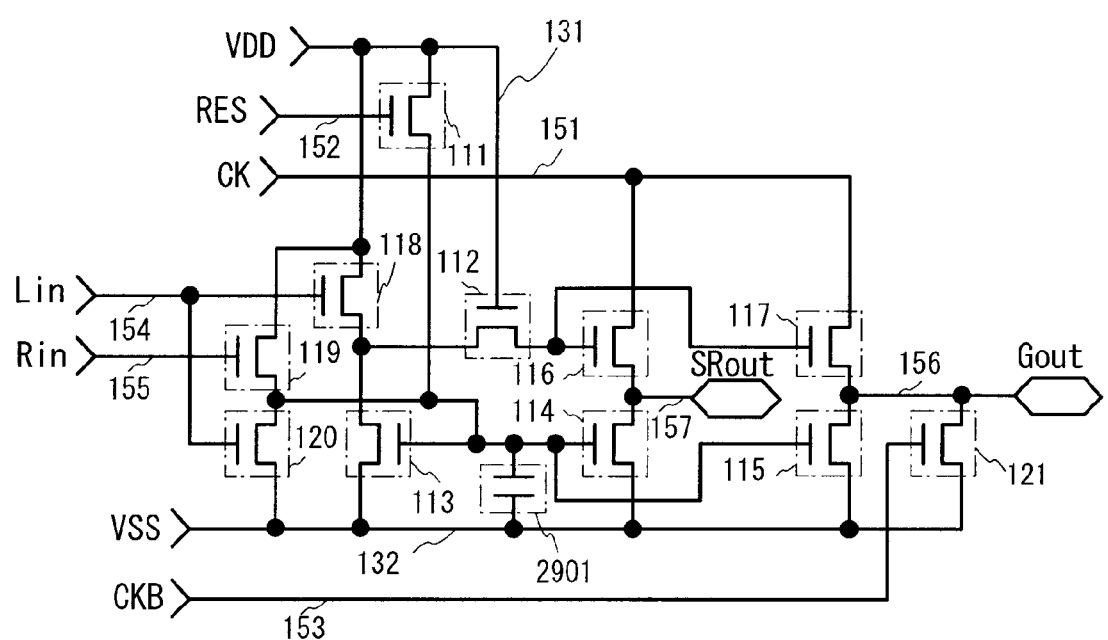
FIG. 29 is a circuit diagram of a driver circuit.

Note that a structure can be alternatively used where a capacitor 2901 is added to the structure shown in FIG. 1D (see FIG. 29). As for the capacitor 2901, one electrode is connected to the second terminal of the first thin film transistor 111, the gate of the third thin film transistor 113, the gate of the fourth thin film transistor 114, the gate of the fifth thin film transistor 115, the second terminal of the thin film transistor 119, and the first terminal of the tenth thin film transistor 120;

and the other electrode is connected to the second power supply line 132. The capacitor 2901 holds a potential of a node to which the second terminal of the first thin film transistor 111, the gate of the third thin film transistor 113, the gate of the fourth thin film transistor 114, the gate of the fifth thin film transistor 115, the second terminal of the thin film transistor 119, and the first terminal of the tenth thin film transistor 120 are connected. That is, in the fifth period T5 where the seventh signal line 157 (or the sixth signal line) holds an L-level signal, the third thin film transistor 113, the fourth thin film transistor 114, and the fifth thin film transistor 115 hold a potential which allows them to be conducting more reliably. Therefore, malfunction of the driver circuit can be reduced.

Figure 6A:
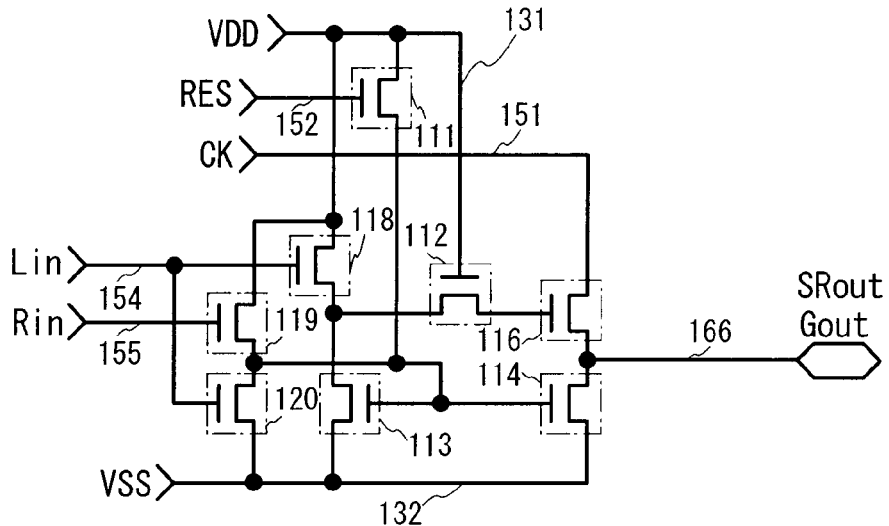
FIGS. 6A and 6B are circuit diagrams of a driver circuit.

The shift register in this embodiment separately has the sixth signal line 156 and the seventh signal line 157, which respectively output the first output signal Gout and the second output signal SRout. Accordingly, the sixth thin film transistor and the seventh thin film transistor can differ in the size of the thin film transistor in response to the load on elements in the next stage of the sixth signal line 156 and the seventh signal line 157, and the delay in rising edge of signals can be restrained. In this case, the size of the thin film transistor means a ratio of W/L (W: channel width, and L: channel length) of the thin film transistor. Note that as shown in FIG. 6A, the sixth signal line 156 and the seventh signal line 157 may be integrated into the signal line 166 which outputs the first output signal Gout and the second output signal SRout. Further, even if the eleventh thin film transistor is also removed at the same time, the same output signal can be obtained. The sixth signal line 156 and the seventh signal line 157 are integrated and the eleventh thin film transistor is removed; thus, a reduction in the number of thin film transistors and in the number of wirings to which the inverted clock signal is input can be achieved. Accordingly, a reduction in the size of the shift register can be realized.

Figure 6B:
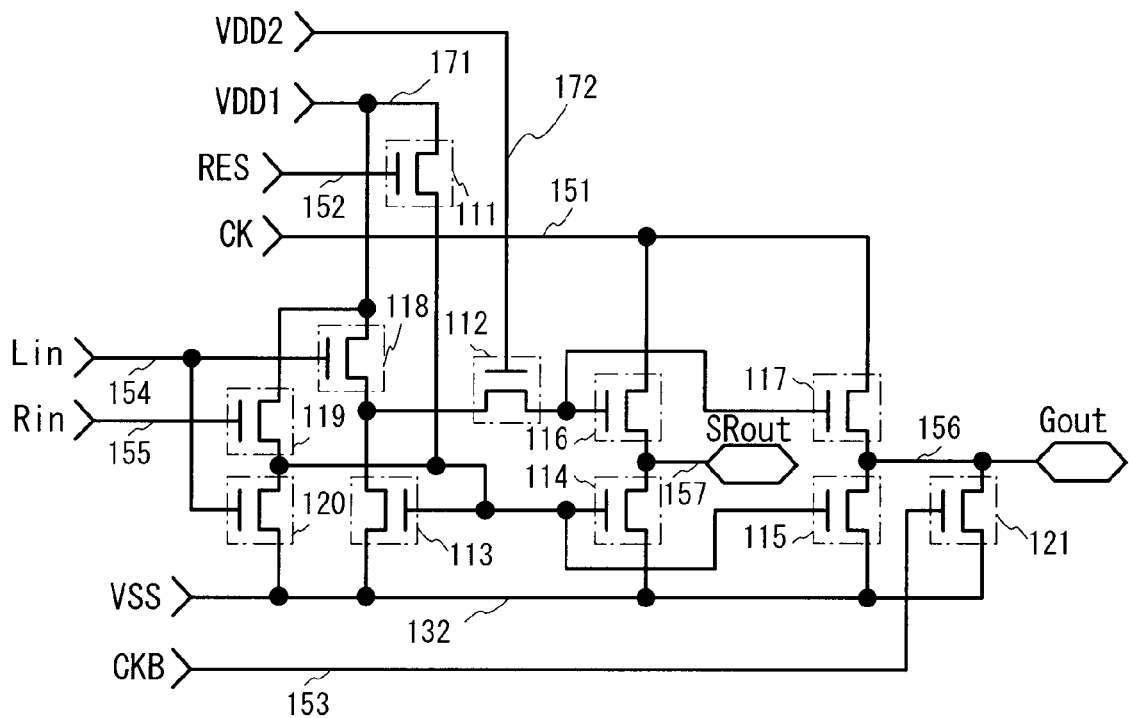

Note that in the circuit structure of the pulse output circuit in this embodiment, the eleventh thin film transistor 121 is provided. With the eleventh thin film transistor 121, the first output signal Gout of the sixth signal line 156 can have a shorter fall time. At the same time, there is no problem if the circuit structure of the pulse output circuit in this embodiment achieves the same operation as that shown in FIGS. 2A and 2B, FIGS. 3A and 3B, FIGS. 4A and 4B, and FIGS. 5A and 5B. For example, as shown in drawings, a structure can be used where a plurality of the first power supply lines 131 and/or the second power supply lines 132 is provided, and a plurality of high-voltage power supply potentials and/or low-voltage power supply potentials is supplied. For example, as shown in FIG. 6B, a wiring serving as the first power supply line may be divided into a plurality of lines, a power supply line 171 and a power supply line 172, which respectively supply a first high-voltage power supply potential VDD1 and a second high-voltage power supply potential VDD2. Further, if the first output signal Gout of the sixth signal line 156 can have a fall time sufficiently shortened by the eleventh thin film transistor 121, the fifth thin film transistor 115 does not need to shorten the fall time of the first output signal Gout of the sixth signal line 156. Therefore, in FIG. 6B, it is possible to set the first high-voltage power supply potential VDD1 supplied by the power supply line 171 lower than the second high-voltage power supply potential VDD2 supplied by the power supply line 172. As a result, it is possible to ease a shift in the threshold voltage of the third thin film transistor 113, the fourth thin film transistor 114, and the fifth thin film transistor 115.

Next, a structure of a thin film transistor included in the pulse output circuit is described. An n-channel thin film transistor has higher field-effect mobility than a p-channel thin film transistor. Therefore, in this embodiment, a structure of an n-channel thin film transistor is described.

(Structure 1)

Figure 17:
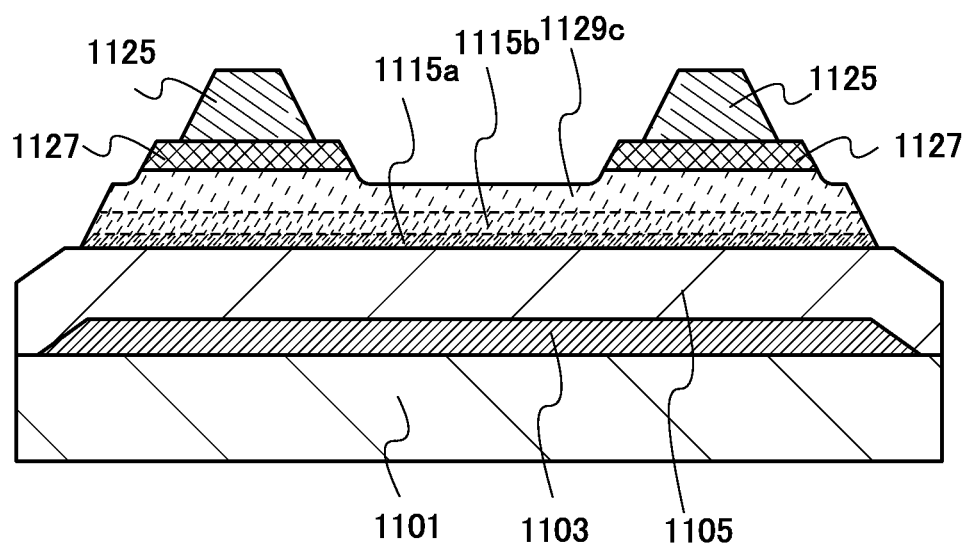
FIG. 17 is a cross-sectional view showing a driver circuit.

FIG. 17 shows a cross-sectional view of an embodiment of the thin film transistor. The thin film transistor shown in FIG. 17 has, over a substrate 1101, a gate electrode 1103, a microcrystalline semiconductor layer 1115a, a mixed layer 1115b, a layer 1129c including an amorphous semiconductor, a gate insulating layer 1105 provided between the gate electrode 1103 and the microcrystalline semiconductor layer 1115a, impurity semiconductor layers 1127 serving as a source region and a drain region which are in contact with the layer 1129c including an amorphous semiconductor, and wirings 1125 which are in contact with the impurity semiconductor layer 1127.

As the substrate 1101, a glass substrate, a ceramic substrate, a plastic substrate with heat resistance which can withstand process temperature in manufacturing steps, or the like can be used. Alternatively, in the case where the substrate does not need a light-transmitting property, a substrate in which an insulating layer is provided on a surface of a substrate of a metal such as a stainless steel alloy may be used. As a glass substrate, for example, an alkali-free glass substrate formed using barium borosilicate glass, aluminoborosilicate glass, aluminosilicate glass, or the like may be used. Further, as the substrate 1101, the substrate may have any of the following sizes: the third generation (e.g., 550 mm×650 mm), the 3.5th generation (e.g., 600 mm×720 mm or 620 mm×750 mm), the fourth generation (e.g., 680 mm×880 mm or 730 mm×920 mm), the fifth generation (e.g., 1100 mm×1300 mm), the sixth generation (e.g., 1500 mm×1850 mm), the seventh generation (e.g., 1870 mm×2200 mm), the eighth generation (e.g., 2200 mm×2400 mm), the ninth generation (e.g., 2400 mm×2800 mm), the tenth generation (e.g., 2850 mm×3050 mm), and the like.

The gate electrode 1103 can be a single layer or a stacked layer including a metal material such as molybdenum, titanium, chromium, tantalum, tungsten, aluminum, copper, neodymium, or scandium; or an alloy material containing any of these materials as a main component. Alternatively, an AgPdCu alloy or a semiconductor layer typified by polycrystalline silicon doped with an impurity element such as phosphorus may be used.

For example, as a two-layer structure of the gate electrode 1103, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure of the gate electrode 1103, a stack of a tungsten layer or a tungsten nitride layer, a layer of an alloy of aluminum and silicon or an alloy of aluminum and titanium, and a titanium nitride layer or a titanium layer is preferable. When a metal layer functioning as a barrier layer is stacked over a layer with low electric resistance, electric resistance can be lowered and diffusion of a metal element from the metal layer into the semiconductor layer can be prevented.

Note that in order to improve adhesion between the gate electrode 1103 and the substrate 1101, a nitride layer of any of the metal materials described above may be provided between the gate electrode 1103 and the substrate 1101.

The gate insulating layer 1105 can be a single layer or a stacked layer of a silicon oxide layer, a silicon nitride layer, a silicon oxynitride layer, or a silicon nitride oxide layer by CVD, sputtering, or the like.

Note that in this specification, silicon oxynitride refers to a material which contains more oxygen than nitrogen, and in the case where measurement is performed using Rutherford backscattering spectrometry (RBS) and hydrogen forward scattering (HFS), silicon oxynitride includes oxygen, nitrogen, silicon, and hydrogen as composition ranging from 50 to 70 atomic %, 0.5 to 15 atomic %, 25 to 35 atomic %, and 0.1 to 10 atomic %, respectively. Further, silicon nitride oxide refers to a material which contains more nitrogen than oxygen, and in the case where measurement is performed using RBS and HFS, silicon nitride oxide preferably includes oxygen, nitrogen, silicon, and hydrogen as composition ranging from 5 to 30 atomic %, 20 to 55 atomic %, 25 to 35 atomic %, and 10 to 30 atomic %, respectively. Note that percentages of nitrogen, oxygen, silicon, and hydrogen fall within the ranges given above if the total number of atoms contained in silicon oxynitride or silicon nitride oxide is defined as 100 atomic %.

A microcrystalline semiconductor included in the microcrystalline semiconductor layer 1115a is a semiconductor having an intermediate structure between amorphous and crystalline structures (including single crystal and polycrystal). A microcrystalline semiconductor is a semiconductor having a third state that is stable in terms of free energy and is a crystalline semiconductor having short-range order and lattice distortion, in which columnar or needle-like crystals having a grain size of from 2 to 200 nm, preferably 10 to 80 nm, more preferably 20 to 50 nm have grown in a direction normal to the substrate surface. Therefore, a crystal grain boundary is formed at the interface of the columnar or needle-like crystals in some cases.

The Raman spectrum of microcrystalline silicon, which is a typical example of a microcrystalline semiconductor, shifts to a lower wavenumber side than 520 $cm^{-1}$ which represents single crystal silicon. That is, the peak of the Raman spectrum of microcrystalline silicon is between 520 $cm^{-1}$ which represents single crystal silicon and 480 $cm^{-1}$ which represents amorphous silicon. Further, microcrystalline silicon contains hydrogen or halogen at a concentration of at least 1 atomic % to terminate a dangling bond. Moreover, microcrystalline silicon contains a rare gas element such as helium, argon, krypton, or neon to further promote lattice distortion, so that stability is increased and a favorable microcrystalline semiconductor can be obtained. Such a microcrystalline semiconductor is disclosed in, for example, U.S. Pat. No. 4,409,134.

Further, it is preferable that the concentration of oxygen and nitrogen contained in the microcrystalline semiconductor layer 1115a measured by secondary ion mass spectrometry be less than $1 \times 10^{18}$ atoms/$cm^3$ because the crystallinity of the microcrystalline semiconductor layer 1115a can be improved.

Further, a semiconductor layer, which has lower energy at an urbach edge measured by constant photocurrent method (CPM) or photoluminescence spectroscopy and a smaller amount of absorption spectra of defects than a conventional amorphous semiconductor layer, is referred to as the layer 1129c including an amorphous semiconductor.

Note that amorphous silicon is a typical example of an amorphous semiconductor in the layer 1129c including an amorphous semiconductor.

In addition, the layer 1129c including an amorphous semiconductor may include nitrogen or an NH group.

Figure 18A:
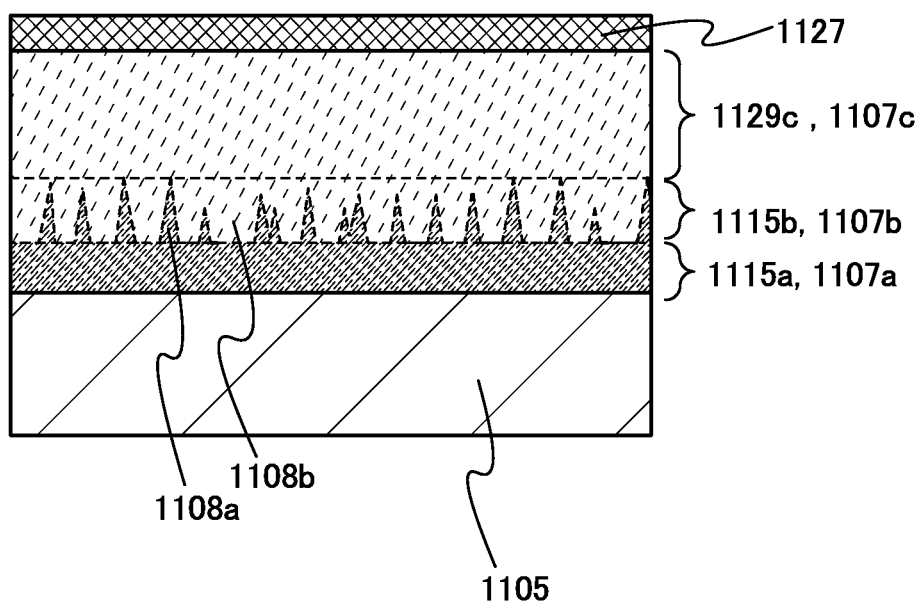
FIGS. 18A and 18B are cross-sectional views showing a driver circuit.
Figure 18B:
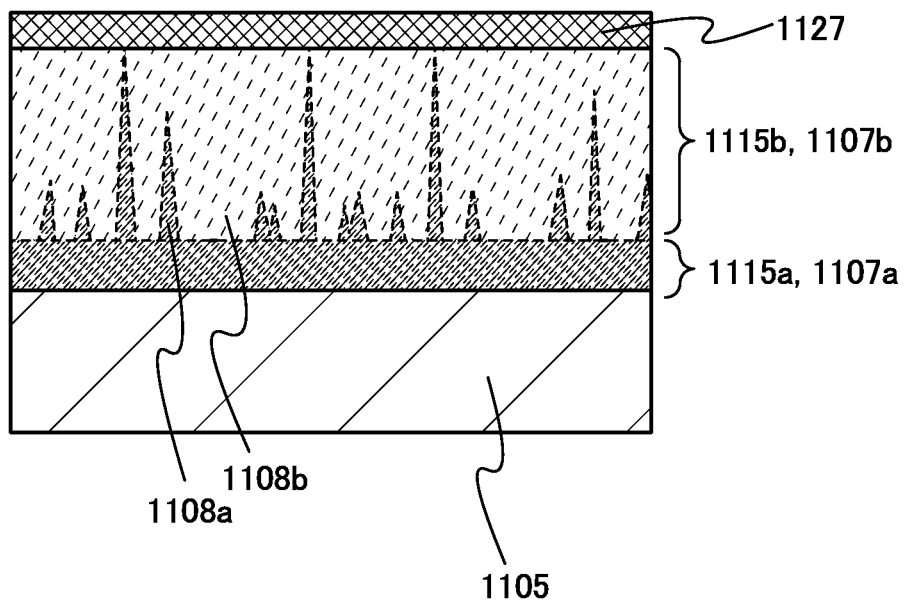

FIGS. 18A and 18B each show an enlarged view of a region between the gate insulating layer 1105 and the impurity semiconductor layer 1127 functioning as a source or drain region in FIG. 17. Particularly, the mixed layer 1115b will be described in detail.

As shown in FIG. 18A, the mixed layer 1115b is provided between the microcrystalline semiconductor layer 1115a and the layer 1129c including an amorphous semiconductor. In addition, the mixed layer 1115b includes microcrystalline semiconductor regions 1108a and amorphous semiconductor region 1108b filling the space except the microcrystalline semiconductor regions 1108a. Specifically, the mixed layer 1115b includes the microcrystalline semiconductor regions 1108a which protrudes from the microcrystalline semiconductor layer 1115a and the amorphous semiconductor region 1108b which is formed using a similar kind of semiconductor as the layer 1129c including an amorphous semiconductor. Note that the amorphous semiconductor region 1108b included in the mixed layer 1115b may include semiconductor crystal grains having a grain size from 1 nm to 10 nm, preferably, from 1 nm to 5 nm.

The microcrystalline semiconductor regions 1108a are formed using a microcrystalline semiconductor and each have a conical or pyramidal shape or a projecting shape with a tip that narrows from the gate insulating layer 1105 to the layer 1129c including an amorphous semiconductor. Note that the microcrystalline semiconductor regions 1108a may each have a conical or pyramidal shape or a projecting shape with a tip that widens from the gate insulating layer 1105 to the layer 1129c including an amorphous semiconductor.

As for the mixed layer 1115b, in the case where each of the microcrystalline semiconductor regions 1108a have a projecting shape with a tip that narrows from the gate insulating layer 1105 to the layer 1129c including an amorphous semiconductor, the mixed layer 1115b on the microcrystalline semiconductor layer 1115a side accounts for a larger microcrystalline semiconductor region than the mixed layer 1115b on the layer 1129c including an amorphous semiconductor side. The reason thereof is as follows: although the microcrystalline semiconductor regions 1108a grow in a thickness direction on a surface of the microcrystalline semiconductor layer 1115a, when a gas whose source gas contains nitrogen is added, or when a flow ratio of hydrogen to silane is reduced to less than that in the deposition condition of the microcrystalline semiconductor layer and a gas whose source gas contains nitrogen is added as well, crystal growth of the semiconductor crystal grains in the microcrystalline semiconductor regions 1108a is restrained, and the semiconductor crystal grains come to have a conical or pyramidal shape, and an amorphous semiconductor are eventually deposited.

Note that the microcrystalline semiconductor regions 1108a included in the mixed layer 1115b are semiconductors the quality of which is approximately the same as the quality of the microcrystalline semiconductor layer 1115a, while the amorphous semiconductor region 1108b included in the mixed layer 1115b is a semiconductor the quality of which is approximately the same as the quality of the layer 1129c including an amorphous semiconductor. Therefore, the interface between the microcrystalline semiconductor layer and the layer containing an amorphous semiconductor is the interface between the microcrystalline semiconductor regions 1108a and the amorphous semiconductor region 1108b in the mixed layer; thus, in other words, the interface between the microcrystalline semiconductor layer and the layer containing an amorphous semiconductor is uneven.

Since the mixed layer 1115b includes the microcrystalline semiconductor regions 1108a having a conical or pyramidal shape, resistance in the vertical direction (the thickness direction), that is, resistance between the microcrystalline semiconductor layer 1115a and the impurity semiconductor layer 1127 serving as a source or drain region can be reduced.

Accordingly, by forming the microcrystalline semiconductor layer 1115a serving as a channel region, and providing, between the channel region and the impurity semiconductor layers 1127 serving as a source region and a drain region, the mixed layer 1115b including the microcrystalline semiconductor regions 1108a having a conical or pyramidal shape, and the layer 1129c including an amorphous semiconductor formed using a well-ordered semiconductor layer which has fewer defects and whose tail slope of a level at a band edge in the valence band is steep, it is possible to reduce off-state-current of the thin film transistor and increase on-state-current and field-effect mobility.

In addition, as shown in FIG. 18B, a structure is possible where the mixed layer 1115b is provided between the microcrystalline semiconductor layer 1115a and the impurity semiconductor layer 1127, and the layer 1129c including an amorphous semiconductor is not formed between the mixed layer 1115b and the impurity semiconductor layer 1127. In such a structure, it is preferable that the microcrystalline semiconductor regions 1108a account for smaller region than the amorphous semiconductor region 1108b. In this manner, off-state-current of the thin film transistor can be reduced. Further, it is possible to reduce resistance in the vertical direction (the thickness direction) in the mixed layer 1115b and resistance between a source region and a drain region, and to increase on-state-current of the thin film transistor.

In addition, the mixed layer 1115b preferably includes nitrogen, for a typical example, an NH group or an $NH_2$ group. This is because defects are reduced when nitrogen, for a typical example, an NH group or an $NH_2$ group is bonded with dangling bonds of silicon atoms at the interface between semiconductor crystal grains included in the microcrystalline semiconductor regions 1108a and at the interface between the microcrystalline semiconductor regions 1108a and the amorphous semiconductor region 1108b. Accordingly, by setting the concentration of nitrogen at $1\times10^{20}$ cm$^{-3}$ to $1\times10^{21}$ cm$^{-3}$, the dangling bonds of silicon atoms can be easily cross-linked with nitrogen, preferably an NH group, so that carriers can flow easily. Alternatively, the dangling bonds of the semiconductor atoms at the aforementioned interfaces are terminated with the $NH_2$ group, so that the defect level disappears. As a result, resistance in the vertical direction (the film thickness direction) at the time of the application of voltage between the source electrode and drain electrode of the thin film transistor which is in an on state is reduced. That is, field-effect mobility and on current of the thin film transistor are increased.

In addition, at the interface between the microcrystalline semiconductor regions 1108a and the microcrystalline semiconductor region 1108b, and at the interface between the semiconductor crystal grains, the defects which interfere with the carrier transfer can be reduced by a reduction in oxygen concentration in the mixed layer 1115b.

Note that, in this case, the microcrystalline semiconductor layer 1115a refers to a region having approximately uniform thickness. Further, the interface between the microcrystalline semiconductor layer 1115a and the mixed layer 1115b refers to a region where the region closest to the gate insulating layer 1105 is extended in a plain portion of the interface between the microcrystalline semiconductor regions 1108a and the microcrystalline semiconductor region 1108b.

The total thickness of the microcrystalline semiconductor layer 1115a and the mixed layer 1115b, that is, the distance from the interface between the gate insulating layer 1105 and the microcrystalline semiconductor layer 1115a to each of the tips of the microcrystalline semiconductor regions 1108a is from 3 nm to 80 nm, preferably from 5 nm to 30 nm, whereby off-state-current of the TFT can be reduced.

The impurity semiconductor layer 1127 is formed using amorphous silicon to which phosphorus is added, microcrystalline silicon to which phosphorus is added, or the like. Note that in the case where a p-channel thin film transistor is formed as the thin film transistor, the impurity semiconductor layer 1127 is made of microcrystalline silicon to which boron is added, amorphous silicon to which boron is added, or the like. Note that when ohmic contact is formed between the mixed layer 1115b and the wirings 1125 or between the layer 1129c including an amorphous semiconductor and the wirings 1125, the impurity semiconductor layer 1127 is not necessarily formed.

In addition, in the case where the impurity semiconductor layer 1127 is formed using microcrystalline silicon to which phosphorus is added or microcrystalline silicon to which boron is added, characteristics of the interface can be improved by a formation of a microcrystalline semiconductor layer, for a typical example, a microcrystalline silicon layer between the mixed layer 1115b and the impurity semiconductor layer 1127 or between the layer 1129c including an amorphous semiconductor and the impurity semiconductor layer 1127. In such a manner, it is possible to reduce resistance at the interface between the mixed layer 1115b and the impurity semiconductor layer 1127 or between the layer 1129c including an amorphous semiconductor and the impurity semiconductor layer 1127. As a result, it is possible to increase an amount of a current flowing through a source region, the microcrystalline semiconductor layer 1115a, the mixed layer 1115b, and the layer 1129c including an amorphous semiconductor, and a drain region, which are included in the thin film transistor; thus, an increase in on-state-current and the field-effect mobility can be realized.

Figure 19:
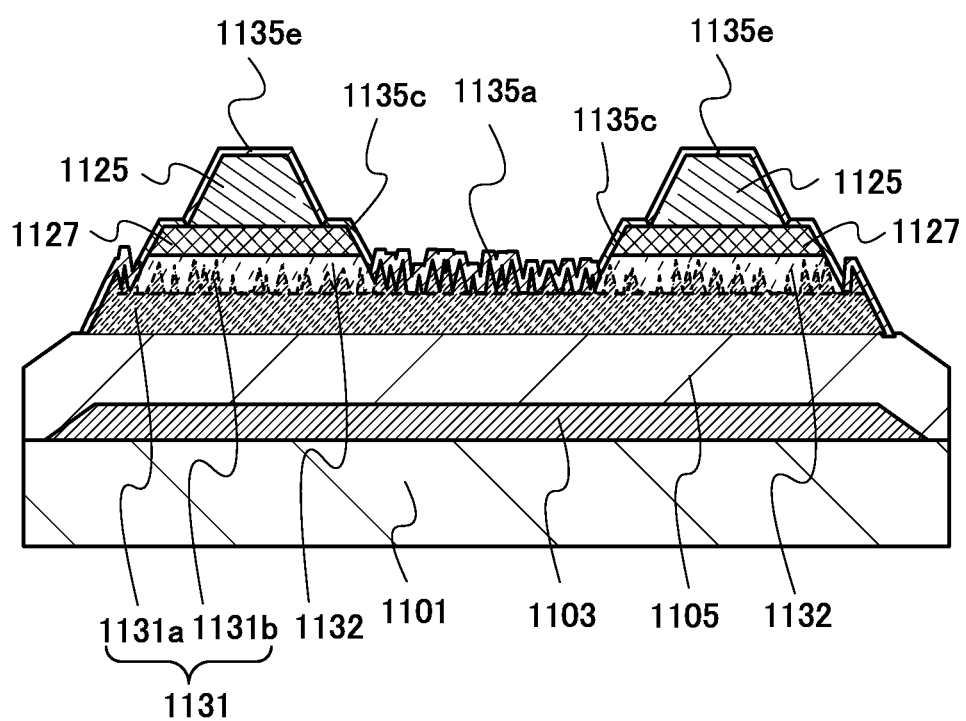
FIG. 19 is a cross-sectional view showing a driver circuit.

Wirings 1125 illustrated in FIG. 19 can be a single layer or a stacked layer including aluminum, copper, titanium, neodymium, scandium, molybdenum, chromium, tantalum, tungsten, or the like. Alternatively, an aluminum alloy to which an element for preventing generation of hillocks is added (e.g., an Al—Nd alloy which can be used for the gate electrode 1103) may be used. A layer may have a stacked-layer structure in which a layer on a side which is in contact with the impurity semiconductor layer 1127 is formed using titanium, tantalum, molybdenum, tungsten, or nitride of any of these elements and aluminum or an aluminum alloy is formed thereover. Further, a stacked layer structure may be used in which upper and lower surfaces of aluminum or an aluminum alloy may be sandwiched between any of titanium, tantalum, molybdenum, tungsten, or nitride thereof.

With the thin film transistor shown in FIGS. 18A and 18B, and FIG. 19, off-state-current can be reduced and on-state-current and the field-effect mobility can be increased. Further, since the channel region is formed using a microcrystalline semiconductor layer, fewer deterioration and higher reliability in electric characteristics can be realized. Moreover, since on-state-current is high, a reduction in an area of the channel region, that is, an area occupied by the thin film transistor is smaller, and integration level of the thin film transistor is thus higher than with a thin film transistor whose channel region is formed using an amorphous silicon.

(Structure 2)

FIG. 19 shows a cross-sectional view of an embodiment of the thin film transistor. The thin film transistor shown in FIG. 19 includes the gate electrode 1103 over the substrate 1101, the gate insulating layer 1105 which covers the gate electrode 1103, a microcrystalline semiconductor layer 1131 which functions as a channel region and is in contact with the gate insulating layer 1105, a pair of layers 1132 including an amorphous semiconductor over the microcrystalline semiconductor layer 1131, and the impurity semiconductor layers 1127 which function as a source region and a drain region and are in contact with the pair of layers 1132 containing an amorphous semiconductor. Further, the thin film transistor shown in FIG. 19 includes wirings 1125 which are in contact with the impurity semiconductor layers 1127 and function as a source electrode and a drain electrode. In addition, a first insulating layer 1135a is formed over a surface of the microcrystalline semiconductor layer 1131. Further, second insulating layers 1135c are formed over surfaces of the pair of layers 1132 including an amorphous semiconductor and surface of the impurity semiconductor layer 1127. Furthermore, third insulating layers 1135e are formed over surfaces of the wirings 1125.

A first microcrystalline semiconductor layer 1131a in contact with the gate insulating layer 1105, and a second microcrystalline semiconductor layer 1131b having a plurality of conical or pyramidal protrusions (projections) are formed in the first microcrystalline semiconductor layer 1131.

The microcrystalline semiconductor layer 1131 is formed using a microcrystalline semiconductor which is similar to the microcrystalline semiconductor layer 1115a described in Embodiment 1. The second microcrystalline semiconductor layer 1131b can be formed in a manner similar to the microcrystalline semiconductor regions 1108a included in the mixed layer 1115b described in Embodiment 1.

In a manner similar to the layer 1129c including an amorphous semiconductor described in Embodiment 1, the pair of layers 1132 including an amorphous semiconductor can be formed using a well-ordered semiconductor which has fewer defects and whose tail slope of a level at a band edge in the valence band is steeper than a conventional amorphous semiconductor layer.

The first insulating layer 1135a is formed using an oxide layer formed by oxidizing the microcrystalline semiconductor layer 1131, a nitride layer formed by nitriding the microcrystalline semiconductor layer 1131, an oxynitride layer or a nitride oxide layer formed by nitriding and oxidizing the microcrystalline semiconductor layer 1131, or the like. As a typical example of the first insulating layer 1135a, a silicon oxide layer, a silicon nitride layer, a silicon oxynitride layer, a silicon nitride oxide layer, or the like can be used.

The second insulating layers 1135c are formed using oxide layers formed by oxidizing the pair of layers 1132 including an amorphous semiconductor and the impurity semiconductor layers 1127, nitride layers formed by nitriding the pair of layers 1132 including an amorphous semiconductor and the impurity semiconductor layers 1127, oxynitride layers or nitride oxide layers formed by nitriding and oxidizing the pair of layers 1132 including an amorphous semiconductor and the impurity semiconductor layers 1127, the impurity semiconductor layers 1127, or the like. As a typical example of the second insulating layers 1135c, silicon oxide layers, silicon nitride layers, silicon oxynitride layers, silicon nitride oxide layers, or the like can be used.

The third insulating layers 1135e are formed using oxide layers formed by oxidizing the wirings 1125, nitride layers formed by nitriding the wirings 1125, oxynitride layers or nitride oxide layers formed by nitriding and oxidizing the wirings 1125, or the like. Note that although the third insulating layers 1135e are formed on top surfaces and side surfaces of the wirings 1125 in this case, the third insulating layers 1135e may be formed only on side surfaces of the wirings 1125 and are not necessarily be formed on top surfaces of the wirings 1125. As a typical example of the third insulating layers 1135e, metal oxide layers, metal nitride layers, metal oxynitride layers, metal nitride oxide layers, or the like can be used. In this case, the metal refers to any of the metal elements in the description of the wirings 1125.

The pair of layers 1132 includes an amorphous semiconductor and thus has a weak n-type conductivity. In addition, the pair of layers 1132 including an amorphous semiconductor has lower density than the microcrystalline semiconductor layer 1131. Therefore, the second insulating layers 1135c formed by oxidizing or nitriding the amorphous semiconductor layer are nondense insulating layers having low density and a low insulating property. However, in the thin film transistor described in this embodiment, the first insulating layer 1135a formed by oxidizing the microcrystalline semiconductor layer 1131 is formed on a back channel side. The microcrystalline semiconductor layer has higher density than the amorphous semiconductor layer, and the first insulating layer 1135a thus has also high density and a high insulating property. Further, the second insulating layer 1131b has a plurality of conical or pyramidal protrusions (projections) and thus has an uneven surface. Therefore, a leak path between a source region and a drain region has a long distance. Accordingly, a reduction in off-state-current of the thin film transistor can be realized.

In the thin film transistor described in this embodiment, a microcrystalline semiconductor layer having a plurality of conical or pyramidal protrusions is used for a channel region, and a pair of layers containing an amorphous semiconductor are formed in contact with the microcrystalline semiconductor layer; therefore, a larger amount of on-state-current can be obtained than in a thin film transistor in which an amorphous semiconductor is used for a channel region, and a smaller amount of off-state-current can be obtained than in a thin film transistor in which a microcrystalline semiconductor is used for a channel region.

By the use of a thin film transistor, as shown in Structure 1 and Structure 2 described above, in which a microcrystalline semiconductor is used for a channel region as the thin film transistor included in the pulse output circuit, degradation of characteristics of the thin film transistor can be suppressed, and deterioration in the display quality can be restrained. Further, in the case where a microcrystalline semiconductor is used for a semiconductor layer of the thin film transistor, productivity can be improved, and an increase in the size of the display device, a reduction in cost, an improvement in yield, or the like can thus be achieved Note that the contents described in each drawing in this embodiment can be freely combined with or replaced with the contents described in any of the other embodiments as appropriate.

Embodiment 2

In this embodiment, an embodiment of a driver circuit having a structure which is different from the structure in the above embodiment is described.

Driver circuits which function as shift registers are described with reference to FIGS. 7A to 7C, FIGS. 8A and 8B, FIGS. 9A and 9B, FIGS. 10A and 10B, and FIG. 30. A shift register 700 includes first to J-th pulse output circuits 701_1 to 701_J (J is preferably a multiple of 4, which is 4 or more) (see FIG. 7A). Unlike the embodiment above, a first clock signal CK1 from a first wiring 702, a second clock signal CK2 from a second wiring 703, a third clock signal CK3 from a third wiring 704, a fourth clock signal CK4 from a fourth wiring 705, and a reset signal RES from a fifth wiring 706 are input to each of the stages of the first to J-th pulse output circuits 701_1 to 701_J of the shift register 700 shown in FIG. 7A. Further, a start pulse SP or a signal from a pulse output circuit in the previous stage (referred to as the previous stage signal Lin) is input to each of the plurality of pulse output circuits. Furthermore, a signal from a pulse output circuit in the next stage (referred to as the next stage signal Rin) is input to each of the plurality of pulse output circuits. Moreover, the pulse output circuit in each stage outputs a first output signal Gout which is output to a gate line, a data line, etc. and outputs a second output signal SRout which is output to the pulse output circuit in the previous and/or the pulse output circuit in the next stage. Note that a dummy stage of the pulse output circuit, which outputs a signal which does not contribute to display in a display portion, may be provided. For example, in a structure where the pulse output circuit is used as a shift register in a gate driver and outputs pulses sequentially to n gate lines, J stages (n≤J) may be satisfied.

Note that the first clock signal CK1 to the fourth clock signal CK4 sequentially deviate (are sequentially delayed) by a fourth of a cycle. Specifically, a (J−2)th clock signal CK2 is advanced from a (J−3)th clock signal CK1 by a fourth of a cycle, a (J−1)th clock signal CK3 is advanced from the (J−2)th clock signal CK2 by a fourth of a cycle, a J-th clock signal CK4 is advanced from the (J−1)th clock signal CK3 by a fourth of a cycle, the J-th clock signal CK4 is advanced from the (J−3)th clock signal by a fourth of a cycle. As shown in FIG. 7B, as for the pulse output circuit 701_1 in a first stage, which is an example of a (J−3)th stage, a clock signal CK_N (in this case, N is 1) is input to a first terminal; the reset signal RES is input to a second terminal; any of the first to fourth clock signals (in this case, CK2) which is different from the clock signal input to the first terminal is input to a third terminal; the previous stage signal Lin is input to a fourth terminal; the next stage signal Rin is input to a fifth terminal; the first output signal Gout is output from a sixth terminal; and the second output signal SRout is output from a seventh terminal. As for the pulse output circuit 701_2 in a second stage, which is an example of a (J−2)th stage, a clock signal CK_N (in this case, N is 2) is input to a first terminal; the reset signal RES is input to a second terminal; any of the first to fourth clock signals (in this case, CK3) which is different from the clock signal input to the first terminal is input to a third terminal; the previous stage signal Lin is input to a fourth terminal; the next stage signal Rin is input to a fifth terminal; the first output signal Gout is output from a sixth terminal; and the second output signal SRout is output from a seventh terminal. As for the pulse output circuit 701_3 in a third stage, which is an example of a (J−1)th stage, a clock signal CK_N (in this case, N is 3) is input to a first terminal; the reset signal RES is input to a second terminal; any of the first to fourth clock signals (in this case, CK3) which is different from the clock signal input to the first terminal; the previous stage signal Lin is input to a fourth terminal; the next stage signal Rin is input to a fifth terminal; the first output signal Gout is output from a sixth terminal; and the second output signal SRout is output from a seventh terminal. As for the pulse output circuit 701_4 in a fourth stage, which is an example of the J-th stage, a clock signal CK_N (in this case, N is 4) is input to a first terminal; the reset signal RES is input to a second terminal; any of the first to fourth clock signals (in this case, CK4) which is different from the clock signal input to the first terminal is input to a third terminal; the previous stage signal Lin is input to a fourth terminal; the next stage signal Rin is input to a fifth terminal; the first output signal Gout is output from a sixth terminal; and the second output signal SRout is output from a seventh terminal. Note that the first clock signal CK1 to the fourth clock signal CK4 become H-level signals (high power supply potential level) and L-level signals (low power supply potential level) repeatedly at a regular interval.

Next, an example of a specific circuit structure of the pulse output circuit is described with reference to FIG. 7C. Note that an example of the structure of the pulse output signal in the (J−3)th stage is described below with reference to FIG. 7C. Note that the plurality of pulse output circuits differ from each other in that the terminals to which any of the first to fourth clock signals CK1 to CK4 is input are changed, as described above. As shown in FIG. 7C, the circuit structure of the pulse output circuit is similar to that of the pulse out put circuit described in Embodiment 1 with reference to FIG. 1D, and the explanation given above is thus incorporated herein.

Figure 7A:
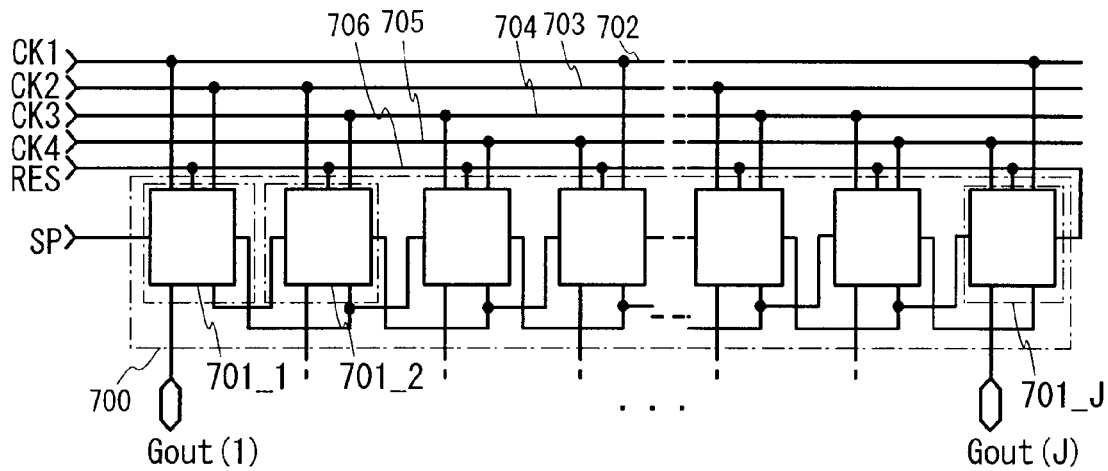
FIGS. 7A to 7C are circuit diagrams of a driver circuit.
Figure 7B:
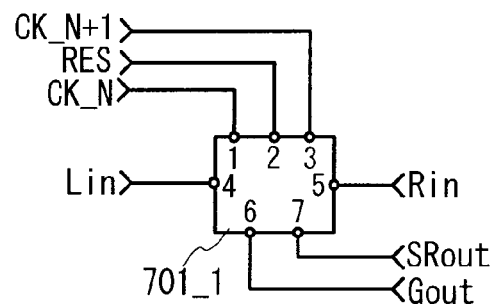
Figure 7C:
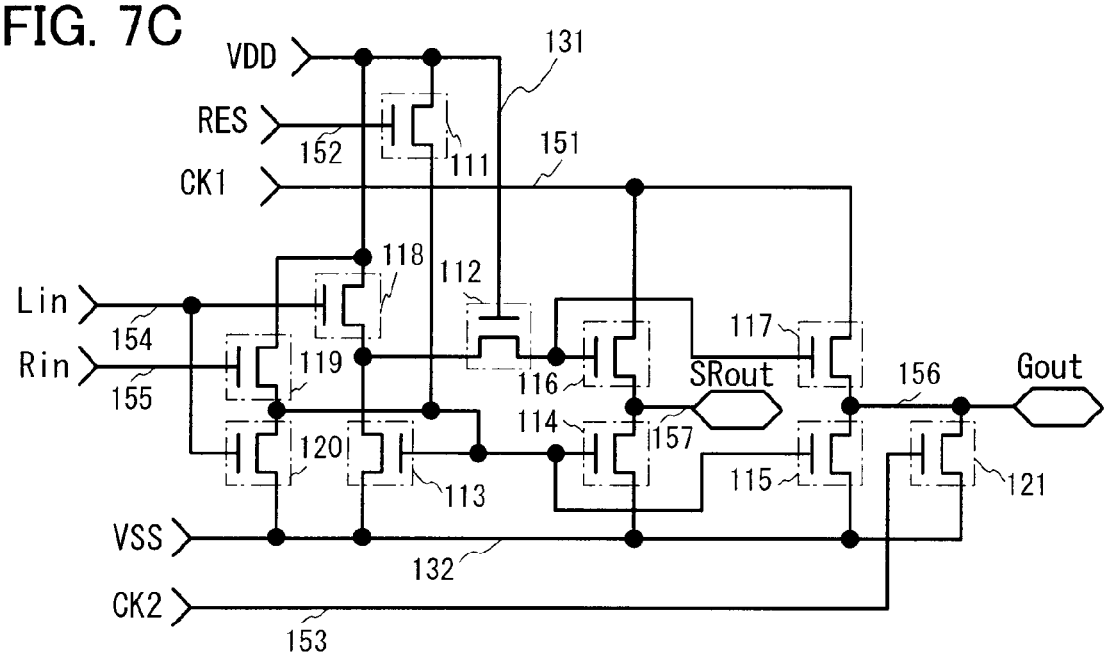
Figure 8A:
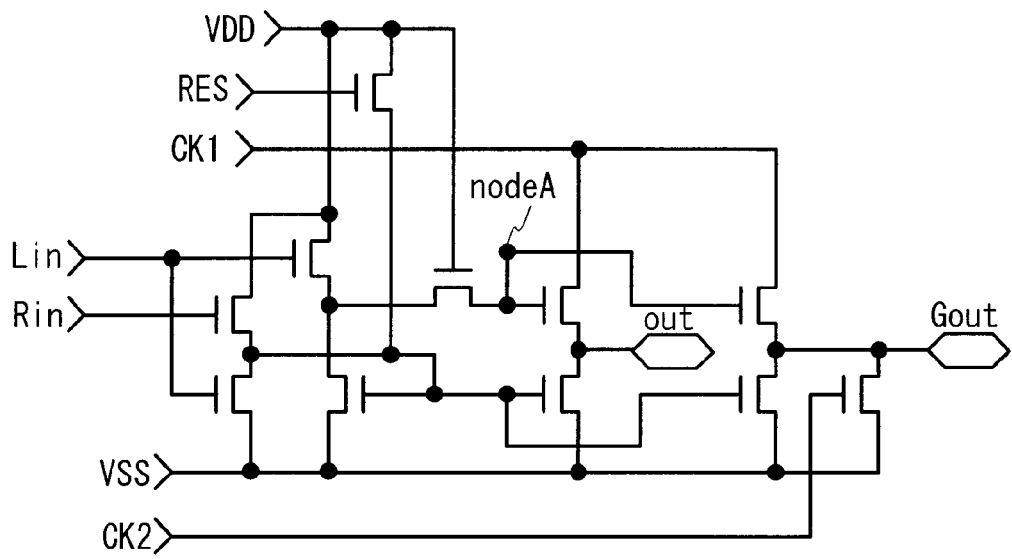
FIGS. 8A and 8B are a circuit diagram of a driver circuit and a timing chart for an explanation of operation of the driver circuit.
Figure 8B:
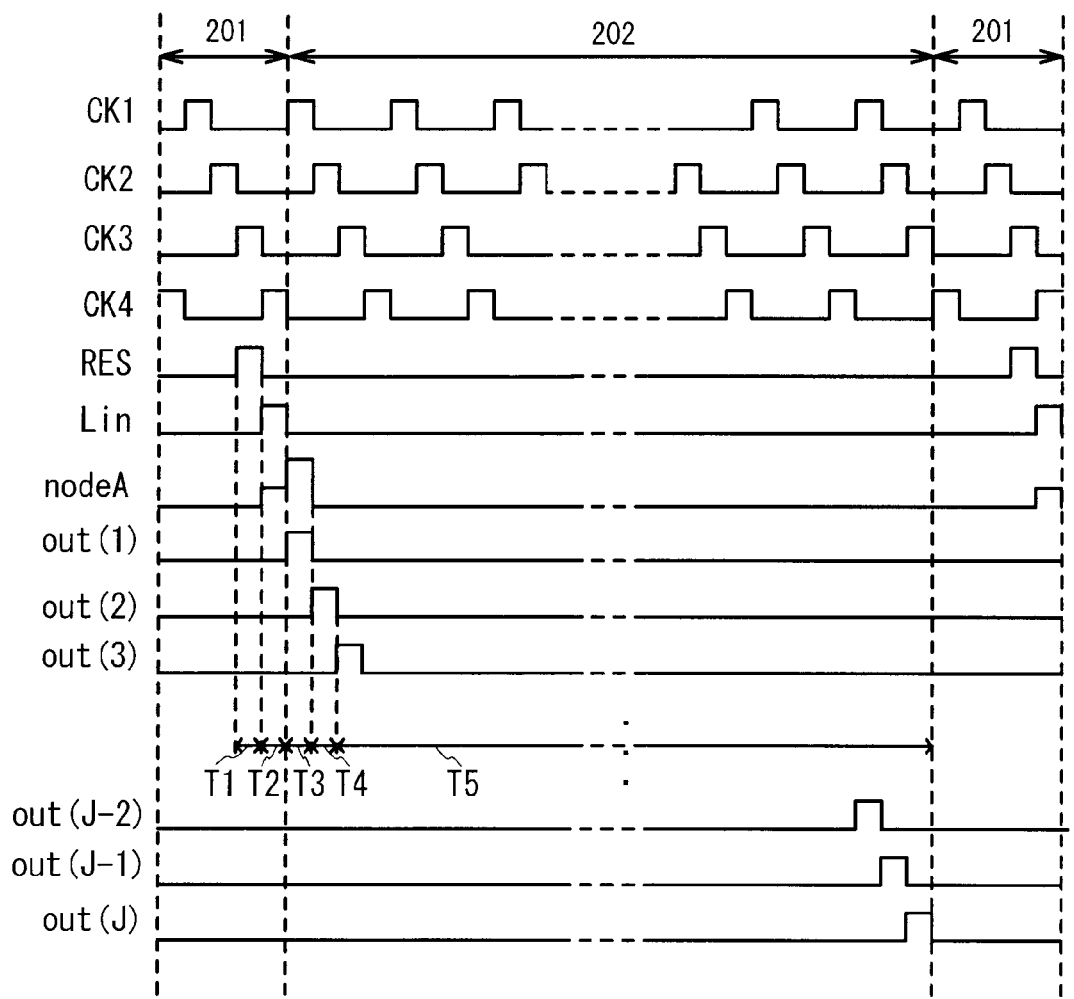

Next, operation of the shift register shown in FIGS. 7A to 7C is described with reference to FIGS. 8A and 8B, FIGS. 9A and 9B, FIGS. 10A and 10B, FIGS. 11A and 11B. Note that for explanation, as shown in FIG. 8A, a connection node of the second terminal of the second thin film transistor 112, the gate of the sixth thin film transistor 116, and the gate of the seventh thin film transistor 117 is denoted by a node A in a manner similar to that in Embodiment 1. Further, in order to specifically describe the operation of the shift register, a first period T1, a second period T2, a third period T3, a fourth period T4, and a fifth period T5, which are shown in a timing chart in FIG. 8B, are separately used for explanation. Note that in the following description, the first to eleventh thin film transistors 111 to 121 are N-channel thin film transistors and are in a conduction state when voltage (Vgs) between the gate and the source exceeds a threshold voltage (Vth). Note that in FIG. 8B, the first to eleventh thin film transistors 111 to 121 used for a shift register included in a gate driver, and a period 201 is a vertical retrace period and a period 202 is a gate selection period. Further, in the timing chart in FIG. 8B shows specific examples of the waveforms of the first clock signal CK1, the second clock signal CK2, the third clock signal CK3, the fourth clock signal CK4, the reset signal RES, the previous stage signal Lin, the next stage signal Rin, and the second output signal SRout of each stage (e.g., SRout1 of the first stage). Furthermore, the high power supply potential level and the low power supply potential level of each signal are VDD and VSS, respectively. In addition, a first output signal Gout1 is omitted here because it has a waveform which is the same as that of the second output signal SRout1.

A difference between the structure described in this embodiment and the structure described in Embodiment 1 is the cycle of charge and discharge that each of the clock signals (the first to fourth clock signals CK1 to CK4) repeats. In this embodiment, the number of charges and discharges of each clock signal can be made approximately half of that of a clock signal CK and the inverted clock signal CKB in Embodiment 1. Therefore, a reduction in frequency of a clock signal can be achieved, and a reduction in power consumption can be realized. In particular, in a driver circuit of a large display device, parasitic capacitance, gate capacitance, or the like of each wiring is increased. By a reduction in the number of charges and discharges of a clock signal used for a shift register to be driven, it is possible to shorten a time for the rising (a shift from VSS to VDD) or the falling (a shift from VDD to VSS) of a signal used for storing electricity in each wiring. Therefore, a driver circuit of a display device which is capable of high quality displays can be obtained.

Figure 9A:
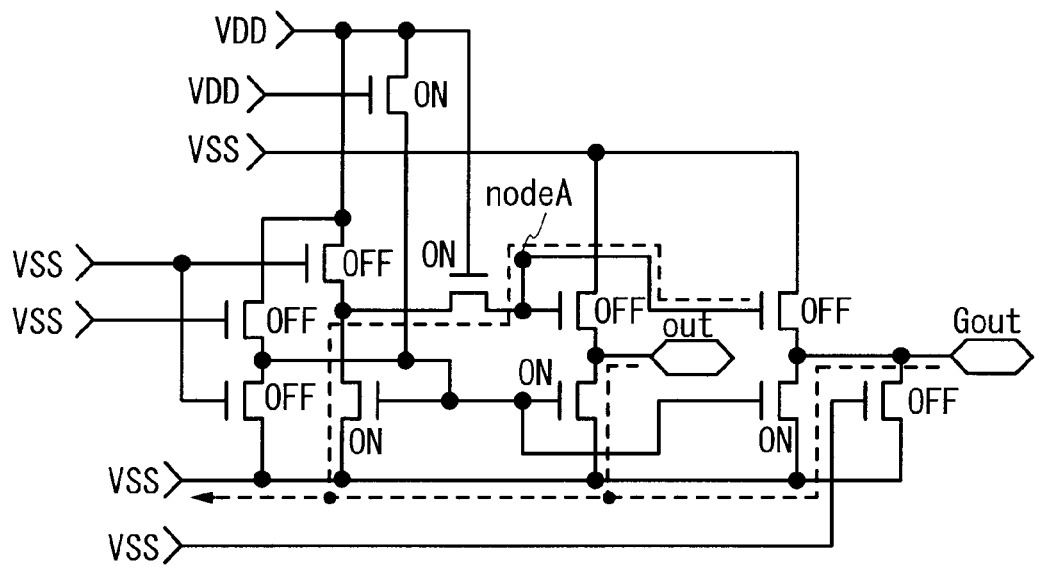
FIGS. 9A and 9B are schematic diagrams showing operation of a driver circuit.

In the first period T1, the reset signal RES becomes an H-level signal and the first thin film transistor 111 whose gate is connected to the second signal line 152 is conducting. At the time, the second clock signal CK2, the first clock signal CK1, the previous stage signal Lin, and the next stage signal Rin are L-level signals. As shown in FIG. 9A, after the first thin film transistor 111 is conducting, the second thin film transistor 112, the third thin film transistor 113, the fourth thin film transistor 114, and the fifth thin film transistor 115 are conducting. Therefore, a current flows as shown by a dotted arrow in FIG. 9A, and the potential of each wiring in the first period T1 is determined as shown in FIG. 8B. That is, the first period T1 is a period during which the potential of each wiring in the pulse output circuit is reset (to VSS). In addition, in the first period T1, an L-level signal is output as the second output signal SRout.

When the reset signal RES is input to the gate of the first thin film transistor 111 every vertical retrace period which is the period 201, the potential of each of the thin film transistors can be set at VSS. Therefore, a so-called dynamic circuit, which is described in this embodiment and which is driven with the use of a node in a floating state, can initialize each node, whereby noise immunity and operation reliability can be improved to be equal to those of a static circuit.

Figure 9B:
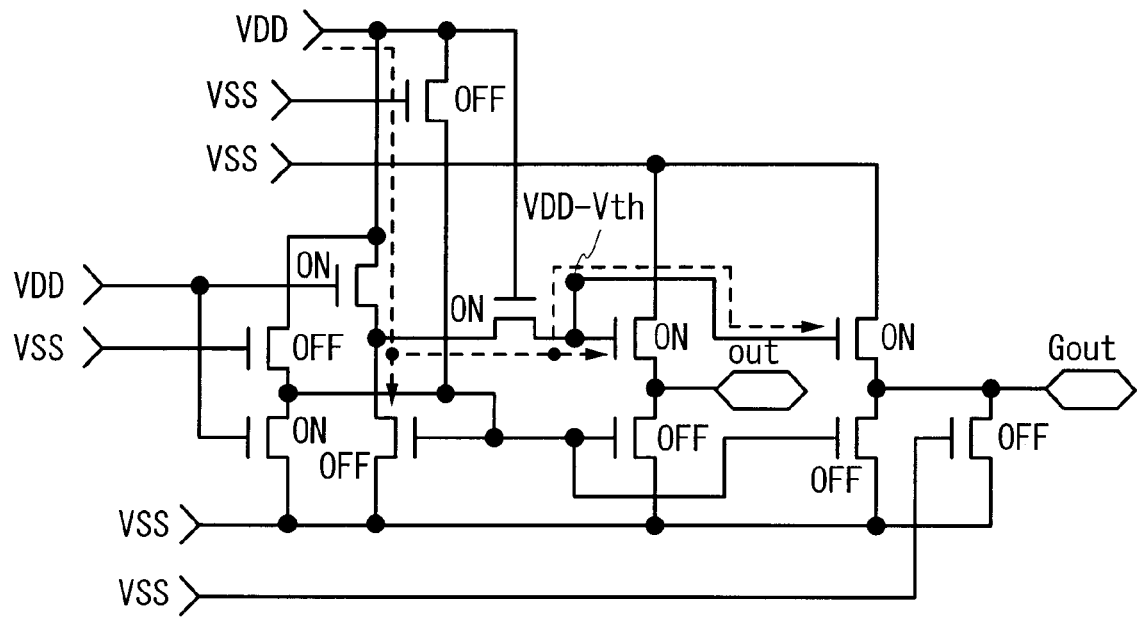

Next, in the second period T2, the previous stage signal Lin is an H-level signal, and the eighth thin film transistor 118 and the tenth thin film transistor 120 whose gates are each connected to the fourth signal line 154 are thus conducting. At the time, the first clock signal CK1, the second clock signal CK2, the reset signal RES, and the next stage signal Rin are L-level signals. Further, at the time, the eighth thin film transistor 118 is conducting, as illustrated in FIG. 9B. The second thin film transistor 112 is conducting as in the first period T1, and a current flows, as shown by a dotted arrow in FIG. 9B. At the time, the node A uses the second terminal of the eighth thin film transistor 118 as the source; therefore, a potential of the node A becomes a value VDD-Vth obtained by subtraction of the threshold voltage Vth of the eighth thin film transistor 118 from a value of a potential of the first power supply line 131. When the second terminal of the eighth thin film transistor 118 is VDD-Vth, the thin film transistor 118 are non-conducting and the node A enters into a floating state while maintaining VDD-Vth. Note that as shown in FIG. 9B, since the sixth thin film transistor 116 and the seventh thin film transistor 117 are conducting, and since the first signal line 151 is VSS, the potential of each wiring in the second period T2 is determined as in FIG. 9B. That is, the second period T2 is a period during which the node A in the pulse output circuit is brought into a floating state. In addition, in the second period T2, an L-level signal is output as the second output signal SRout1.

Figure 10A:
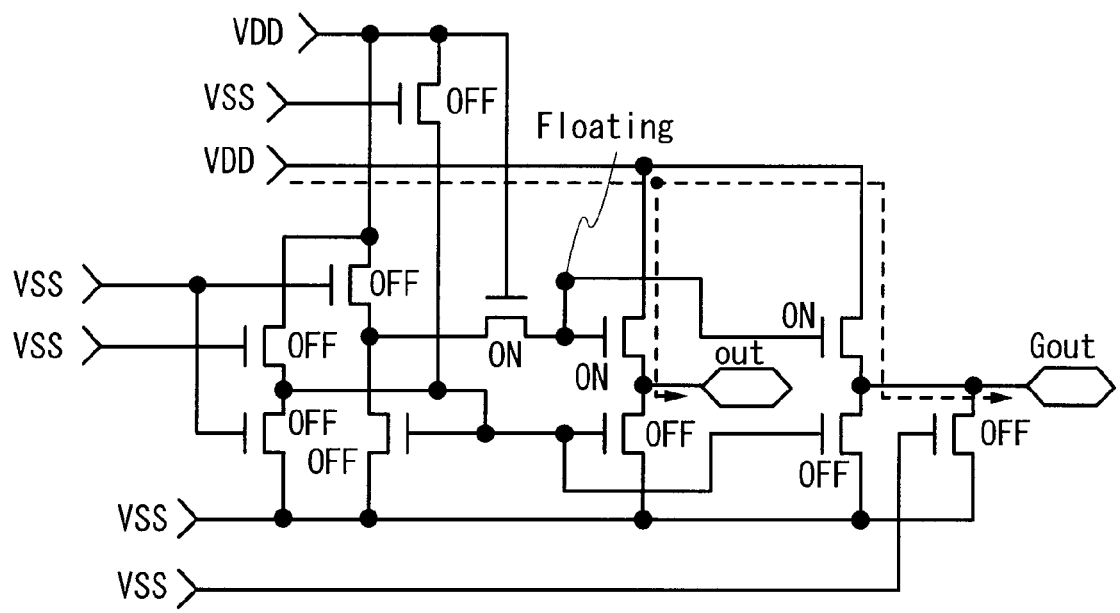
FIGS. 10A and 10B are schematic diagrams showing operation of a driver circuit.
Figure 10B:
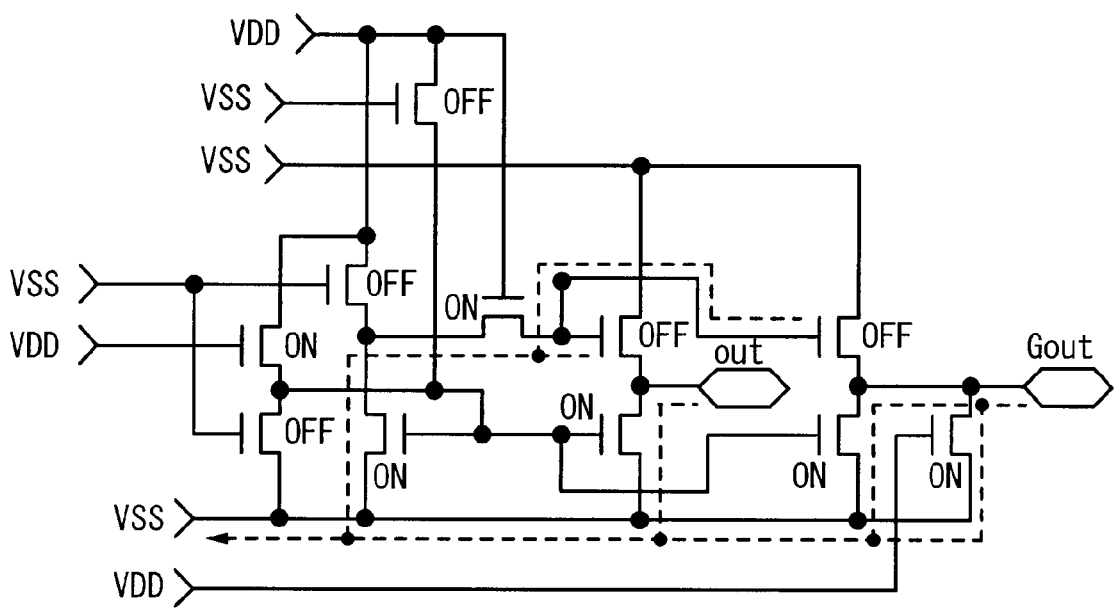

Next, in the third period T3, the first clock signal CK1 becomes an H-level signal. At the time, the second clock signal CK2, the reset signal RES, the previous stage signal Lin, and the next stage signal Rin are L-level signals. Further, at the time, as shown in FIG. 10A, the sixth thin film transistor 116 and the seventh thin film transistor 117 are conducting, that is, the sixth thin film transistor 116 and the seventh thin film transistor 117 are in a state where current flows between a source and a drain (a dotted arrow in FIG. 10A), and a potential of each second terminal (the source side) of the sixth thin film transistor 116 and the seventh thin film transistor 117 starts to increase. There is capacitive coupling due to parasitic capacitance between a gate and a source of each of the sixth thin film transistor 116 and the seventh thin film transistor 117, so that a potential of a gate of the node A in a floating state increases as a potential of the second terminal serving as the source increases (bootstrap operation). A potential of the node A eventually becomes higher than VDD+Vth, and the second terminal of each of the sixth thin film transistor 116 and the seventh thin film transistor 117 thus has a potential of VDD. Therefore, an H-level signal is output as the second output signal SRout1 in the third period T3, that is, a potential of the node A in a floating state is raised by the bootstrap operation and the first output signal Gout1 and the second output signal SRout1 are output as H-level signals. Then, the second output signal SRout1 is input as the previous stage signal Lin in the pulse output circuit in the second stage.

Note that as shown in FIG. 8B, with the second thin film transistor 112 whose gate is supplied with high-voltage power supply potential VDD, advantages described below are obtained.

Without the second thin film transistor 112 whose gate is supplied with high-voltage power supply potential VDD, if a potential of the node A is raised by bootstrap operation, a potential of a source which is the second terminal of the eighth thin film transistor 118 increases to a value higher than the high power supply potential VDD. Then, the first terminal of the eighth thin film transistor 118 comes to serve as the source thereof. Therefore, in the eighth thin film transistor 118, a large amount of bias voltage is applied and thus great stress is applied between a gate and a source and between the gate and a drain in the third period T3, which can cause deterioration in the thin film transistor.

With the second thin film transistor 112 whose gate is supplied with high-voltage power supply potential VDD, the potential of the node A is raised by bootstrap operation, but at the same time, an increase in the potential of the second terminal of the eighth thin film transistor 118 can be prevented. In other words, with the second thin film transistor 112, the level of a negative bias voltage applied between a gate and a source of the eighth thin film transistor 118 can be lowered. Accordingly, with the circuit structure in this embodiment, the level of a negative bias voltage applied between a gate and a source of the thin film transistor can be lowered, so that deterioration in the eighth thin film transistor 118, which is due to stress, can further be suppressed.

Note that the second thin film transistor 112 are provided so as to be connected, through the first terminal and the second terminal of the second thin film transistor 112, between the second terminal of the eighth thin film transistor 118 and the gate of the sixth thin film transistor 116, or between the second terminal of the eighth thin film transistor 118 and the gate of the seventh thin film transistor 117.

Note that the second thin film transistor 112 may be connected to the third power supply line 2801 to which conduction holding potential VCC shown in FIG. 28A is supplied in a manner similar to that of Embodiment 1. Alternatively, a twelfth thin film transistor 2802 shown in FIG. 28B may be provided Next, in the fourth period T4, the next stage signal Rin (SRout_2 in FIG. 2B) obtained from the pulse output circuit in the second stage becomes an H-level signal, and the ninth thin film transistor 119 whose gate is connected to the fifth signal line 155 is thus conducting. At the time, the second clock signal CK2 is an H-level signal, and the first clock signal CK1, the reset signal RES, and the previous stage signal Lin are L-level signals. The third thin film transistor 113, the fourth thin film transistor 114, the fifth thin film transistor 115, and the eleventh thin film transistor 121 are conducting. The second thin film transistor 112 is conducting as in the third period T3, and each gate of the sixth thin film transistor 116 and the seventh thin film transistor 117 is set at VSS; thus, the sixth thin film transistor 116 and the seventh thin film transistor 117 are non-conducting. Therefore, a current flows as shown by a dotted arrow in FIG. 10B, and the potential of each wiring in the fourth period T4 is thus determined as in FIG. 8B. That is, in the fourth period T4, the first output signal Gout1 and the second output signal SRout1 are L-level signals.

Figure 30:
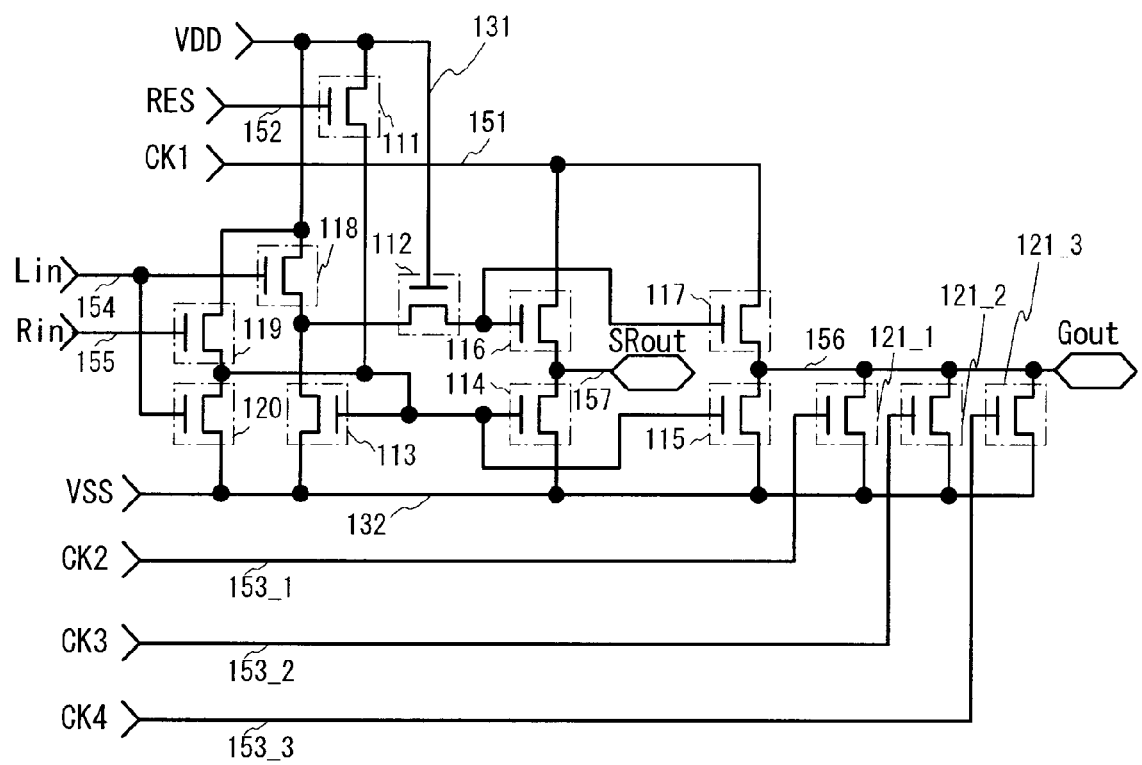
FIG. 30 is a circuit diagram of a driver circuit.

Note that in the fourth period T4, a signal used for the eleventh thin film transistor 121 to be conducting (in this case, the second clock signal CK2) is supplied, so that a potential of the sixth signal line 156 which outputs Gout falls rapidly. Therefore, a driver circuit with fewer malfunction can be obtained. Further, since the load on the third thin film transistor 113, the fourth thin film transistor 114, and the fifth thin film transistor 115 can be reduced, it is possible to reduce deterioration in the thin film transistors. Note that as shown in FIG. 30, the eleventh thin film transistor 121 is formed using a plurality of eleventh thin film transistors 121_1 to 121_3, and clock signals different from clock signals supplied to the first signal line 151 (in this case, the second clock signal CK2, the third clock signal CK3, and the fourth clock signal CK4) are supplied from third signal lines 153_1 to 153_3 to the eleventh thin film transistors 121_1 to 121_3. Further, the eleventh thin film transistors 121_1 to 121_3 are controlled to be conducting or not to be conducting and the load on the third thin film transistor 113, the fourth thin film transistor 114, and the fifth thin film transistor 115 is reduced. Therefore, it is possible to reduce deterioration in the thin film transistors.

Figure 11A:
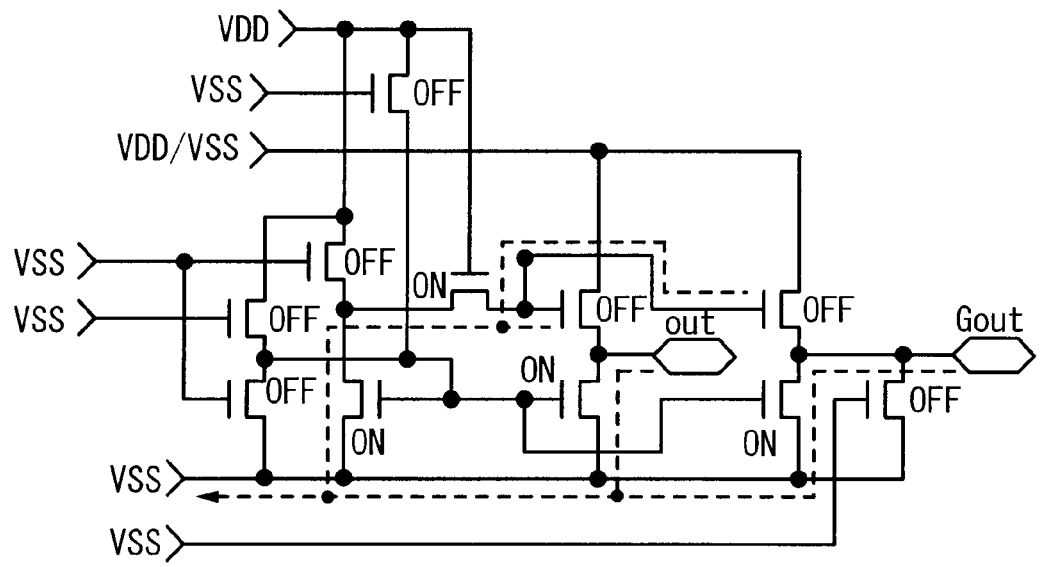
FIGS. 11A and 11B are schematic diagrams showing operation of a driver circuit.
Figure 11B:
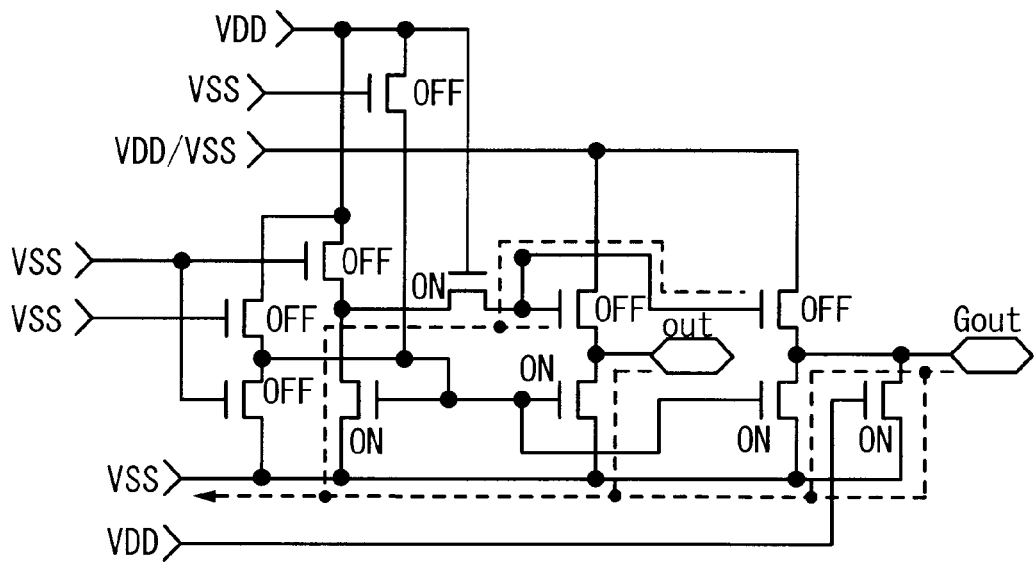

Then, the fifth period T5 is described as a period T5-1 and a period T5-2, in which the H-level signals or the L-level signals of the first clock signal CK 1 and the third clock signal CK3 are input in combination. First, the period T5-1 is described. In the period T5-1, the first clock signal CK1 is an H-level signal or an L-level signal, and the third clock signal CK3, the reset signal RES, the previous stage signal Lin, and the next stage signal Rin are L-level signals. The first thin film transistor 111, the eighth thin film transistor 118, the ninth thin film transistor 119, and the tenth thin film transistor 120 are non-conducting, and the third thin film transistor 113, the fourth thin film transistor 114, and the fifth thin film transistor 115 enter into a floating state while maintaining the same gate potentials as in the fourth period. That is, the third thin film transistor 113, the fourth thin film transistor 114, and the fifth thin film transistor 115 are kept in a conduction state. Further, the second thin film transistor 112 is conducting as in the fourth period T4, and the gate potential of each of the sixth thin film transistor 116 and the seventh thin film transistor 117 is set at VSS; thus, the sixth thin film transistor 116 and the seventh thin film transistor 117 is non-conducting. Furthermore, the eleventh thin film transistor 121 is non-conducting. Therefore, a current flows as shown by a dotted arrow in FIG. 11A, and the potential of each wiring in the period T5-1 is determined as shown in FIG. 11A. Next, in the period T5-2, the first clock signal CK1 is an H-level signal or an L-level signal, the third clock signal CK3 is an H-level signal, and the reset signal RES, the previous stage signal Lin, and the next stage signal Rin are L-level signals. As in the period T5-1, the first thin film transistor 111, the eighth thin film transistor 118, the ninth thin film transistor 119, and the tenth thin film transistor 120 are non-conducting; thus, the third thin film transistor 113, the fourth thin film transistor 114, and the fifth thin film transistor 115 enter into a floating state while maintaining the same gate potentials as in the fourth period. That is, the third thin film transistor 113, the fourth thin film transistor 114, and the fifth thin film transistor 115 are kept in a conduction state. Further, the second thin film transistor 112 is conducting as in the fourth period T4, and gate potential of each of the sixth thin film transistor 116 and the seventh thin film transistor 117 is set at VSS; thus, the sixth thin film transistor 116 and the seventh thin film transistor 117 is non-conducting. Furthermore, the eleventh thin film transistor 121 is conducting. Therefore, a current flows as shown by a dotted arrow in FIG. 11B, and the potential of each wiring in the period T5-2 is determined as shown in FIG. 8B. That is, in the fifth period T5, L-level signals are output as the first output signal Gout1 and the second output signal SRout1.

Note that a structure can be used where the capacitor 2901 is added, in a manner similar to that of the structure shown in Embodiment 1 with reference to FIG. 29.

Note that as described in Structure 1 and Structure 2 in Embodiment 1, by the use of a thin film transistor in which a microcrystalline semiconductor is used for a channel region as the thin film transistor included in the pulse output circuit described in this embodiment, degradation in characteristics of the thin film transistor can be suppressed, and deterioration in the display quality can be restrained. Further, in the case where a microcrystalline semiconductor is used for a semiconductor layer of the thin film transistor, productivity can be improved. Thus, an increase in the size of the display device, a reduction in cost, an improvement in yield, or the like can be achieved Note that the contents described in each drawing in this embodiment can be freely combined with or replaced with the contents described in any of the other embodiments as appropriate.

Embodiment 3

In this embodiment, examples of a display element, a display device which is a device having a display element, a light-emitting element, and a light-emitting device which is a device having a light-emitting element are described. Note that a display element, a display device which is a device having a display element, a light-emitting element, and a light-emitting device which is a device having a light-emitting element can employ a variety of types and can include a variety of elements. For example, a display medium whose contrast, luminance, reflectivity, transmittance, or the like is changed by electromagnetic action, such as an EL (electroluminescent) element (e.g., an EL element including organic and inorganic materials, an organic EL element, or an inorganic EL element), an LED (e.g., a white LED, a red LED, a green LED, or a blue LED), a transistor which emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube can be used as a display element, a display device, a light-emitting element, and a light-emitting device. Note that display devices having EL elements include an EL display; display devices having electron emitters include a field emission display (FED), an SED-type flat panel display (SED: surface-conduction electron-emitter display), and the like; display devices having liquid crystal elements include a liquid crystal display (e.g., a transmissive liquid crystal display, a transflective liquid crystal display, a reflective liquid crystal display, a direct-view liquid crystal display, or a projection liquid crystal display); and display devices having electronic ink include electronic paper.

First, an example of a system block of a liquid crystal display device is described with reference to FIG. 12A. The liquid crystal display device includes a circuit 5361, a source driver 5362, a gate driver 5363_1, a gate driver 5363_2, a pixel portion 5364, a circuit 5365, and a lighting device 5366. A plurality of wirings 5371 which are extended from the source driver 5362 and a plurality of wirings 5372 which are extended from the gate drivers 5363_1 and 5363_2 are provided in the pixel portion 5364. Moreover, pixels 5367 which include display elements such as liquid crystal elements are provided in a matrix in respective regions where the plurality of wirings 5371 and the plurality of wirings 5372 is provided in matrix.

The circuit 5361 has a function of supplying a signal, voltage, current, or the like to the source driver 5362, the gate driver 5363_1, the gate driver 5363_2, and the circuit 5365 in response to a video signal 5360 and functions as a controller, a control circuit, a timing generator, a power supply circuit, a regulator, or the like. In this embodiment, for example, the circuit 5361 supplies a signal line driver circuit start signal (SSP), a signal line driver circuit clock signal (SCK), a signal line driver circuit inverted clock signal (SCKB), video signal data (DATA), or a latch signal (LAT) to the source driver 5362. Alternatively, as an example, the circuit 5361 supplies a scan line driver circuit start signal (GSP), a scan line driver circuit clock signal (GCK), or a scan line driver circuit inverted clock signal (GCKB) to the gate driver 5363_1 and the gate driver 5363_2. Further alternatively, the circuit 5361 supplies a backlight control signal (BLC) to the circuit 5365. Note that this embodiment is not limited thereto, and the circuit 5361 can supply various other signals, voltages, currents, or the like to the source driver 5362, the gate driver 5363_1, the gate driver 5363_2, and the circuit 5365.

The source driver 5362 has a function of outputting video signals to the plurality of wirings 5371 in response to a signal supplied from the circuit 5361 (e.g., SSP, SCK, SCKB, DATA, or LAT), and functions as a signal line driver circuit. The gate driver 5363_1 and the gate driver 5363_2 each have a function of outputting scan signals to the plurality of wirings 5372 in response to a signal supplied from the circuit 5361 (e.g., GSP, GCK, or GCKB), and functions as a scan line driver circuit. The circuit 5365 has a function of controlling the luminance (or the average luminance) of the lighting device 5366 by controlling the amount of electric power supplied to the lighting device 5366, time to supply the electric power to the lighting device 5366, or the like in accordance with the signal (BLC) supplied from the circuit 5361. The circuit 5365 can function as a power supply circuit.

Note that when video signals are input to the plurality of wirings 5371, the plurality of wirings 5371 can function as signal lines, video signal lines, source lines, or the like. When scan signals are input to the plurality of wirings 5372, the plurality of wirings 5372 functions as signal lines, scan lines, gate lines, or the like.

Note that when the same signal is input to the gate driver 5363_1 and the gate driver 5363_2 from the circuit 5361, scan signals output from the gate driver 5363_1 to the plurality of wirings 5372 and scan signals output from the gate driver 5363_2 to the plurality of wirings 5372 have approximately the same timings in many cases. Accordingly, load caused by driving of the gate drivers 5363_1 and 5363_2 can be reduced. Thus, the display device can be made larger. Alternatively, the display device can have higher definition. Alternatively, since the channel width of thin film transistors included in the gate drivers 5363_1 and 5363_2 can be reduced, a display device with a narrower frame can be obtained. Note that this embodiment is not limited thereto, and the circuit 5361 can supply different signals to the gate driver 5363_1 and the gate driver 5363_2.

Note that one of the gate driver 5363_1 and the gate driver 5363_2 can be eliminated.

Note that a wiring such as a capacitor line, a power supply line, or a scan line can be additionally provided in the pixel portion 5364. Then, the circuit 5361 can output a signal, a voltage, or the like to such a wiring. Further, a circuit similar to the gate driver 5363_1 or the gate driver 5363_2 can be additionally provided. The additionally provided circuit can output a signal such as a scan signal to the additionally provided wiring.

Note that the pixel 5367 can include a light-emitting element such as an EL element as a display element. In that case, as illustrated in FIG. 12B, since the display element can emit light, the circuit 5365 and the lighting device 5366 can be eliminated. Moreover, in order to supply electric power to the display element, a plurality of wirings 5373 which can function as power supply lines can be provided in the pixel portion 5364. The circuit 5361 can apply a power supply voltage called voltage (ANO) to the wirings 5373. The wirings 5373 can be separately connected to the pixels in accordance with color elements or can be connected to all the pixels.

Note that FIG. 12B shows an example in which the circuit 5361 supplies different signals to the gate driver 5363_1 and the gate driver 53632. The circuit 5361 supplies a signal such as a scan line driver circuit start signal (GSP1), a scan line driver circuit clock signal (GCK1), or a scan line driver circuit inverted clock signal (GCKB1) to the gate driver 5363_1. In addition, the circuit 5361 supplies a signal such as a scan line driver circuit start signal (GSP2), a scan line driver circuit clock signal (GCK2), or a scan line driver circuit inverted clock signal (GCKB2) to the gate driver 5363_2. In that case, the gate driver 5363_1 can scan only wirings in odd-numbered rows of the plurality of wirings 5372 and the gate driver 5363_2 can scan only wirings in even-numbered rows of the plurality of wirings 5372. Accordingly, the driving frequency of the gate driver 5363_1 and the gate driver 5363_2 can be lowered, whereby power consumption can be reduced. Alternatively, the area in which a flip-flop of one stage can be laid out can be made larger. Thus, a display device can have higher definition. Alternatively, the size of a display device can be increased. Note that this embodiment is not limited thereto, and the circuit 5361 can output the same signal to the gate driver 5363_1 and the gate driver 5363_2 as in FIG. 12A.

Figure 12A:
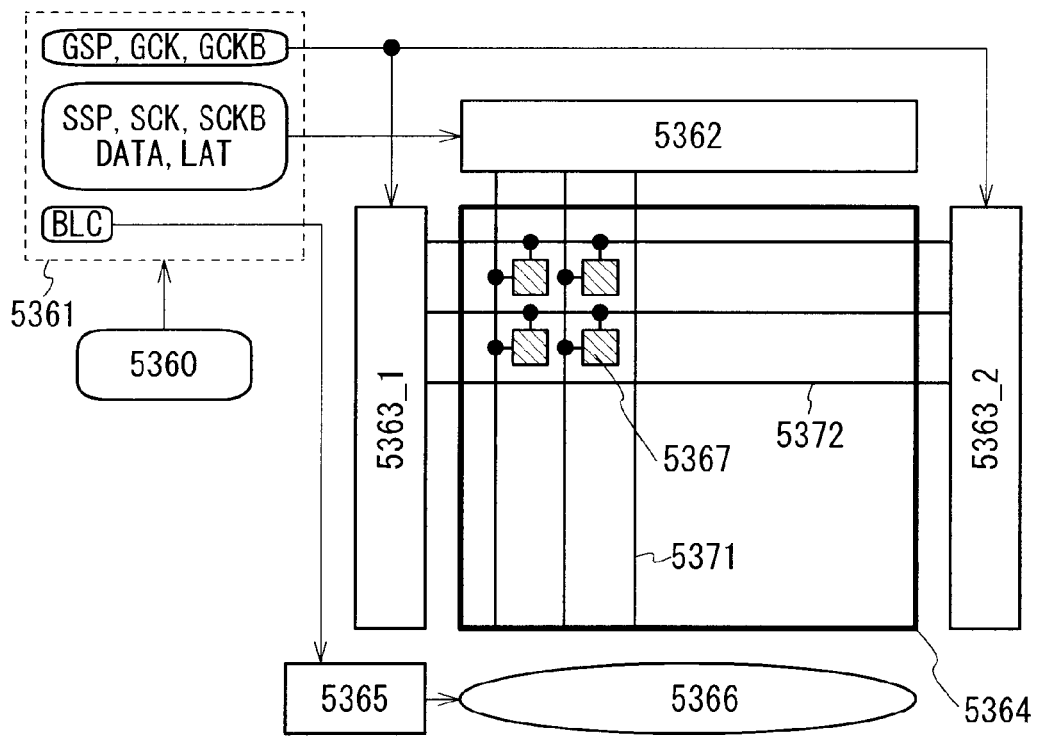
FIGS. 12A and 12B are block diagrams of a display device.
Figure 12B:
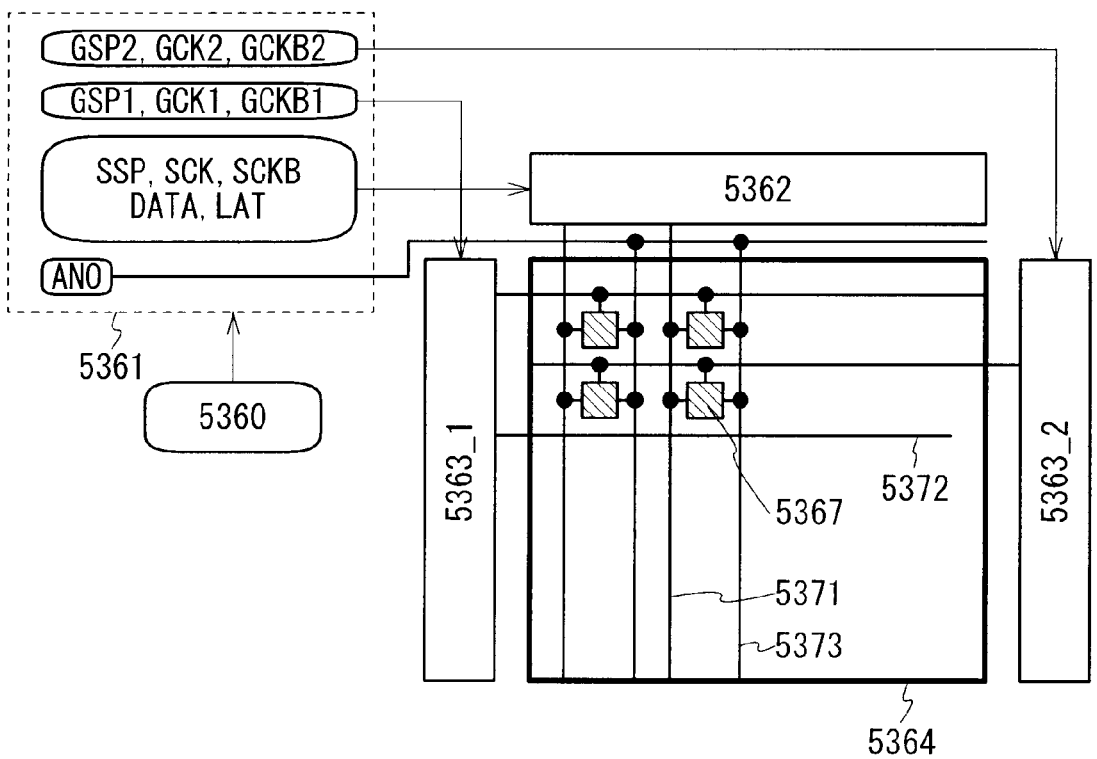

Note that as in FIG. 12B, the circuit 5361 can supply different signals to the gate driver 5363_1 and the gate driver 5363_2 in FIG. 12A.

The above is the description of one example of the system block of the display device.

Next, examples of structures of the display device will be described with reference to FIGS. 13A to 13D.

Figure 13A:
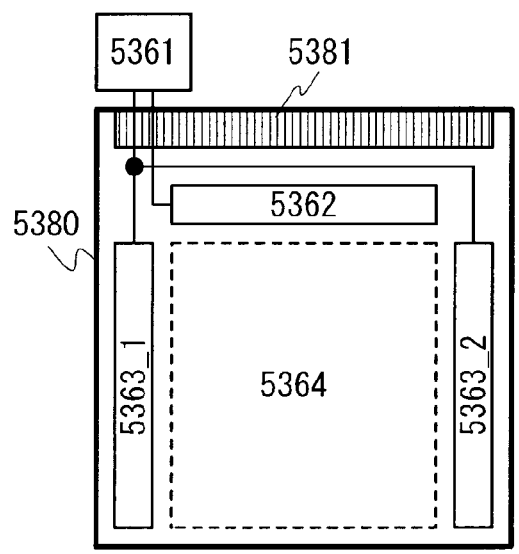
FIGS. 13A to 13D are block diagrams of a display device.

In FIG. 13A, circuits which have a function of outputting signals to the pixel portion 5364 (e.g., the source driver 5362, the gate driver 5363_1, and the gate driver 5363_2) are formed over a substrate 5380 where the pixel portion 5364 is also formed. In addition, the circuit 5361 is formed over a substrate which is different from the substrate where the pixel portion 5364 is formed. In this manner, since the number of external components is reduced, a reduction in cost can be achieved. Alternatively, since the number of signals or voltages input to the substrate 5380 is reduced, the number of connections between the substrate 5380 and the external component can be reduced. Accordingly, an improvement in reliability or an increase in yield can be achieved.

Note that in the case where the circuit is formed over a substrate which is different from the substrate where the pixel portion 5364 is formed, the substrate can be mounted on a flexible printed circuit (FPC) by tape automated bonding (TAB). Alternatively, the substrate can be mounted on the same substrate 5380 as the pixel portion 5364 by chip on glass (COG).

In the case where the circuit is formed over a different substrate from the pixel portion 5364, a transistor formed using a single crystal semiconductor can be formed on the substrate. Therefore, the circuit formed over the substrate can have advantages such as an improvement in driving frequency, an improvement in driving voltage, or a reduction in variation in output signals.

Note that a signal, voltage, current, or the like is input from an external circuit through an input terminal 5381 in many cases.

Figure 13B:
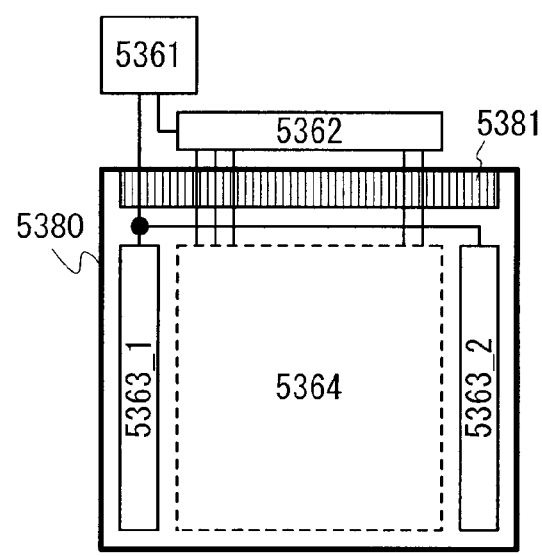

In FIG. 13B, circuits with low driving frequency (e.g., the gate driver 5363_1 and the gate driver 5363_2) are formed over the substrate 5380 where the pixel portion 5364 is formed. In addition, the circuit 5361 and the source driver 5362 are formed over a substrate which is different from the substrate where the pixel portion 5364 is formed. In this manner, the circuit formed over the substrate 5380 can be constituted by thin film transistors with lower field-effect mobility as compared to that of a transistor formed using a single crystal semiconductor (also referred to as a MOS transistor). Thus, a microcrystalline semiconductor can be used for a channel region of the thin film transistor. Accordingly, an increase in the size of the display device, a reduction in the number of steps, a reduction in cost, an improvement in yield, or the like can be achieved.

Figure 13C:
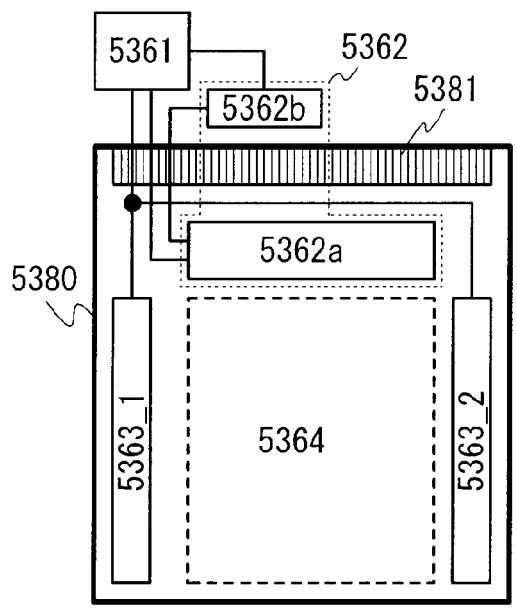

Note that as illustrated in FIG. 13C, part of the source driver 5362 (a source driver 5362a) can be formed over the substrate 5380 where the pixel portion 5364 is formed, and the other part of the source driver 5362 (a source driver 5362b) can be formed over a substrate which is different from the substrate where the pixel portion 5364 is formed. The source driver 5362a often includes a circuit which can be formed using a thin film transistor with low field-effect mobility (e.g., a shift register, a selector, or a switch). The source driver 5362b often includes a circuit which is preferably formed using a MOS transistor with high field-effect mobility and few variations in characteristics (e.g., a shift register, a latch circuit, a buffer circuit, a DA converter circuit, or an AD converter circuit). Accordingly, as in FIG. 13B, a microcrystalline semiconductor can be used for a channel region of the thin film transistor. Further, the number of external components can be reduced.

Figure 13D:
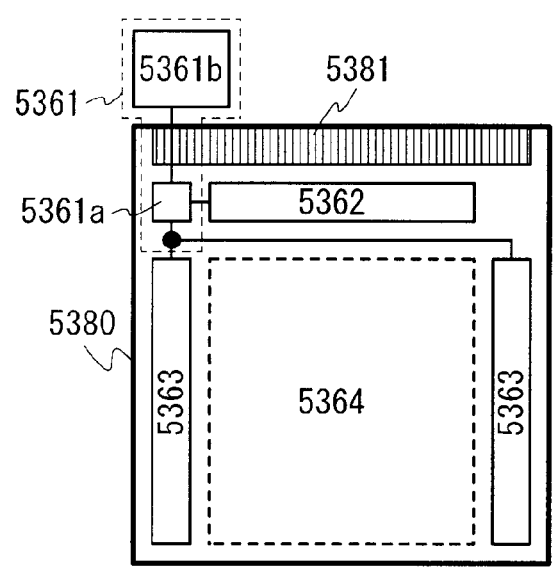

In FIG. 13D, part of the circuit 5361 (a circuit 5361a) is formed over the substrate 5380 over which the pixel portion 5364 is formed, and the other part of the circuit 5361 (a circuit 5361b) is formed over a substrate which is different from the substrate where the pixel portion 5364 is formed. The circuit 5361a often includes a circuit which can be formed using a thin film transistor with lower field-effect mobility as compared to that of a MOS transistor (e.g., a switch, a selector, or a level shift circuit). Moreover, the circuit 5361b often includes a circuit which is preferably formed using a MOS transistor with high field-effect mobility and few variations (e.g., a shift register, a timing generator, an oscillator, a regulator, or an analog buffer).

Note that also in FIGS. 13A to 13C, the circuit 5361a can be formed over the same substrate as the pixel portion 5364, and the circuit 5361b can be formed over a substrate which is different from the substrate where the pixel portion 5364 is formed.

Here, for the gate drivers 5363_1 and 5363_2, any of the shift registers in Embodiment 1 or 2 can be used. In that case, the gate drivers 5363_1 and 5363_2 and the pixel portion are formed over the same substrate, whereby all the thin film transistors formed over the substrate can have the same polarity. Accordingly, a reduction in the number of steps, an improvement in yield, an improvement in reliability, or a reduction in cost can be realized. In particular, when all the thin film transistors are n-channel transistors, microcrystalline semiconductors can be used for semiconductor layers of the thin film transistors. Thus, an increase in the size of the display device, a reduction in cost, an increase in yield, or the like can be realized. In addition, since the microcrystalline semiconductor is used for the semiconductor layer, deterioration in characteristics of the thin film transistor can be suppressed, whereby the life of the display device can be made longer.

Note that the contents described in each drawing in this embodiment can be freely combined with or replaced with the contents described in any of the other embodiments as appropriate.

Embodiment 4

In this embodiment, an example of a source driver is described.

An example of a source driver is described with reference to FIG. 14A. The source driver includes a plurality of circuits 602_1 to 602_N (N is a natural number), a circuit 600, and a circuit 601. The circuits 602_1 to 602_N each include a plurality of thin film transistors 603_1 to 603_$k$ ($k$ is a natural number). The thin film transistors 603_1 to 603_$k$ have the same conductivity type as the thin film transistors included in the pulse output circuit in the shift register described in the embodiment above.

The relation of connection in the source driver is described taking the circuit 602_1 as an example. Each first terminal of the thin film transistors 603_1 to 603_$k$ is connected to a wiring 605_1. Second terminals of the thin film transistors 603_1 to 603_$k$ are connected to wirings S1 to S$k$, respectively. Gates of the thin film transistors 603_1 to 603_$k$ are respectively connected to wirings 604_1 to 604_$k$. For example, the first terminal of the thin film transistor 603_1 is connected to the wiring 605_1; a second terminal of the thin film transistor 603_1 is connected to the wiring S1; and the gate of the thin film transistor 603_1 is connected to the wiring 604_1.

The circuit 600 has a function of supplying signals to the circuits 602_1 to 602_N through the wirings 604_1 to 604_$k$ and can function as a shift register, a decoder, or the like. The signals are digital signals in many cases and can function as a selection signals. The wirings 604_1 to 604_$k$ can function as signal lines.

The circuit 601 has a function of outputting signals to the circuits 602_1 to 602_N and can function as video signal generation circuits or the like. For example, the circuit 601 supplies the signal to the circuit 602_1 through the wiring 605_1 and simultaneously supplies the signal to the circuit 602_2 through the wiring 605_2. The signals are digital signals in many cases and can function as a selection signals. The wirings 605_1 to 605_$k$ can function as signal lines.

The circuits 602_1 to 602_N each have a function of selecting a wiring to which an output signal of the circuit 601 is output and can thus function as selector circuits. For example, the circuit 602_1 has a function of selecting from among the wirings S1 to S$k$ which wiring to output a signal which is intended to be output from the circuit 601 to the wiring 605_1.

The transistors 603_1 to 603_N have a function of controlling a conduction state between the wiring 605_1 and each of the wirings S1 to S$k$ in accordance with an output signal from the circuit 600 and function as switches.

Figure 14A:
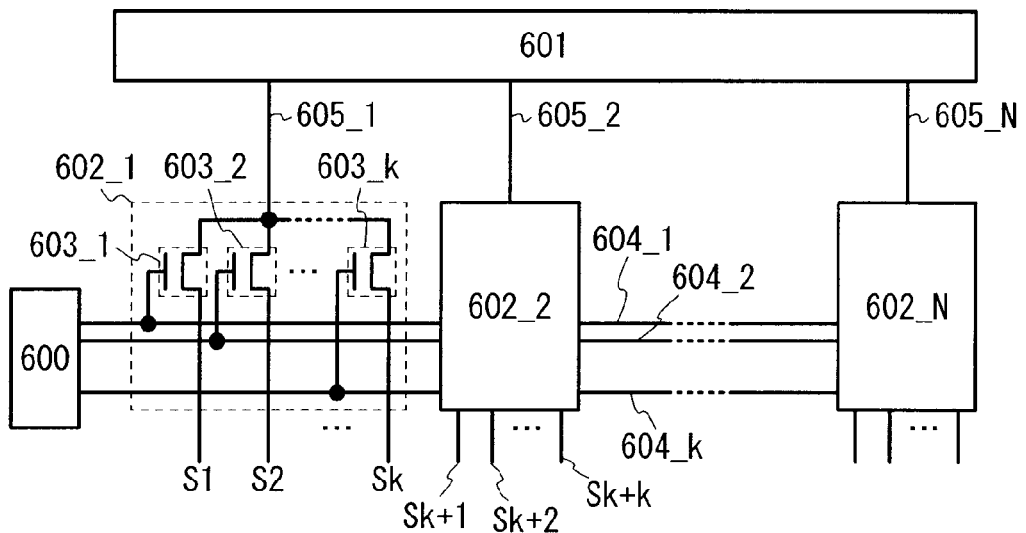
FIGS. 14A and 14B are a circuit diagram of a driver circuit and a timing chart for an explanation of an operation of the driver circuit.
Figure 14B:
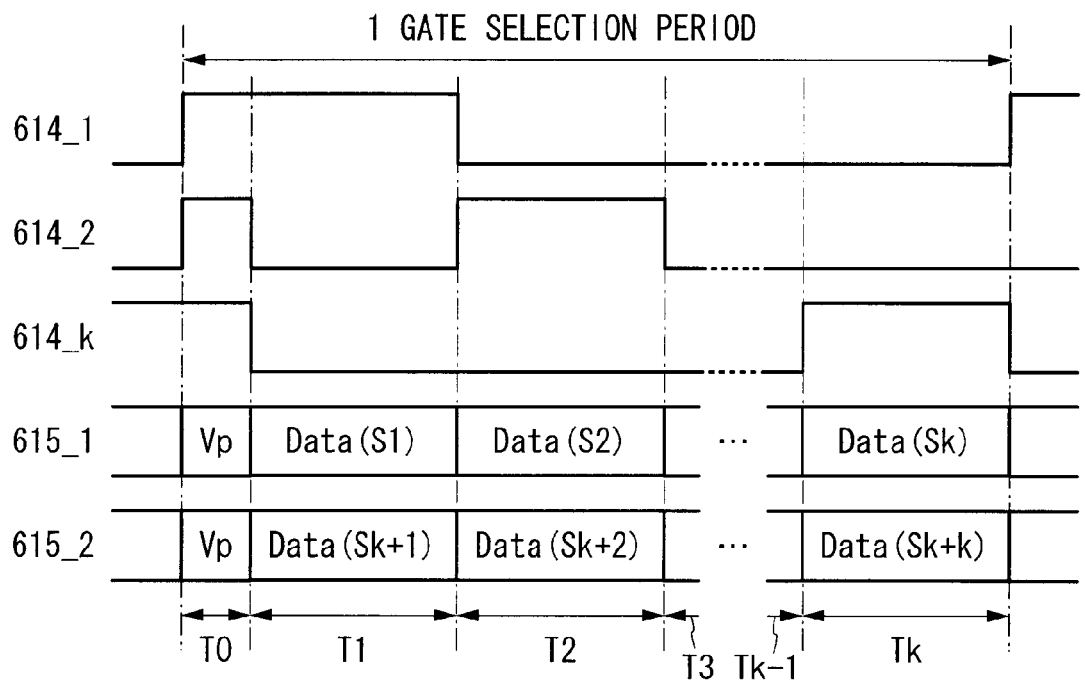

Next, operation of the source driver shown in FIG. 14A is described with reference to a timing chart in FIG. 14B. FIG. 14B shows examples of a signal 614_1 input to the wiring 604_1, a signal 614_2 input to the wiring 604_2, a signal 614_$k$ input to the wiring 604_$k$, a signal 615_1 input to the wiring 605_1, and a signal 615_2 input to the wiring 605_2.

Note that one operation period of the source driver corresponds to one gate selection period in a display device. One gate selection period is a period during which a pixel in a row is selected and a video signal can be written to the pixel.

Note that one gate selection period is divided into a period T0 and a period T1 to a period Tk. The period T0 is a period during which a precharge voltage is simultaneously applied to pixels in a selected row, and can be a precharge period. Each of the periods T1 to Tk is a period during which video signals are written to pixels in a selected row, and can be a write period.

Note that for simplicity, operation of the source driver is described taking operation of the circuit 602_1 as an example.

First, in the period T0, the circuit 600 outputs H-level signals to the wirings 604_1 to 604_$k$. Accordingly, the thin film transistors 603_1 to 603_$k$ each have electrical continuity between the source and the drain, whereby the wiring 605_1 and the wirings S1 to Sk are conducting. At the time, the circuit 601 applies a precharge voltage Vp to the wiring 605_1, so that the precharge voltage Vp is output to the wirings S1 to Sk through the thin film transistors 603_1 to 603_$k$, respectively. Then, the precharge voltage Vp is written to the pixels in a selected row, so that the pixels in the selected row are precharged.

Next, in the period T1, the circuit 600 outputs an H-level signal to the wiring 604_1. Accordingly, the thin film transistor 603_1 has electrical continuity between the source and the drain, whereby the wiring 605_1 and the wiring S1 are conducting. Moreover, the wiring 605_1 and the wirings S2 to Sk are non-conducting. At the time, if the circuit 601 outputs a signal Data (S1) to the wiring 605_1, the signal Data (S1) is output to the wiring S1 through the thin film transistors 603_1. In this manner, the signal Data (S1) is written to, among pixels connected to the wiring S1, pixels in the selected row.

Next, in the period T2, the circuit 600 outputs an H-level signal to the wiring 604_2. Accordingly, the thin film transistor 603_2 has electrical continuity between the source and the drain, whereby the wiring 605_2 and the wiring S2 are conducting. Moreover, the wiring 605_1 and the wirings S1 are non-conducting, and the wiring 605_1 and the wirings S3 to Sk remain in a non-conduction state. At the time, if the circuit 601 outputs a signal Data (S2) to the wiring 605_1, the signal Data (S2) is output to the wiring S2 through the thin film transistor 603_2. In this manner, the signal Data (S2) is written to, among the pixels connected to the wiring S2, the pixels in the selected row.

After that, the circuit 600 sequentially outputs H level signals to the wirings 604_1 to 604_$k$ until the end of the period Tk, so that the circuit 600 sequentially outputs the H level signals to the wirings 604_3 to 604_$k$ from the period T3 to the period Tk, as in the period T1 and the period T2. Therefore, the transistors 603_3 to 603_$k$ sequentially have electrical continuity between the source and the drain; thus, the thin film transistors 603_1 to 603_$k$ sequentially have electrical continuity between the source and the drain. Accordingly, signals output from the circuit 601 are sequentially output to the wirings S1 to Sk. In this manner, the signals can be sequentially written to the pixels in the selected row.

The above is the description of an example of the source driver. Since the source driver in this embodiment includes the circuit functioning as a selector, the number of signals or the number of wirings can be reduced. Further, since a precharge voltage is written to a pixel before a video signal is written to the pixel (in the period T0), a write time of the video signal can be shortened. Accordingly, an increase in the size of a display device and higher resolution of the display device can be achieved. However, this embodiment is not limited to this, and the period T0 may be eliminated so that the pixel is not precharged.

Note that if k is too large, a write time for the pixel is shortened, whereby writing of a video signal to the pixel is not completed in the write time in some cases. Accordingly, k≤6 is preferable; k≤3 is more preferable, and k=2 is much more preferable.

In specific, in the case where a color element of a pixel is divided into n (n is a natural number), it is possible to set k=n. For example, in the case where a color element of a pixel is divided into red (R), green (G), and blue (B), it is possible to set k=3. In that case, one gate selection period is divided into a period T0, a period T1, a period T2, and a period T3. A video signal can be written to the pixel of red (R), the pixel of green (G), and the pixel of blue (B) in the period T1, the period T2, and the period T3, respectively. However, this embodiment is not limited thereto, and the order of the period T1, the period T2, and the period T3 can be set as appropriate.

In specific, in the case where a pixel is divided into n sub-pixels (also referred to as subpixels) (n is a natural number), it is possible to set k=n. For example, in the case where the pixel is divided into two sub-pixels, it is possible to set k=2. In that case, one gate selection period is divided into the period T0, the period T1, and the period T2. A video signal can be written to one of the two sub-pixels in the period T1, and a video signal can be written to the other of the two sub-pixels in the period T2.

Note that since the driving frequency of the circuit 600 and the circuits 602_1 to 602_N is low in many cases, the circuit 600 and the circuits 602_1 to 602_N can be formed over the same substrate as a pixel portion. Accordingly, the number of connections between the substrate over which the pixel portion is formed and an external circuit can be reduced; thus, an increase in yield, an improvement in reliability, or the like can be achieved.

Note that the shift register described in Embodiment 1 or Embodiment 2 can be used as the circuit 600. In that case, if all the thin film transistors included in the circuit 600 are n-channel transistors, a microcrystalline semiconductor can be used for a semiconductor layer of the thin film transistor. Accordingly, an increase in the size of a display device, a reduction in cost, an improvement in yield, or the like can be achieved. Further, by the use of a microcrystalline semiconductor for a semiconductor layer, degradation of characteristics of the thin film transistor can be suppressed, so that the life of a display device can be extended.

Note that not only the thin film transistors included in the circuit 600 but also all the thin film transistors included in the circuits 602_1 to 602_N can be the same conductivity type. Accordingly, when the circuit 600 and the circuits 602_1 to 602_N are formed over the same substrate as the pixel portion, a reduction in the number of steps, an increase in yield, or a reduction in cost can be achieved. Further, by the use of a microcrystalline semiconductor for a semiconductor layer, degradation of characteristics of the thin film transistor can be suppressed, so that the life of the display device can be extended.

Note that the contents described in each drawing in this embodiment can be freely combined with or replaced with the contents described in any of the other embodiments as appropriate.

Embodiment 5

In this embodiment, structures and operation of pixels which can be used in a liquid crystal display device are described.

Figure 15A:
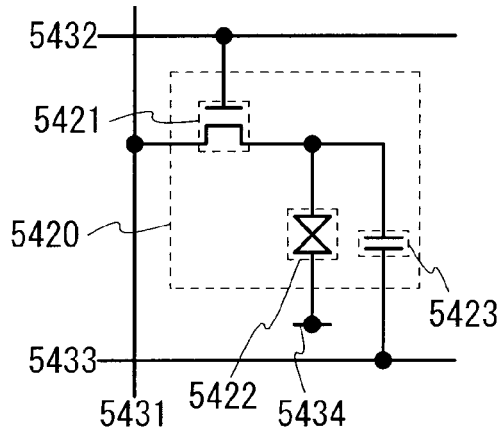
FIGS. 15A to 15C are a circuit diagrams of a pixel and timing charts for an explanation of an operation of the pixel.

FIG. 15A illustrates an example of a pixel. A pixel 5420 includes a thin film transistor 5321, a liquid crystal element 5422, and a capacitor 5423. A first terminal of the thin film transistor 5321 is connected to a wiring 5431. A second terminal of the thin film transistor 5321 is connected to one electrode of the liquid crystal element 5422 and one electrode of the capacitor 5423. A gate of the thin film transistor 5421 is connected to a wiring 5432. The other electrode of the liquid crystal element 5422 is connected to an electrode 5434. The other electrode of the capacitor 5423 is connected to a wiring 5433.

Note that a liquid crystal element is an element which controls transmission or non-transmission of light by optical modulation action of liquid crystals and includes a pair of electrodes and liquid crystals. Note that the optical modulation action of liquid crystals is controlled by an electric field applied to the liquid crystals (including a horizontal electric field, a vertical electric field, and a diagonal electric field). Note that the following can be used for a liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a plasma addressed liquid crystal (PALC), a banana-shaped liquid crystal, and the like. In addition, the following can be used as a diving method of a liquid crystal: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, a blue phase mode, and the like.

A video signal is input to the wiring 5431, for example. A scan signal, a selection signal, or a gate signal is input to the wiring 5432, for example. A constant voltage is applied to the electrode 5433, for example. A constant voltage is applied to the wiring 5434, for example. Note that this embodiment is not limited to this. A write time of a video signal can be shortened by supply of precharge voltage to the wiring 5431. Alternatively, voltage applied to the liquid crystal element 5422 can be controlled by input of a signal to the wiring 5433. Alternatively, frame inversion driving can be realized by input of a signal to the electrode 5434.

Note that the wiring 5431 functions as a signal line, a video signal line, or a source line. The wiring 5432 functions as a signal line, a scan line, or a gate line. The wiring 5433 functions as a power supply line or a capacitor line. The electrode 5434 functions as a common electrode or a counter electrode. The electrode 5434 functions as a common electrode or a counter electrode. However, this embodiment is not limited to this. In the case where voltage is supplied to the wiring 5431 and the wiring 5432, these wirings function as power supply lines. Alternatively, in the case where a signal is input to the wiring 5433, the wiring 5433 functions as a signal line.

The thin film transistor 5421 has a function of controlling timing when a video signal is written to a pixel by controlling the conduction state of the wiring 5431 and one electrode of the liquid crystal element 5422, and can function as a switch. The capacitor 5423 has a function of keeping voltage applied to the liquid crystal element 5422 as a stable value by storing the potential difference between one electrode of the liquid crystal element 5422 and the wiring 5433, and functions as a storage capacitor. Note that this embodiment is not limited to this.

Figure 15B:
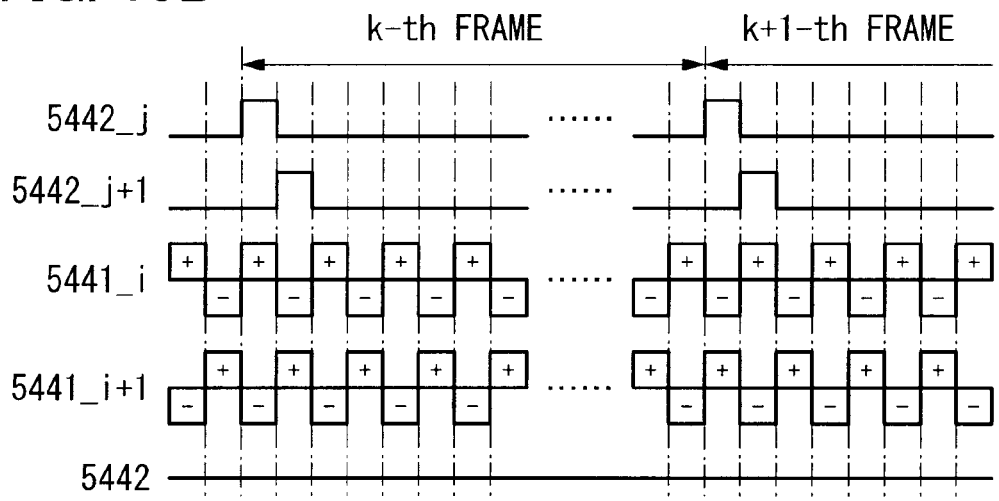

FIG. 15B shows an example of a timing chart showing operation of the pixel in FIG. 15A. FIG. 15B illustrates a signal $5442\_j$ (j is a natural number), a signal $5442\_j+1$, a signal $5441\_i$ (i is a natural number), a signal $5441\_i+1$, and a voltage 5442. In addition, FIG. 15B illustrates a k-th (k is a natural number) frame and a (k+1)th frame. Note that the signal $5442\_j$, the signal $5442\_j+1$, the signal $5441\_i$, the signal $5441\_i+1$, and the voltage 5442 are examples of a signal input to the wiring 5432 in a j-th row, a signal input to the wiring 5432 in a (j+1)th row, a signal input to the wiring 5431 in an i-th column, a signal input to the wiring 5431 in an (i+1)th column, and a voltage supplied to the wiring 5432, respectively.

Operation of the pixel 5420 in the j-th row and the i-th column is described. When the signal $5442\_j$ is set at an H level, the thin film transistor 5421 has electrical continuity between the source and the drain. Accordingly, the wiring 5431 in the i-th column and one electrode of the liquid crystal element 5422 are conducting, so that the signal $3041\_j$ is input to the one electrode of the liquid crystal element 5422 through the thin film transistor 5421. Then, the capacitor 5423 keeps the potential difference between one electrode of the liquid crystal element 5422 and the wiring 5433. Thus, after that, a voltage applied to the liquid crystal element 5422 is constant until the signal $5422\_j$ is set at the H level again. Then, the liquid crystal element 5422 expresses gray levels corresponding to the applied voltage.

Note that FIG. 15B shows an example of the case where a positive signal and a negative signal are alternately input to the wiring 5431 every selection period. A positive signal is a signal whose potential is higher than a reference value (e.g., a potential of the electrode 5434). A negative signal is a signal whose potential is lower than a reference value (e.g., a potential of the electrode 5434). However, this embodiment is not limited to this, and signals with the same polarity can be input to the wiring 5431 in one frame period.

Note that FIG. 15B shows an example of the case where the polarity of the signal $5441\_i$ and the polarity of the signal $5441\_i+1$ are different from each other. However, this embodiment is not limited to this. The polarity of the signal $5441\_i$ and the polarity of the signal $5441\_i+1$ can be the same.

Figure 15C:
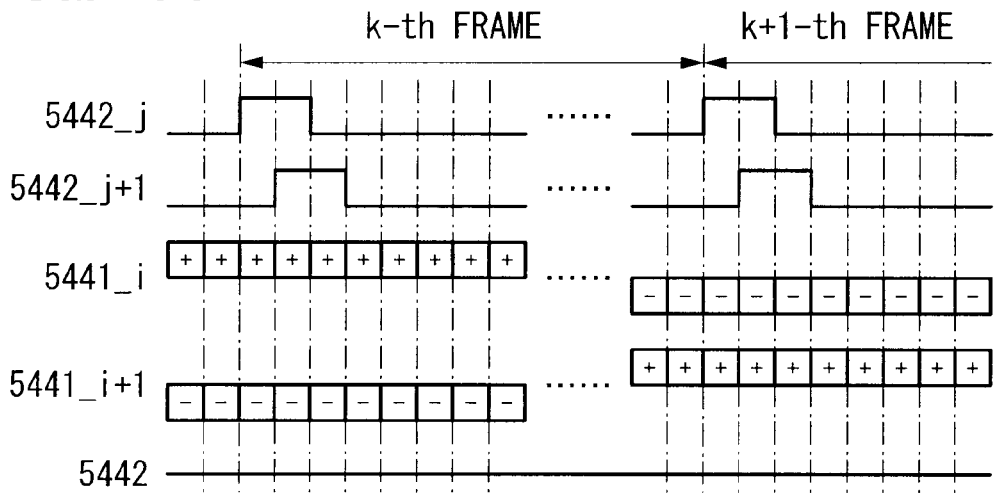

Note that FIG. 15B shows an example of the case where a period during which the signal $5442\_j$ is at the H level and a period during which the signal $5442\_j+1$ is at the H level do not overlap with each other. However, this embodiment is not limited to this. As illustrated in FIG. 15C, the period during which the signal $5442\_j$ is at the H level and the period during which the signal $5442\_j+1$ is at the H level can overlap with each other. In that case, signals of the same polarity are preferably supplied to the wiring 5431 in one frame period. In this manner, pixels in a (j+1)th row can be precharged by using the signal $5441\_j$ written to pixels in the j-th row. Accordingly, a writing time of a video signal to a pixel can be shortened. Therefore, a high-definition display device can be obtained. Alternatively, a display portion of the display device can be made large. Alternatively, since the signals of the same polarity are input to the wiring 5431 in one frame period, power consumption can be reduced.

Figure 16A:
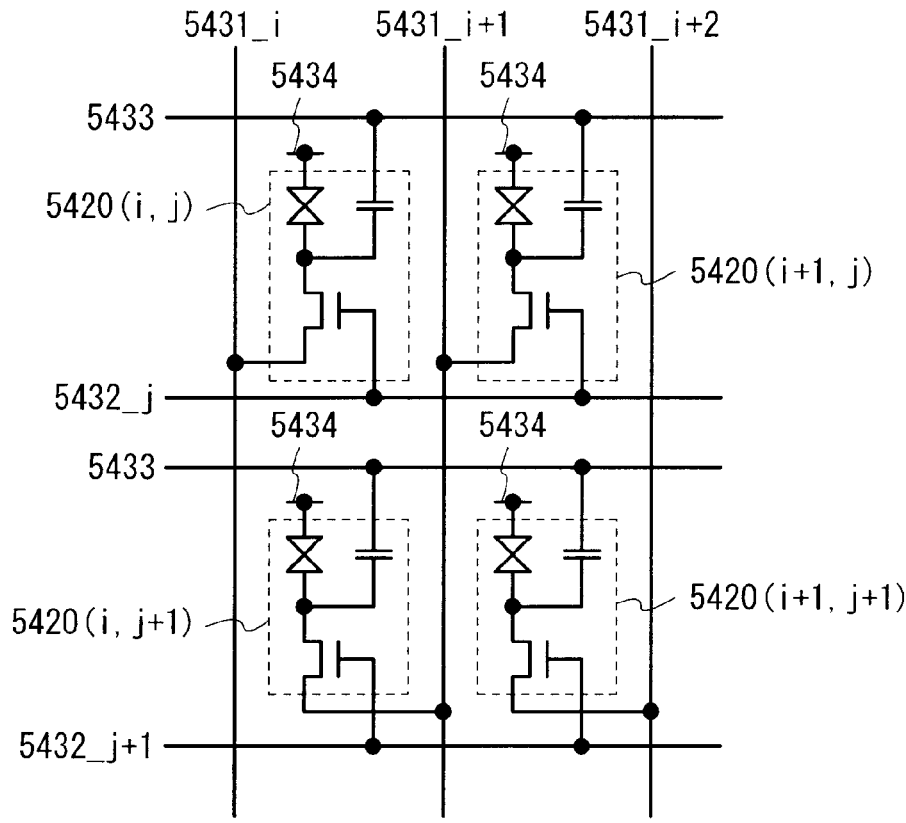
FIGS. 16A to 16C are circuit diagrams of a pixel.

Note that by a combination of a pixel structure shown in FIG. 16A and the timing chart shown in FIG. 15C, dot inversion driving can be achieved. In the pixel structure in FIG. 16A, a pixel 5420 (i,j) is connected to a wiring $5431\_i$. On the other hand, a pixel 5420(*i*,*j*+1) is connected to a wiring 5431_*i*+1. That is, pixels in the i-th column are alternately connected to the wiring 5431_*i* and the wiring 5431_*i*+1 row-by-row. In this manner, since a positive signal and a negative signal are alternately written to the pixels in the i-th column row-by-row, dot inversion driving can be achieved. However, this embodiment is not limited to this. The pixels, which are in the i-th column, of every plural rows (e.g., two rows or three rows) can be alternately connected to the wiring 5431_*i* and the wiring 5431_*i*+1.

Figure 16B:
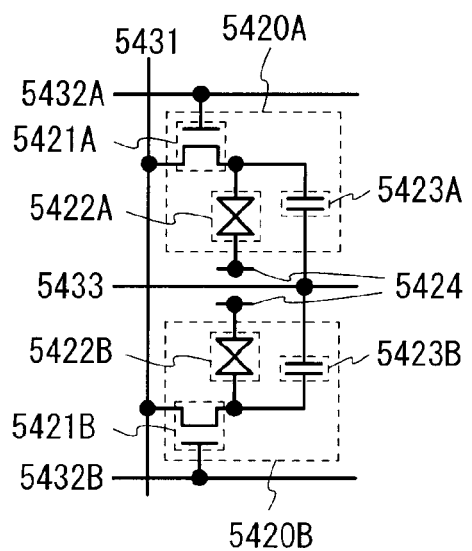
Figure 16C:
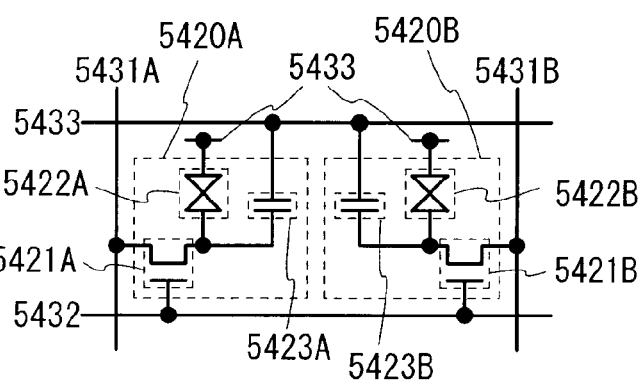

Note that a sub-pixel structure can be used as the pixel structure. FIGS. 16B and 16C each illustrate a structure of the case where a pixel is divided into two sub-pixels. FIG. 16B shows a sub-pixels structure called 1S+2G, and FIG. 16C shows a sub-pixel structure called 2S+1G. A sub-pixel 5420A and a sub-pixel 5420B correspond to the pixel 5420. A thin film transistor 5421A and a thin film transistor 5421B correspond to the thin film transistor 5421. A liquid crystal element 5422A and a liquid crystal element 5422B correspond to the liquid crystal element 5422. A capacitor 5423A and a capacitor 5423B correspond to the capacitor 5423. A wiring 5431A and a wiring 5431B correspond to the wiring 5431. A wiring 5432A and a wiring 5432B correspond to the wiring 5432.

Here, by a combination of the pixel in this embodiment and any of the structures described in Embodiments 1 to 4, a variety of advantages can be obtained. For example, in the case where a sub-pixel structure is employed for the pixel, the number of signals required for driving a display device is increased. Therefore, the number of gate lines or source lines is increased. As a result, the number of connections between a substrate over which a pixel portion is formed and an external circuit is greatly increased in some cases. However, even if the number of gate lines is increased, a scan line driver circuit and the pixel portion can be formed over the same substrate, as described in Embodiment 3. Accordingly, the pixel with the sub-pixel structure can be used without a great increase in the number of connections between the substrate over which the pixel portion is formed and the external circuit. Alternatively, even if the number of source lines is increased, the use of the source driver in Embodiment 4 can reduce the number of source lines. Accordingly, the pixel with the sub-pixel structure can be used without greatly increasing the number of connections between the substrate over which the pixel portion is formed and the external circuit.

Note that the contents described in each drawing in this embodiment can be freely combined with or replaced with the contents described in any of the other embodiments as appropriate.

Embodiment 6

In this embodiment, a method for manufacturing the thin film transistor shown in Embodiment 1 is described with reference to FIGS. 20A to 20C, FIGS. 21A to 21C, FIGS. 22A and 22B, FIGS. 23A to 23C, FIGS. 24A and 24B, and FIGS. 25A to 25C.

Here, it is preferable that all the thin film transistors formed over the same substrate have the same polarity because the number of manufacturing steps can be reduced. Therefore, in this embodiment, a method for manufacturing an n-channel thin film transistor is described.

(Method 1)

Figure 20A:
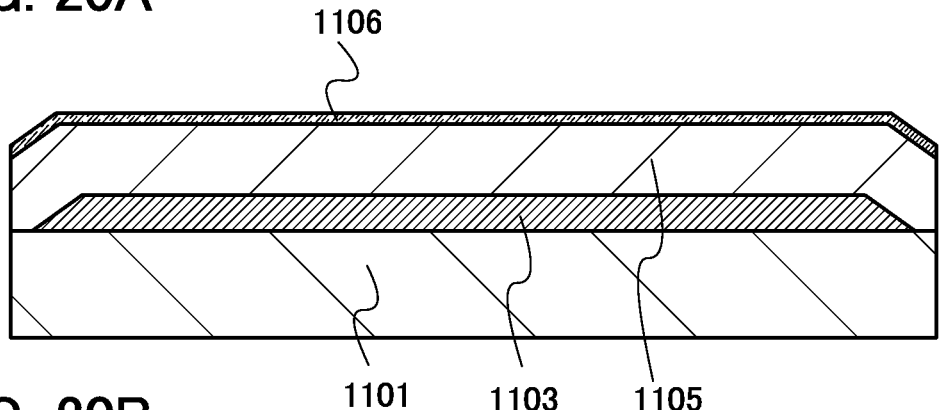
FIGS. 20A to 20C are cross-sectional views showing a manufacturing method of a driver circuit.

First, a process for manufacturing the thin film transistor shown in FIG. 17 is described with reference to FIGS. 20A to 20C. As shown in FIG. 20A, the gate electrode 1103 is formed over the substrate 1101. Next, after the formation of the gate insulating layer 1105 which covers the gate electrode 1103, a first semiconductor layer 1106 is formed.

The gate electrode 1103 can be formed in such a manner that a conductive layer is formed over the substrate 1101 with the use of the material described in Embodiment 1 by sputtering or vacuum evaporation; a mask is formed over the conductive layer by a photolithography technique, an inkjet method, or the like; and the conductive layer is etched with the use of the mask. Alternatively, the gate electrode 1103 can be formed in a manner that a conductive nanopaste of silver, gold, copper, or the like is deposited over the substrate by an inkjet method and the conductive nanopaste is baked. Here, the gate electrode 1103 is formed in a way that a conductive layer is formed over the substrate 1101 and the conductive layer is etched with a resist mask formed with the use of a photomask.

Note that, in a photolithography step, a resist may be applied to an entire surface over a substrate. Alternatively, a resist is printed by a printing method on a region in which a resist mask is intended to be formed, and then, the resist is exposed to light, whereby a resist can be saved, and cost can be reduced. Instead of exposing a resist to light by using a light-exposure machine, a laser beam direct drawing apparatus may be used to expose a resist to light.

When side surfaces of the gate electrode 1103 are tapered, disconnection of the semiconductor layer and the wiring layer formed over the gate electrode 1103 at a step portion can be prevented. In order that the side surfaces of the gate electrode 1103 be tapered, etching may be performed while the resist mask is being receded.

Through the step of forming the gate electrode 1103, a gate wiring (a scan line) and a capacitor wiring can also be formed concurrently. Note that a scan line refers to a wiring for selecting a pixel, and a capacitor wiring refers to a wiring which is connected to one of electrodes of a capacitor in a pixel. However, this embodiment is not limited to this. The gate electrode 1103 and either one or both a gate wiring and a capacitor wiring may be formed separately.

The gate insulating layer 1105 can be formed using the material described in Embodiment 1 by CVD, sputtering, or the like. In addition, the gate insulating layer 1105 may be formed using a microwave plasma-enhanced CVD apparatus with a high frequency (1 GHz or higher). When the gate insulating layer 1105 is formed by a microwave plasma-enhanced CVD apparatus, withstand voltage between a gate electrode and each of a drain electrode and a source electrode can be improved. Thus, a highly reliable thin film transistor can be obtained. Further, by forming a silicon oxide layer as the gate insulating layer 1105 by CVD using an organosilane gas, the crystallinity of the microcrystalline semiconductor layer which is formed later can be improved and the on-state-current and the field-effect mobility of the thin film transistor can be increased. As the organosilane gas, a compound containing silicon, such as tetraethyl orthosilicate tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$), can be used.

The first semiconductor layer 1106 is formed using microcrystalline silicon, microcrystalline silicon germanium, microcrystalline germanium, or the like. The first semiconductor layer 1106 is formed with a thickness of 3 nm to 10 nm, preferably 3 nm to 5 nm, so that in a second semiconductor layer to be formed in a later process, the length of a plurality of conical or pyramidal projections formed using a microcrystalline semiconductor can be controlled and on-state-current and the field-effect mobility of the thin film transistor can be increased.

The first semiconductor layer 1106 is formed by glow discharge plasma with a mixture of a deposition gas containing silicon or germanium and hydrogen in a treatment chamber of a plasma-enhanced CVD apparatus. Alternatively, the first semiconductor layer 1106 is formed by glow discharge plasma with a mixture of a deposition gas containing silicon or germanium, hydrogen, and a rare gas such as helium, neon, or krypton. Microcrystalline silicon, microcrystalline silicon germanium, microcrystalline germanium, or the like is formed using a mixture of the deposition gas containing silicon or germanium and hydrogen, which is obtained by diluting the deposition gas with hydrogen whose flow rate is 10 to 2000 times, preferably 50 to 200 times as high as that of the deposition gas.

Typical examples of the deposition gas containing silicon or germanium are $SiH_4$, $Si_2H_6$, $GeH_4$, $Ge_2H_6$, and the like.

A rare gas such as helium, argon, neon, krypton, or xenon is used as a source gas for the first semiconductor layer 1106, whereby the deposition rate of the first semiconductor layer 1106 can be increased. In addition, as the deposition rate is increased, the amount of impurities mixed in the first semiconductor layer 1106 is reduced; thus, the crystallinity of the first semiconductor layer 1106 can be improved. Accordingly, the on-state-current and field-effect mobility of the thin film transistor can be increased and productivity of the thin film transistor can also be increased.

When the first semiconductor layer 1106 is formed, glow discharge plasma is generated by application of a high frequency power of 3 to 30 MHz, typically, a high frequency power of 13.56 MHz or 27.12 MHz in the HF band, or a high frequency power of approximately 30 to 300 MHz in the VHF band, typically 60 MHz. Alternatively, glow discharge plasma is generated by applying high frequency power of a microwave of 1 GHz or higher. With the use of high frequency power in the VHF band or at a microwave frequency, the deposition rate can be increased. In addition, high frequency power in the HF band is superimposed with high frequency power in the VHF band, whereby unevenness of plasma in a large-sized substrate is also reduced, the uniformity can be increased, and the deposition rate can be increased.

Note that before the first semiconductor layer 1106 is formed, impurity elements in the treatment chamber of the plasma-enhanced CVD apparatus are removed by introducing a deposition gas containing silicon or germanium with gas in the treatment chamber exhausted, so that the amount of impurities in the gate insulating layer 1105 and the first semiconductor layer 1106 of a thin film transistor to be formed later can be reduced. Thus, electric characteristics of the thin film transistor can be improved.

Figure 20B:
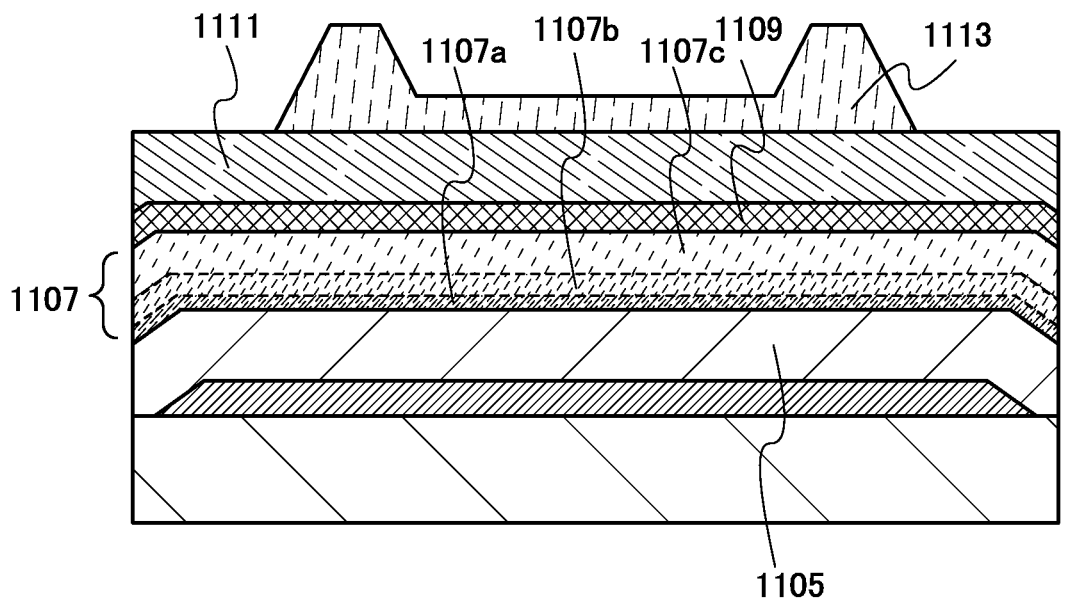
Figure 20C:
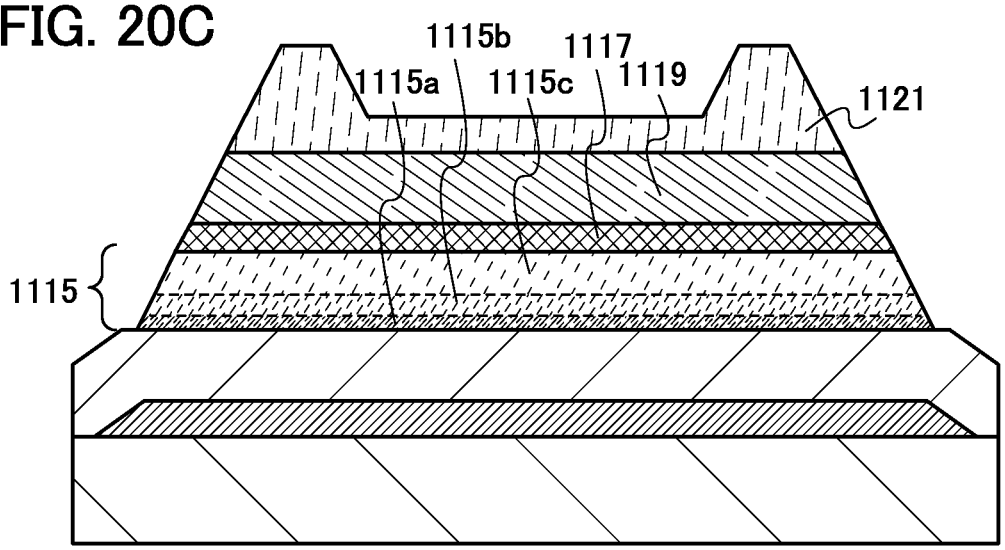

Next, as shown in FIG. 20B, a semiconductor layer is stacked over the first semiconductor layer 1106, so that a second semiconductor layer 1107 is formed. Then, an impurity semiconductor layer 1109 and a conductive layer 1111 are formed over the second semiconductor layer 1107. After that, a resist mask 1113 is formed over the conductive layer 1111.

The second semiconductor layer 1107 including a microcrystalline semiconductor layer 1107a, a mixed layer 1107b, and a layer 1107c including an amorphous semiconductor is formed under a condition that part of the crystal region grows with the first semiconductor layer 1106 used as a seed crystal. Note that in this case, for convenience, a structure in which the second semiconductor layer 1107 includes the first semiconductor layer 1106, that is, a structure in which the first semiconductor layer 1106 is included in the microcrystalline semiconductor layer 1107a is described.

The second semiconductor layer 1107 is formed by glow discharge plasma with a mixture of a deposition gas containing silicon or germanium, hydrogen, and a gas containing nitrogen in a treatment chamber of the plasma-enhanced CVD apparatus. As examples of the gas containing nitrogen, there are ammonia, nitrogen, nitrogen fluoride, nitrogen chloride, and the like.

At this time, a condition for forming a microcrystalline semiconductor layer is used for the flow rate ratio of the deposition gas including silicon or germanium to hydrogen in a manner similar to formation of the first semiconductor layer 1106, and in addition, the gas including nitrogen is used for a source gas, whereby crystal growth can be reduced as compared with the case of forming the first semiconductor layer 1106. As a result, the mixed layer 1107b and the layer 1107c including an amorphous semiconductor, which is formed with a semiconductor layer having a small number of defects and a steep tail slope of a level at a band edge in the valence band, can be formed in the second semiconductor layer 1107.

Here, a typical example of a condition for forming a microcrystalline semiconductor layer is as follows: The flow rate ratio of hydrogen is 10 to 2000 times, preferably, 10 to 200 times that of the deposition gas including silicon or germanium.

A rare gas such as helium, neon, argon, xenon, or krypton is introduced into a source gas for the second semiconductor layer 1107, whereby the deposition rate of the second semiconductor layer 1107 can be increased.

In an early stage of deposition of the second semiconductor layer 1107, the first semiconductor layer 1106 serves as a seed crystal and a microcrystalline semiconductor layer is deposited over the entire area over the first semiconductor layer 1106 (an early stage of deposition). After that, since the gas containing nitrogen is included in the source gas, crystal growth is partially suppressed and conical or pyramidal microcrystalline semiconductor region is formed and an amorphous semiconductor region is formed (a middle stage of the deposition). Further, crystal growth of the conical or pyramidal microcrystalline semiconductor region stops and a layer including an amorphous semiconductor is formed (a later stage of the deposition).

Accordingly, the microcrystalline semiconductor layer 1115a illustrated in FIG. 17 and FIGS. 18A and 18B corresponds to the first semiconductor layer 1106 in FIG. 20A and a microcrystalline semiconductor layer which is formed in the early stage of deposition of the second semiconductor layer 1107, i.e., the microcrystalline semiconductor layer 1107a in FIG. 20B.

Further, the mixed layers 1115b illustrated in FIG. 17 and FIGS. 18A and 18B correspond to a layer which includes the conical or pyramidal microcrystalline semiconductor regions and regions filling the space except the conical or pyramidal microcrystalline regions and is formed in a middle stage of deposition of the second semiconductor layer 1107 in FIG. 20B, i.e., the mixed layer 1107b.

The layer 1129c including an amorphous semiconductor shown in FIG. 17 and FIGS. 18A and 18B corresponds to the layer 1107c including an amorphous semiconductor, which is formed in a later stage of deposition of the second semiconductor layer 1107 shown in FIG. 20B.

In the second semiconductor layer 1107 formed by such a method, the nitrogen concentration which is measured by secondary ion mass spectrometry has a peak in the vicinity of the interface between the microcrystalline semiconductor layer 1107a and the mixed layer 1107b and is constant in a direction in which the mixed layer 1107b and the layer 1107c including an amorphous semiconductor are deposited.

The impurity semiconductor layer 1109 is formed by glow discharge plasma with a mixture of a deposition gas containing silicon, hydrogen, and phosphine (diluted with hydrogen or silane) in the treatment chamber of the plasma-enhanced CVD apparatus. Amorphous silicon to which phosphorus is added or microcrystalline silicon to which phosphorus is added is formed by diluting the deposition gas including silicon with hydrogen.

The conductive layer 1111 can be formed using a material similar to that of the wirings 1125 shown in FIG. 17. The conductive layer 1111 is formed by CVD, sputtering, or vacuum evaporation. Alternatively, the conductive layer 1111 may be formed by discharging a conductive nanopaste of silver, gold, copper, or the like by a screen printing method, an inkjet method, or the like and baking the conductive nanopaste.

The second resist mask 1113 is formed by a photolithography process. The second resist mask 1113 has regions with different thicknesses. Such a resist mask can be formed using a multi-tone mask. By using the multi-tone mask, the number of photomasks used and the number of manufacturing steps can be reduced, which is preferable. In this embodiment, the multi-tone mask can be used in a step of forming a pattern of the second semiconductor layer 1107 and a step of separating the semiconductor layer into a source region and a drain region.

A multi-tone mask is a mask capable of light exposure with multi-level light intensity, typically, with three levels of light intensity so that an exposed region, a semi-exposed region, and an unexposed region are formed. With the use of the multi-tone mask, a resist mask with plural thicknesses (typically two kinds of thicknesses) can be formed by one-time exposure and a development process. Therefore, with the use of the multi-tone mask, the number of photomasks can be reduced.

Figure 22A:
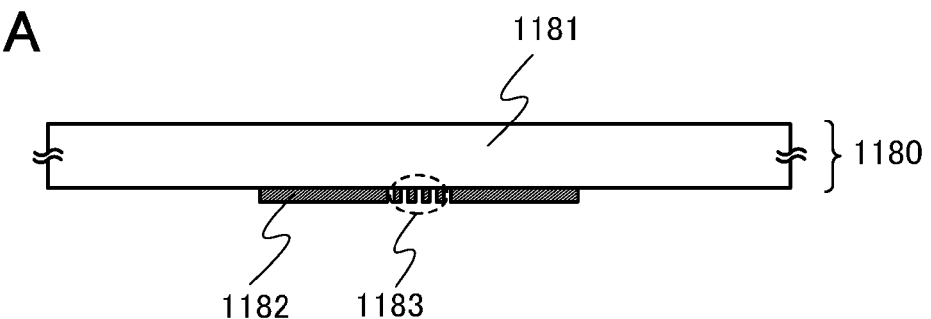
Figure 22A:
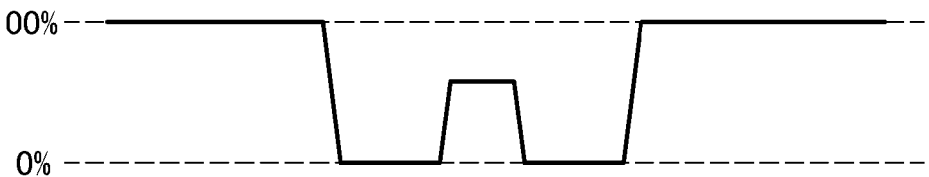
Figure 22B:
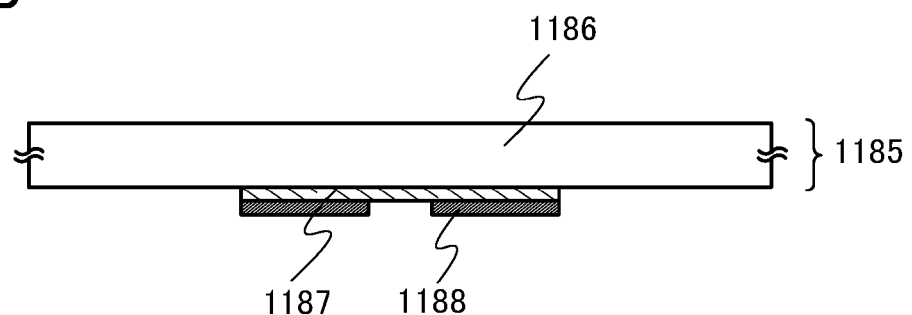
Figure 22B:
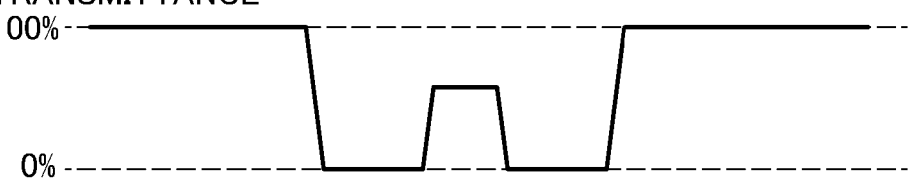

FIGS. 22A-1 and 22B-1 are cross-sectional views of typical multi-tone masks. FIG. 22A-1 shows a gray-tone mask 1180, and FIG. 22B-1 shows a half-tone mask 1185.

The gray-tone mask 1180 shown in FIG. 22A-1 includes a light-blocking portion 1182 formed using a light-blocking layer on a light-transmitting substrate 1181, and a diffraction grating portion 1183 provided with a pattern of the light-blocking layer.

The diffraction grating portion 1183 has slits, dots, meshes, or the like provided at intervals which are less than or equal to the resolution limit of light used for exposure, so that light transmittance is controlled. Note that the slits, dots, or meshes provided at the diffraction grating portion 1183 may be provided periodically or non-periodically.

For the light-transmitting substrate 1181, quartz or the like can be used. The light-blocking layer included in the light-blocking portion 182 and the diffraction grating portion 1183 is formed using chromium, chromium oxide, or the like.

In the case where the gray-tone mask 1180 is irradiated with light for exposure, as shown in FIG. 22A-2, transmittance in a region overlapping with the light-blocking portion 1182 is 0%, and transmittance in a region where the light-blocking portion 1182 or the diffraction grating portion 183 is not provided is 100%. Further, transmittance at the diffraction grating portion 1183 is approximately in the range of 10 to 70%, which can be adjusted by the interval of slits, dots, or meshes of the diffraction grating, or the like.

The half-tone mask 1185 shown in FIG. 22B-1 includes a semi-light-transmitting portion 1187 formed using a semi-light-transmitting layer on a light-transmitting substrate 1186, and a light-blocking portion 1188 formed using a light-blocking layer.

The semi-light-transmitting portion 1187 can be formed using a layer of MoSiN, MoSi, MoSiO, MoSiON, CrSi, or the like. The light-blocking portion 1188 may be formed using a metal which is similar to that of the light-blocking layer of the gray-tone mask, and is preferably formed using chromium, chromium oxide, or the like.

In the case where the half-tone mask 1185 is irradiated with light for exposure, as illustrated in FIG. 22B-2, transmittance in a region overlapping with the light-blocking portion 1188 is 0%, and transmittance in a region where neither the light-blocking portion 1188 nor the semi-light-transmitting portion 1187 is provided is 100%. Further, transmittance at the semi-light-transmitting portion 1187 is approximately in the range of 10 to 70%, which can be adjusted by the kind, thickness, or the like of a material to be used.

By performing exposure using the multi-tone mask and development, a resist mask having regions with different thicknesses can be formed.

Next, with the use of the second resist mask 1113, the second semiconductor layer 1107, the impurity semiconductor layer 1109, and the conductive layer 1111 are etched. Through this step, the second semiconductor layer 1107, the impurity semiconductor layer 1109, and the conductive layer 1111 are separated into each element to form a second semiconductor layer 1115, an impurity semiconductor layer 1117, and a conductive layer 1119. Note that the second semiconductor layer 1115 includes the microcrystalline semiconductor layer 1115a, the mixed layer 1115b, and a layer 1115c including an amorphous semiconductor (see FIG. 20C).

Next, separated third resist masks 1123 are formed with the second resist mask 1113 eroded. Ashing using oxygen plasma may be performed in order that the resist mask recede. Here, ashing is performed on the second resist mask 1s13 so that the resist mask 1113 is separated over the gate electrode. Thus, the third resist masks 1123 can be formed (see FIG. 21A).

Figure 21A:
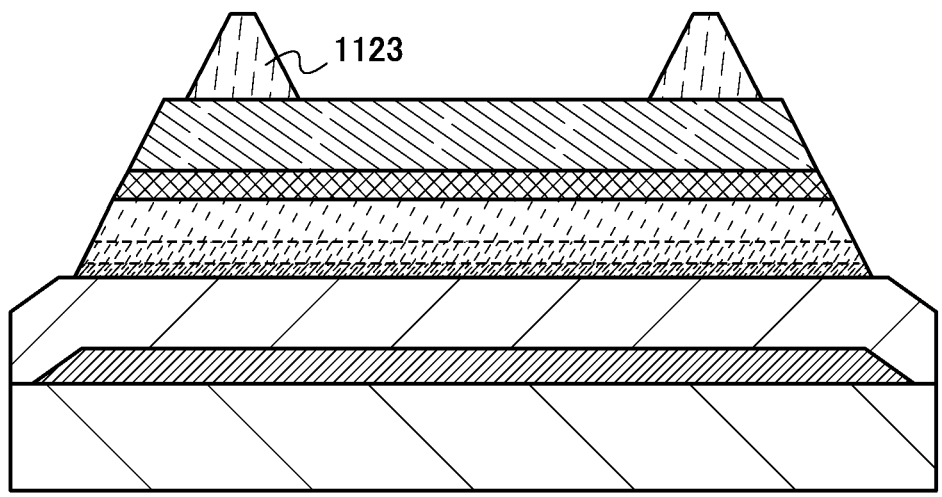
FIGS. 21A to 21C are cross-sectional views showing a method for manufacturing a driver circuit.
Figure 21B:
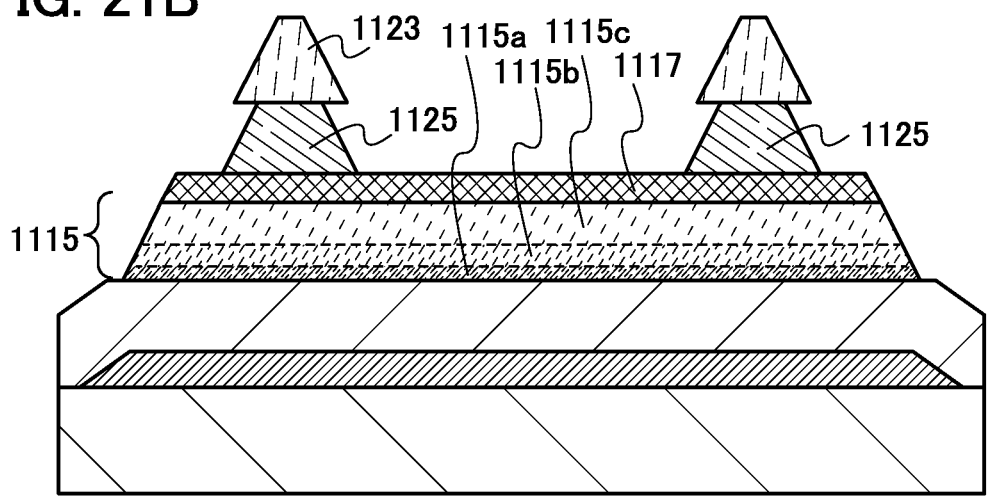
Figure 21C:
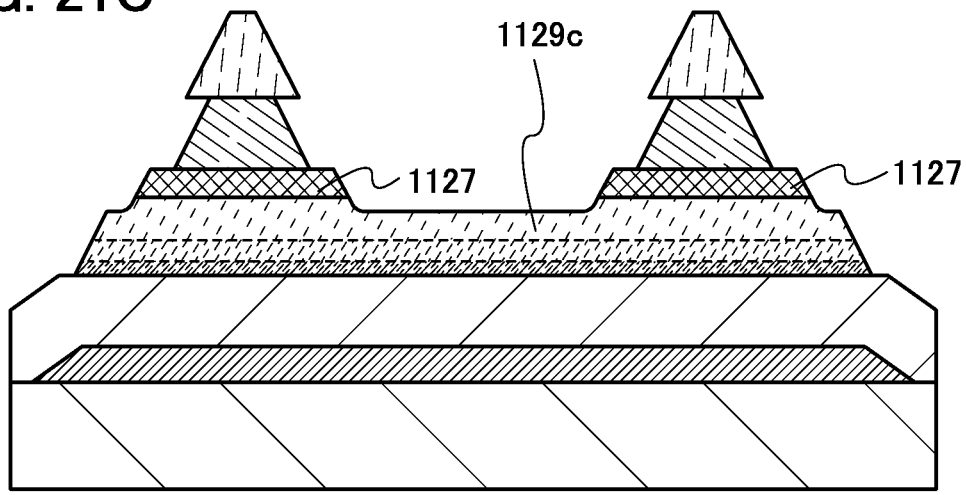

Next, the conductive layer 1111 is etched using the third resist masks 1123, so that the wirings 1125 functioning as a source electrode and a drain electrode are formed (see FIG. 21B). It is preferable that the conductive layer 1111 be removed by wet etching. By wet etching, the conductive layer is isotropically etched. Accordingly, the conductive layer recedes to an inner side than those of the resist masks 1123, so that the wirings 1125 are formed. The wiring 1125 functions not only as a source electrode or a drain electrode but also as a signal line. However, this embodiment is not limited to this. The signal line may be provided separately from the source electrode and the drain electrode.

Next, with the use of the third resist masks 1123, the layer 1115c including an amorphous semiconductor and the impurity semiconductor layer 1117 are partly etched. Here, dry etching is used. Up to this step, an amorphous semiconductor layer 1129c having a depression on its surface, and the impurity semiconductor layers 1127 functioning as a source and drain regions are formed. After that, the third resist masks 1123 are removed (see FIG. 21C).

Note that, here, after the conductive layer 1111 is etched by wet etching, each of the layer 1115c including an amorphous semiconductor and the impurity semiconductor layer 1117 is partly etched by dry etching. Thus, the conductive layer 1119 is isotropically etched, and side surfaces of the wirings 1125 are not aligned with side surfaces of the impurity semiconductor layers 1127. That is, the side surfaces of the impurity semiconductor layers 1127 are formed on an outer side than the side surfaces of the wirings 1125.

Alternatively, the impurity semiconductor layer 1117 and the layers 1115c including an amorphous semiconductor may be partly etched after removal of the third resist masks 1123. By the etching, the impurity semiconductor layer 1117 is etched using the wirings 1125, so that the side surfaces of the wirings 1125 are approximately aligned with the side surfaces of the impurity semiconductor layers 1127.

Next, dry etching may be performed after the third resist masks 1123 are removed. The condition of dry etching is set so that the exposed layer 1129c including an amorphous semiconductor is not damaged and an etching rate with respect to the layer 1129c including an amorphous semiconductor is low. In other words, a condition which gives almost no damages to the exposed layer 1129c including an amorphous semiconductor and hardly reduces the thickness of the exposed layer 1129c including an amorphous semiconductor is used. As an etching gas, $Cl_2$, $CF_4$, $N_2$, or the like is typically used. Further, there is no particular limitation on an etching method, and an inductively coupled plasma (ICP) method, a capacitively coupled plasma (CCP) method, an electron cyclotron resonance (ECR) method, a reactive ion etching (RIE) method, or the like can be used.

Next, a surface of layer 1129c including an amorphous semiconductor containing an amorphous semiconductor may be irradiated with water plasma, ammonia plasma, nitrogen plasma, or the like.

Water plasma treatment can be performed in such a manner that a gas containing water as a main component typified by water vapor ($H_2O$ vapor) is introduced into a reaction space so that plasma is generated.

As described above, dry etching is further performed under a condition where the layer 1129c including an amorphous semiconductor is not damaged after the impurity semiconductor layers 1127 are formed, so that an impurity element such as a residue existing on the exposed layer 1129c including an amorphous semiconductor can be removed. Further, water plasma treatment is performed after the dry etching, so that a residue of the resist mask can be removed. By the water plasma treatment, insulation between the source region and the drain region can be ensured. Thus, in a thin film transistor which is completed, the amount of off-state current can be reduced, and variation in electric characteristics can be reduced.

Through these steps, a thin film transistor with a channel region formed using a microcrystalline semiconductor layer can be manufactured with the use of fewer masks. Further, the thin film transistor having a small amount of off-state-current, a large amount of on-state-current, and high field-effect mobility can be manufactured.

(Method 2)

A method for manufacturing a thin film transistor, which is different from in Method 1, is described with reference to FIGS. 20A to 20C, FIGS. 23A to 23C, and FIGS. 24A and 24B.

In a manner similar to Method 1, the gate electrode 1103 is formed over the substrate 1101. Next, the gate insulating layer 1105 and the first semiconductor layer 1106 are formed so as to cover the gate electrode 1103 (see FIG. 20A). Then, in a manner similar to Method 1, crystals are grown from the first semiconductor layer 1106, whereby the second semiconductor layer 1107 including (the microcrystalline semiconductor layer 1107a, the mixed layer 1107b, and the layer 1107c including an amorphous semiconductor) is formed. Then, the impurity semiconductor layer 1109 is formed over the second semiconductor layer 1107 (see FIG. 23A). After that, a resist mask (not shown) is formed over the impurity semiconductor layer 1109.

Next, with the use of the resist mask, the second semiconductor layer 1107 and the impurity semiconductor layer 1109 are etched. Through this step, the second semiconductor layer 1107 and the impurity semiconductor layer 1109 are separated into each element, so that the second semiconductor layer 1115 (including the microcrystalline semiconductor layer 1115a, the mixed layer 1115b, and the layer 1115c including an amorphous semiconductor) and the impurity semiconductor layer 1117 are formed (see FIG. 23B).

Figure 23A:
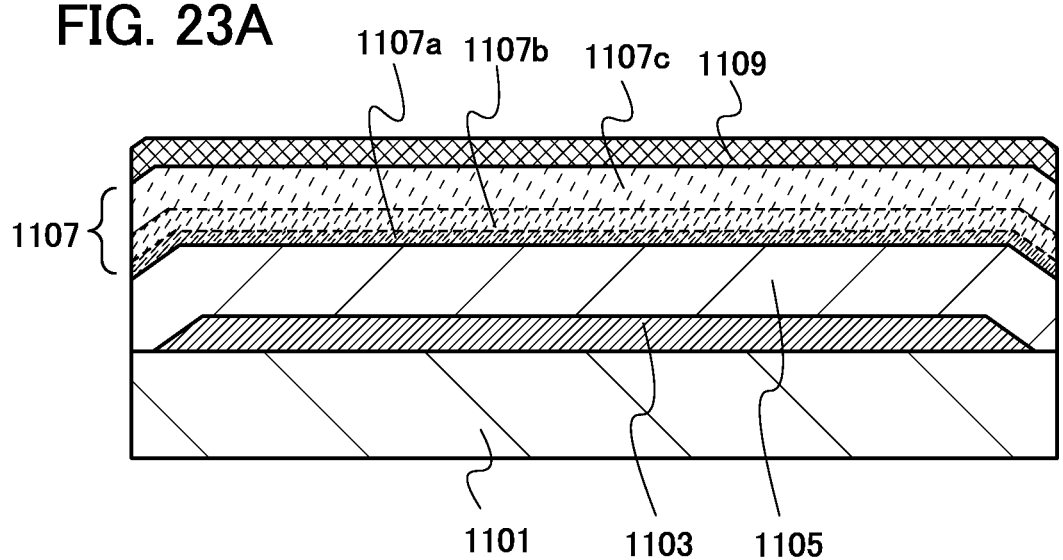
FIGS. 23A to 23C are cross-sectional views showing a method for manufacturing a driver circuit.
Figure 23B:
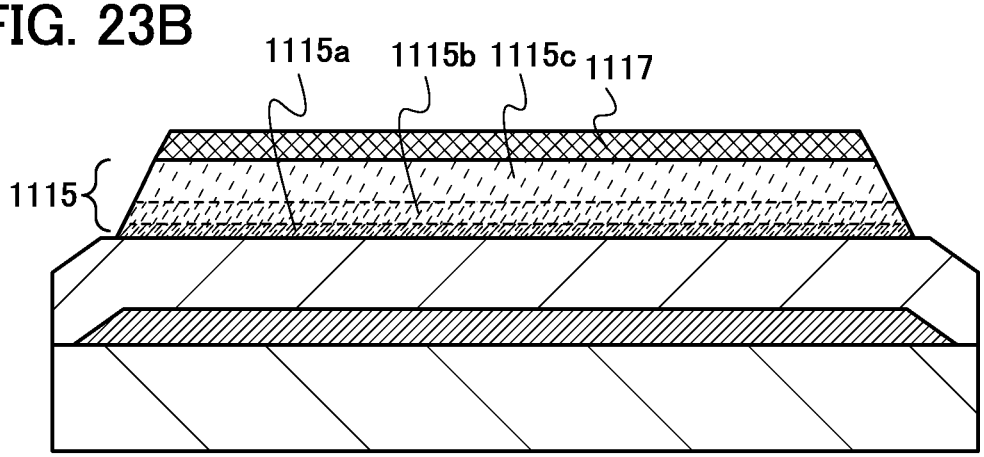
Figure 23C:
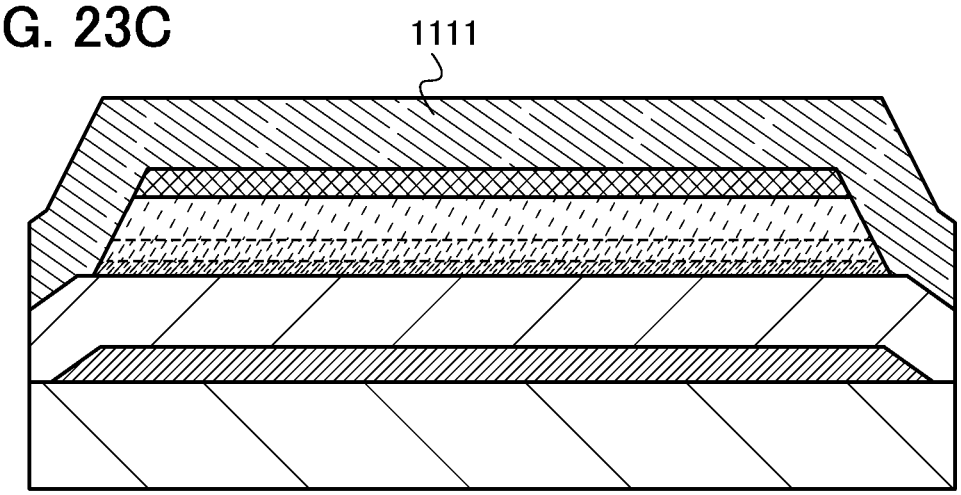

Next, the conductive layer 1111 is formed over the gate insulating layer 1105, the second semiconductor layer 1115, and the impurity semiconductor layer 1117 (see FIG. 23C).

Figure 24A:
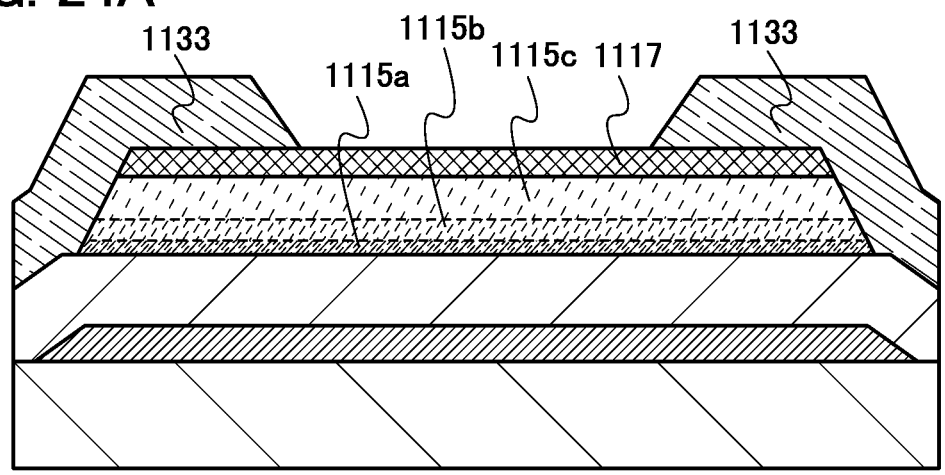
FIGS. 24A and 24B are cross-sectional views showing a method for manufacturing a driver circuit.
Figure 24B:
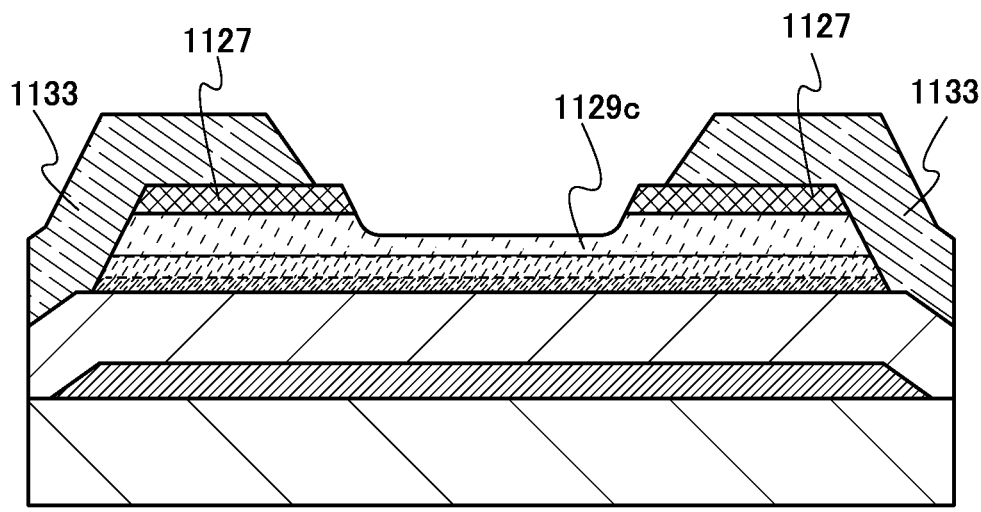

Next, a resist mask (not shown) is formed over the conductive layer 1111, and the conductive layer 1111 is etched with the use of the resist mask, so that wirings 1133 functioning as a source and drain electrodes are formed (see FIG. 24A).

Next, the impurity semiconductor layer 1117 is etched so that the impurity semiconductor layers 1127 functioning as a source and drain regions are formed. Further, the layer 1115c including an amorphous semiconductor is etched so that the layer 1129c including an amorphous semiconductor is formed (see FIG. 24B).

Through the above steps, the thin film transistor can be manufactured.

Note that the layer 1115c including an amorphous semiconductor is partly etched without removal of the resist mask after forming the wirings 1133; however, part of the impurity semiconductor layer 1117 and part of the layer 1129c including an amorphous semiconductor may be etched after removal of the resist mask. By the etching, the impurity semiconductor layer 1117 is etched using the wirings 1133 as masks, so that side surfaces of the wirings 1133 are approximately aligned with side surfaces of the impurity semiconductor layers 1127.

Next, dry etching is preferably performed after the resist mask is removed. The condition of dry etching is set so that the exposed layer 1129c including an amorphous semiconductor is not damaged and an etching rate with respect to the layer 1129c including an amorphous semiconductor is low. In other words, a condition that a surface of the exposed layer 1129c including an amorphous semiconductor is hardly damaged and the thickness of the exposed layer 1129c including an amorphous semiconductor is hardly decreased is used.

Next, the surface of the layer 1129c including an amorphous semiconductor may be irradiated with water plasma, ammonia plasma, nitrogen plasma, or the like.

Water plasma treatment can be performed in such a manner that a gas containing water as a main component typified by water vapor ($H_2O$ vapor) is introduced into a reaction space so that plasma is generated.

As described above, dry etching is further performed under a condition where the layer 1129c including an amorphous semiconductor is not damaged after the layer 1129c including an amorphous semiconductor is formed, so that an impurity element such as a residue existing on the layer 1129c including an amorphous semiconductor can be removed. Further, water plasma treatment is performed after the dry etching, so that a residue of the resist mask can be removed. By the water plasma treatment, insulation between the source region and the drain region can be ensured. Thus, in a thin film transistor, the amount of off-state current can be reduced, and variation in electric characteristics can be reduced.

(Method 3)

Next, a method for manufacturing the thin film transistor shown in FIG. 19 is described with reference to FIGS. 20A to 20C, FIGS. 21A to 21C, and FIGS. 25A to 25C.

In a manner similar to Method 1, after the wirings 1125 are formed through the steps in FIGS. 20A to 20C, FIG. 21A, and FIG. 21B, the impurity semiconductor layer 1117 is etched so that the impurity semiconductor layers 1127 are formed. Further the layer 1115c including an amorphous semiconductor is etched so that a pair of layers 1132 including an amorphous semiconductor is formed (see FIG. 25A).

Here, a condition is used as appropriate under which the layer 1115c including an amorphous semiconductor is selectively etched by wet etching or dry etching so that the second microcrystalline semiconductor layer 1131b is exposed. As a typical example of an etchant which enables wet etching whereby an amorphous semiconductor layer can selectively be etched, an etchant including hydrazine, potassium hydroxide, or ethylenediamine can be used. Alternatively, an etchant including a mixed solution of hydrofluoric acid and nitric acid can be used. Alternatively, a tetramethyl ammonium hydroxide (also referred to as TMAH) aqueous solution can be used.

In addition, hydrogen can be used as an etching gas which enables dry etching whereby an amorphous semiconductor layer can selectively be etched. Alternatively, a gas containing chlorine, bromine, or iodine can be used as the etching gas. As typical example, hydrogen chloride, hydrogen bromide, hydrogen iodide, silicon tetrachloride, phosphorus trichloride, boron trichloride or the like can be used. Alternatively, a gas containing fluorine can be used as the etching gas. As a typical example, tetrafluoromethane, sulfur hexafluoride, nitrogen trifluoride, silicon tetrafluoride, boron trifluoride, xenon difluoride, chlorine trifluoride, or the like can be used. Alternatively, a mixed gas of tetrafluoromethane and oxygen, or a mixed gas of sulfur hexafluoride and chlorine can be used as the etching gas.

Figure 25A:
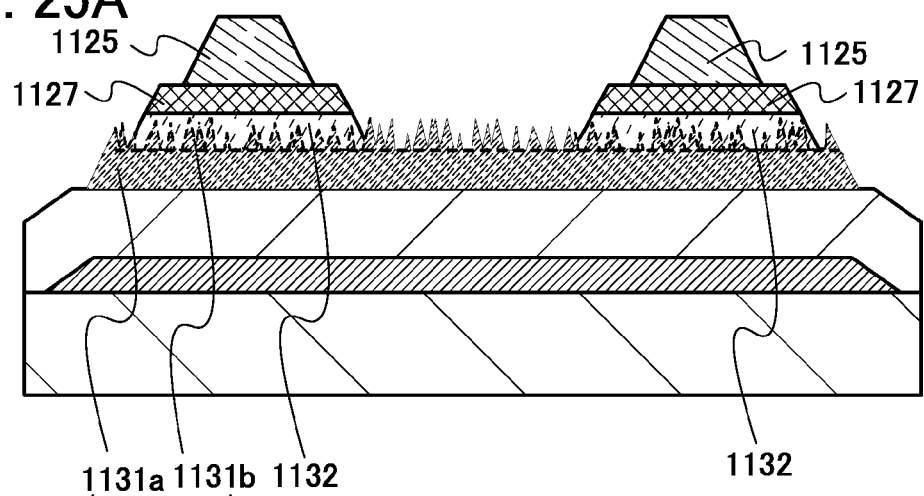
FIGS. 25A to 25C are cross-sectional views showing a method for manufacturing a driver circuit.
Figure 25B:
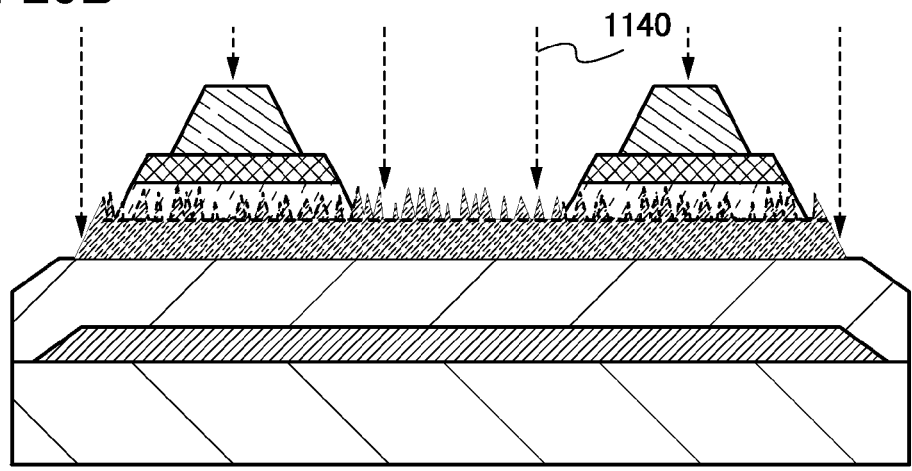
Figure 25C:
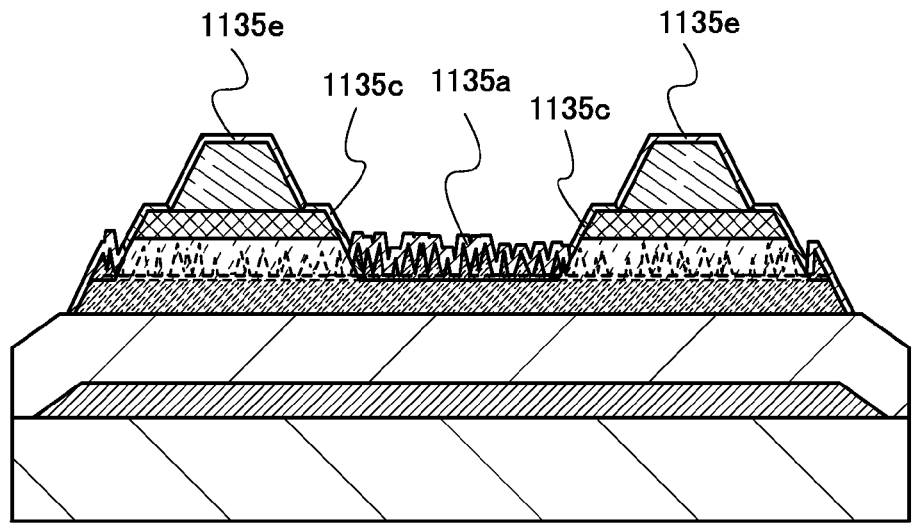

After that, a resist mask is removed, and plasma treatment 1140 by which surfaces of the second microcrystalline semiconductor layer 1131b, the pair of layers 1132 including an amorphous semiconductor, the impurity semiconductor layers 1127, and the wirings 1125 is oxidized or nitrided is performed, whereby the first insulating layer 1135a, the second insulating layers 1135c, and the third insulating layers 1135e shown in FIG. 25C are formed.

The pair of layers 1132 include an amorphous semiconductor and thus have a weak n-type conductivity. In addition, the pair of layer 1132 including an amorphous semiconductor has lower density than the microcrystalline semiconductor layer 1131. Therefore, the second insulating layers 1135c formed by oxidizing or nitriding the pair of layers 1132 including an amorphous semiconductor is insulating layers having low density and low insulating property. However, in the thin film transistor shown in FIG. 19, the first insulating layer 1135a formed by oxidizing the microcrystalline semiconductor layer 1131 is formed on a back channel side. The microcrystalline semiconductor layer has higher density than the amorphous semiconductor layer, and the first insulating layer 1135a thus has also high density and a high insulating property. Further, the second insulating layer 1131b has a plurality of conical or pyramidal protrusions (projections) and thus has an uneven surface. Therefore, a leak path between a source region and a drain region has a long distance. Accordingly, a reduction in off-state-current of the thin film transistor can be realized.

Note that here, after the wirings 1125 are formed, the layer 1115c including an amorphous semiconductor is etched so that the second microcrystalline semiconductor layer 1131b is exposed. However, the following may be performed. The wirings 1125 are formed; the resist mask is removed; each of the impurity semiconductor layer 1117 and the layer 1115c including an amorphous semiconductor is partly etched by dry etching; and the plasma treatment 1140 by which the surface of the second microcrystalline semiconductor layer 1131b is oxidized or nitrided is performed. In that case, since the impurity semiconductor layer 1127 and the layer 1115c including an amorphous semiconductor are etched using the wirings 1125 as masks, side surfaces of the wirings 1125 are approximately aligned with side surfaces of the impurity semiconductor layers 1127.

As described above, after the second microcrystalline semiconductor layer 1131b having conical or pyramidal protrusions (projections) is exposed, an insulating layer is formed on the surface of the second microcrystalline semiconductor layer 1131b by plasma treatment; thus, a leak path between the source region and the drain region can have a long distance, and an insulating layer having a high insulating property can be formed.

(Method 4)

A method for manufacturing the second semiconductor layer 1107, which can be applied to any of Methods 1 to 3, is described below. In this case, instead of using the gas containing nitrogen as the source gas of the second semiconductor layer 1107, by forming the second semiconductor layer 1107 after forming a layer containing nitrogen in a treatment chamber of the plasma-enhanced CVD apparatus, the second semiconductor layer 1107 can be supplied with nitrogen.

After the first semiconductor layer 1106 is formed, the substrate is carried out of the treatment chamber of the plasma-enhanced CVD apparatus. Next, a layer containing nitrogen is formed in the treatment chamber of the plasma-enhanced CVD apparatus. In this case, as the layer containing nitrogen, a silicon nitride layer is formed. Then, after the substrate is carried into the treatment chamber, a source gas used for deposition of the second semiconductor layer 1107 is introduced into the treatment chamber, and the second semiconductor layer 1107 is formed. In this case, a deposition gas including silicon or germanium, and hydrogen are used as a source gas. The layer containing nitrogen formed on the inner wall of the treatment chamber is exposed to plasma, whereby part of the layer containing nitrogen is dissociated and nitrogen is desorbed. Alternatively, an NH group is generated. As a result, the second semiconductor layer 1107 contains nitrogen, so that the second semiconductor layer 1107 including the microcrystalline semiconductor layer 1107a, the mixed layer 1107b, and the layer 1107c including an amorphous semiconductor can be formed as shown in FIG. 18A. Alternatively, as shown in FIG. 18B, the second semiconductor layer 1107 including the microcrystalline semiconductor layer 1107a and the mixed layer 1107b can be formed.

In the second semiconductor layer 1107 formed by such a method, the nitrogen concentration which is measured by secondary ion mass spectrometry has a peak at an upper portion of the microcrystalline semiconductor layer 1107a, or in the vicinity of the interface between the microcrystalline semiconductor layer 1107a and the mixed layer 1107b, and is decreased with respect to a direction in which the second semiconductor layer 107 is deposited.

Through the steps above, the second semiconductor layer 1107 can be formed.

(Method 5)

A method for manufacturing the second semiconductor layer 1107, which can be applied to any of Methods 1 to 3, is described below. In this case, instead of using the gas containing nitrogen as the source gas of the second semiconductor layer 1107, by forming the second semiconductor layer 1107 after introducing a gas containing nitrogen in the treatment chamber of the plasma-enhanced CVD apparatus before forming the second semiconductor layer 1107, the second semiconductor layer 1107 can be supplied with nitrogen.

After the first semiconductor layer 1106 is formed, the surface of the first semiconductor layer 1106 is exposed to the gas containing nitrogen (here, this treatment is referred to as flush treatment), so that nitrogen is supplied to the treatment chamber of the plasma-enhanced CVD apparatus. As examples of the gas containing nitrogen, ammonia, nitrogen, nitrogen fluoride, nitrogen chloride, and the like can be given. In addition, hydrogen may be included in any of the gas containing nitrogen. In this case, the surface of the first semiconductor layer 1106 is exposed to ammonia, whereby nitrogen is supplied.

Then, after a source gas used for deposition of the second semiconductor layer 1107 is introduced into the treatment chamber, the second semiconductor layer 1107 is formed. In this case, a deposition gas including silicon or germanium, and hydrogen are used as a source gas.

In the formation step of the second semiconductor layer 1107, a gas containing nitrogen introduced into the treatment chamber by the flush treatment, in this case, ammonia is decomposed by plasma discharge, so that nitrogen is desorbed. Alternatively, an NH group is generated. As a result, the second semiconductor layer 1107 contains nitrogen, so that the second semiconductor layer 1107 including the microcrystalline semiconductor layer 1107a, the mixed layer 1107b, and the layer 1107c including an amorphous semiconductor can be formed as shown in FIG. 18A. Alternatively, as shown in FIG. 18B, the second semiconductor layer 1107 including the microcrystalline semiconductor layer 1107a and the mixed layer 1107b can be formed.

In the second semiconductor layer 1107 formed by such a method, the nitrogen concentration which is measured by secondary ion mass spectrometry has a peak at an upper portion of the microcrystalline semiconductor layer 1107a or in the vicinity of the interface between the microcrystalline semiconductor layer 1107a and the mixed layer 1107b and is decreased with respect to a direction in which the mixed layer 1107b and the layer 1107c including an amorphous semiconductor are deposited.

Through the steps above, the second semiconductor layer 1107 can be formed.

In this embodiment, examples of methods for manufacturing a thin film transistor included in a display device are described. Such a structure can be combined with any of the shift registers in Embodiments 1 to 5. In the case where a microcrystalline semiconductor is used for a channel region of the thin film transistor, an increase in the size of the display device, a reduction in cost, an improvement in yield, or the like can be achieved. Further, by the use of a microcrystalline semiconductor for the channel region, degradation of characteristics of the thin film transistor can be suppressed, so that the life of the display device can be extended.

Note that the contents described in each drawing in this embodiment can be freely combined with or replaced with the contents described in any of the other embodiments as appropriate.

Embodiment 7

Figure 26A:
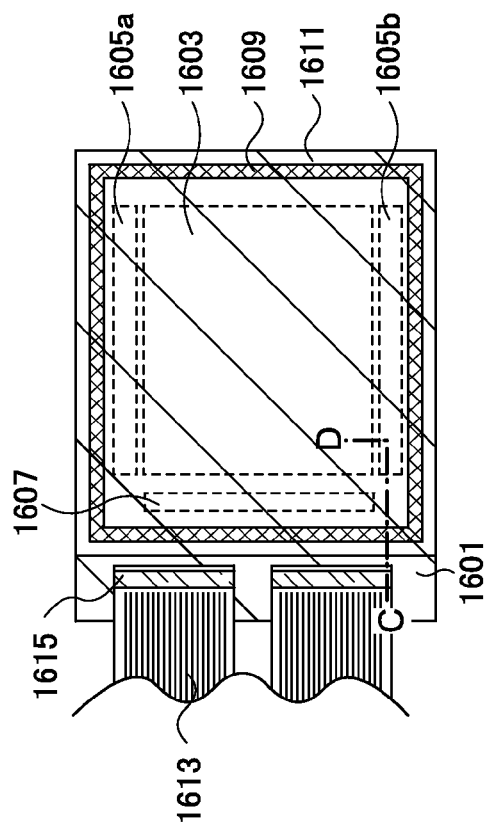
FIGS. 26A and 26B are a top view and a cross-sectional view showing a display device.
Figure 26B:
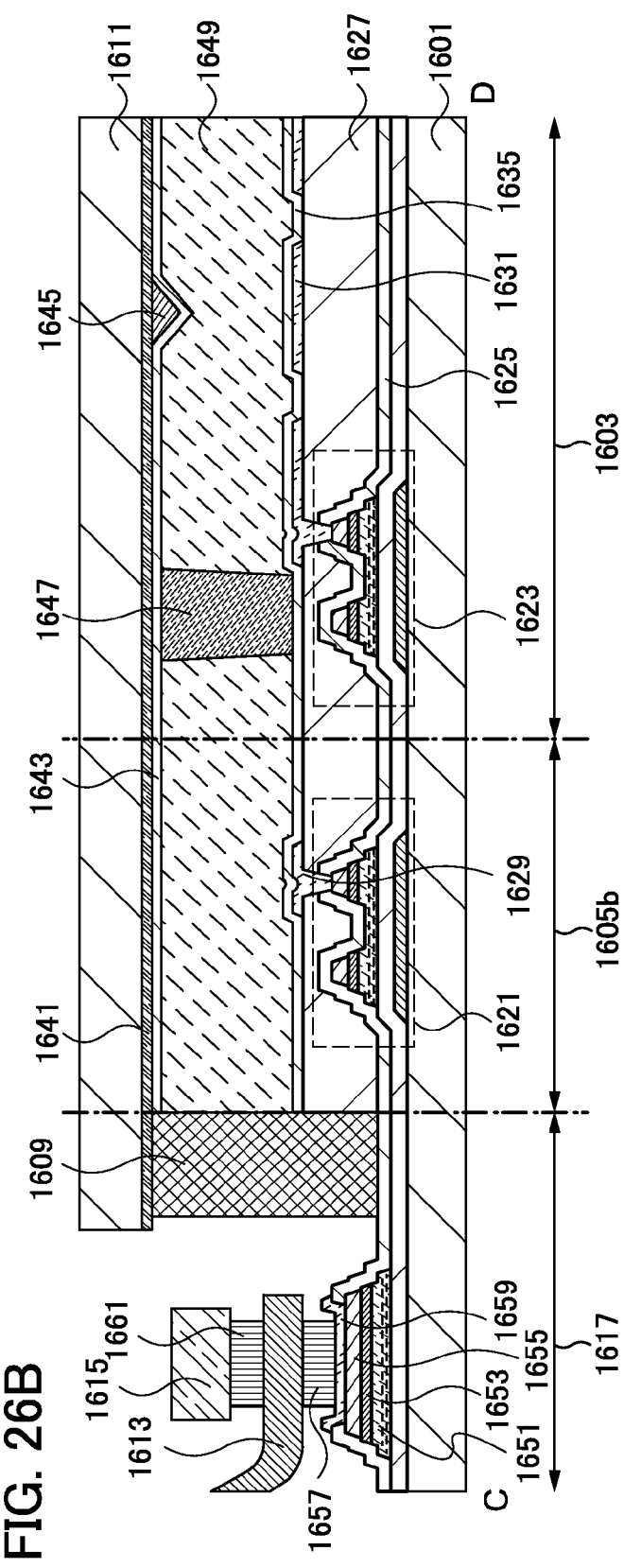

In this embodiment, as an embodiment of a display device, a cross-sectional structure of a liquid crystal display device is described with reference to FIGS. 26A and 26B. Specifically, the structure of a liquid crystal display device which includes a thin film substrate, a counter substrate, and a liquid crystal layer held between the counter substrate and the TFT substrate is described. FIG. 26A is a top view of the liquid crystal display device. FIG. 26B is a cross-sectional view taken along line C-D in FIG. 26A. Note that FIG. 26B is a cross-sectional view of a liquid crystal display device where an inverted staggered transistor including a microcrystalline semiconductor in the channel region is formed over a substrate 1601, and the display mode of the liquid crystal display device is an MVA (multi-domain vertical alignment) mode.

In the liquid crystal display device illustrated in FIG. 26A, a pixel portion 1603, a first scan line driver circuit 1605a, a second scan line driver circuit 1605b, and a signal line driver circuit 1607 are formed over the substrate 1601. The pixel portion 1603, the first scan line driver circuit 1605a, the second scan line driver circuit 1605b, and the signal line driver circuit 1607 are sealed between the substrate 1601 and a substrate 1611 with a sealant 1609. In addition, an FPC 1613 and an IC chip 1615 are provided over the substrate 1601 by a TAB method.

A cross-sectional structure taken along line C-D in FIG. 26A is described with reference to FIG. 26B. In this case, the pixel portion 1603, the scan line driver circuit 1605b which is part of a peripheral driver circuit portion, and a terminal portion 1617, which are formed over the substrate 1601, are shown.

A thin film transistor 1621 to be provided in the second scan line driver circuit 1605b and a thin film transistor 1623 to be provided in the pixel portion 1603 are formed over the substrate 1601. Further, insulating layers 1625 and 1627 are formed over the thin film transistors 1621 and 1623. Furthermore, a wiring 1629 to be connected to a source electrode or a drain electrode of the thin film transistor 1621 through an opening portion in the insulating layer 1625 and a pixel electrode 1631 to be connected to a source electrode or a drain electrode of the thin film transistor 1623 through an opening portion in the insulating layer 1625 are formed. Moreover, an insulating layer 1635 is formed over the insulating layer 1627, the wiring 1629, and the pixel electrode 1631.

The contents described in Embodiments 1 to 6 can be applied to each structure of the thin film transistors 1621 and 1623a and a method for manufacturing the thin film transistors 1621 and 1623 as appropriate.

Each of the insulating layer 1625 and the insulating layer 1627 can be formed using an inorganic insulating layer, an organic resin layer, or the like. As an inorganic insulating layer, a silicon oxide layer, a silicon oxynitride layer, a silicon nitride oxide layer, or a carbon layer typified by diamond like carbon (DLC), or the like can be used. For an organic resin layer, an acrylic resin, an epoxy resin, polyimide, polyamide, polyvinyl phenol, benzocyclobutene, or the like can be used. Alternatively, a siloxane polymer can be used.

The insulating layer 1625 and the insulating layer 1627 can be formed by CVD, sputtering, a printing method, a coating method, a slit-coating method, or the like as appropriate.

Since at least one of the insulating layer 1625 and the insulating layer 1627 is formed using an organic resin layer, planarity can be improved; thus, alignment of liquid crystal molecules can easily be controlled.

The wiring 1629 and the pixel electrode 1631 can be formed using indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like.

Alternatively, the wiring 1629 and the pixel electrode 1631 can be formed using a conductive composition containing a light-transmitting conductive high molecule (also referred to as a conductive polymer). Each of the wiring 1629 and the pixel electrode 1631 preferably has a sheet resistance less than or equal to 10000 ohms/square and a light transmittance greater than or equal to 70% at a wavelength of 550 nm. The sheet resistance of each of the wiring 1629 and the pixel electrode 1631 is preferably lower. In addition, it is preferable that the resistivity of the conductive high molecule contained in the conductive composition be 0.1 ohm·cm or less.

As the conductive high molecule, a so-called π electron conjugated conductive high molecule can be used. For example, polyaniline or a derivative thereof, polypyrrole or a derivative thereof, polythiophene or a derivative thereof, a copolymer of two or more kinds of them, or the like can be used.

Note that when the pixel electrode 1631 functions as a reflective electrode, the pixel electrode 1631 can be formed using aluminum, silver, or the like; or an alloy thereof, or the like. In addition, a two-layer structure of aluminum and titanium, molybdenum, tantalum, chromium, or tungsten; or a three-layer structure in which aluminum is interposed between any of metals such as titanium, molybdenum, tantalum, chromium, or tungsten may be employed.

An opening portion is formed in the pixel electrode 1631. The opening portion formed in the conductive film can have the same function as a protrusion used in an MVA mode because the opening portion can make liquid crystal molecules slanted.

The insulating layer 1635 functions as an alignment film.

The sealant 1609 is formed around the pixel portion 1603, or around the pixel portion 1603 and the peripheral driver circuit portion thereof by an inkjet method or the like. The substrate 1611 on which a conductive layer 1641, an insulating layer 1643, a protrusion 1645, and the like are formed and the substrate 1601 are attached to each other with the sealant 1609 with a spacer 1647 interposed therebetween, and a liquid crystal layer 1649 is provided between the two substrates. Note that the substrate 1611 functions as a counter substrate.

The spacer 1647 may be formed in a manner that particles of several micrometers are dispersed or in a manner that a resin layer is formed over the entire surface of the substrate and then etched.

The conductive layer 1641 functions as a counter electrode. The conductive layer 1641 can be formed using a material similar to that of the wiring 1629 or the pixel electrode 1631. In addition, the insulating layer 1643 functions as an alignment film.

In the terminal portion 1617, a connection terminal 1659 is formed. The connection terminal 1659 is electrically connected to the pixel portion 1603 and a wiring 1655 in the peripheral driver circuit portion. The connection terminal 1659 is formed in a manner similar to those in the pixel electrode 1631 in the pixel portion 1603 and the wiring 1629 in the peripheral driver circuit portion.

In this case, the thin film transistors 1621 and 1623 are formed through the steps with the multi-tone mask; therefore, a microcrystalline semiconductor layer 1651 which is formed concurrently with microcrystalline semiconductor layers of the thin film transistors and an impurity semiconductor layer 1653 which is formed concurrently with source regions and drain regions are formed between the wiring 1655 and the substrate 1601.

The FPC 1613 is provided over the connection terminal 1659 with an anisotropic conductive layer 1657 interposed therebetween. Further, the IC chip 1615 is provided over the FPC 1613 with an anisotropic conductive layer 1661 interposed therebetween. That is, the FPC 1613, the anisotropic conductive layers 1657 and 1661, and the IC chip 1615 are electrically connected to each other.

An adhesive material such as an ACF (anisotropic conductive film) or ACP (anisotropic conductive paste) can be used for the anisotropic conductive layers 1657 and 1661. In addition, a conductive adhesive such as silver paste, copper paste, or carbon paste, solder joint, or the like can be used for the anisotropic conductive layers 1657 and 1661.

Note that by forming a functional circuit (e.g., a memory or a buffer) in the IC chip 1615, the area of the substrate can be efficiently utilized.

Note that although the cross-sectional view in the case where the display mode is the MVA mode is described in FIG. 26B, the display mode may be a PVA (patterned vertical alignment) mode. In the case of the PVA mode, a slit may be provided for the conductive layer 1641 formed on the substrate 1611, so that liquid crystal molecules can be slanted to be aligned. In addition, the protrusion 1645 (also referred to as the alignment control protrusion) may be provided for the conductive film for which the slit is provided, so that liquid crystal molecules can be slanted to be aligned. Further, the display mode of liquid crystals is not limited to the MVA mode or the PVA mode, and a TN (twisted nematic) mode, an IPS (in-plane-switching) mode, an FFS (fringe field switching) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Although the structure is described in which the first scan line driver circuit 1605*a*, the second scan line driver circuit 1605*b*, and the signal line driver circuit 1607 are formed over the substrate 1601 in the liquid crystal panel in FIGS. 26A and 26B, a structure may be used in which a driver circuit corresponding to the signal line driver circuit 1607 is formed as a driver IC and is mounted on a liquid crystal panel by COG or the like, as illustrated in FIG. 13B. By forming the signal line driver circuit 1607 as the driver IC, power can be saved. In addition, by forming the driver IC as a semiconductor chip formed using a silicon wafer or the like, high speed operation and low power consumption of the liquid crystal panel can be achieved.

In this embodiment, an example of a cross-sectional structure of the display device is described. Such a structure can be combined with any of the shift registers in Embodiments 1 to 5. In the case where a microcrystalline semiconductor is used for a channel region of the thin film transistor, an increase in the size of the display device, a reduction in cost, an improvement in yield, or the like can be achieved. Further, by the use of a microcrystalline semiconductor for a semiconductor layer, degradation of characteristics of the thin film transistor can be suppressed, so that the life of the display device can be extended.

Note that the contents described in each drawing in this embodiment can be freely combined with or replaced with the contents described in any of the other embodiments as appropriate.

Embodiment 8

In this embodiment, examples of electronic devices are described.

A display device according to any of the above embodiments can be used in a variety of electronic devices (including an amusement machine). Examples of electronic devices are a television set (also referred to as a television or a television receiver), a monitor of a computer, electronic paper, a camera such as a digital camera or a digital video camera, a digital photo frame, a mobile phone handset (also referred to as a mobile phone or a mobile phone device), a portable game machine, a portable information terminal, an audio reproducing device, a large game machine such as a pinball machine, and the like.

Figure 27A:
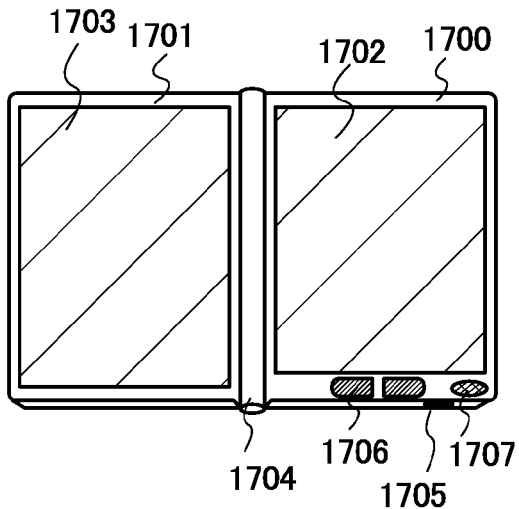
FIGS. 27A to 27D are diagrams showing electronic devices including a display device.

Electronic paper which is one embodiment of the display device according to any of the above embodiments can be used in electronic devices in all fields as long as they display information. For example, electronic paper can be used in an electronic book (e-book) reader, a poster, an advertisement in a vehicle such as a train, display of a variety of cards such as credit cards, or the like. FIG. 27A illustrates an example of an electronic device.

FIG. 27A illustrates an example of an e-book reader. The e-book reader illustrated in FIG. 27A includes two housings 1700 and 1701. The housings 1700 and 1701 are combined with each other with a hinge 1704, so that the e-book reader can be opened and closed. With such a structure, the e-book reader can be operated like a paper book.

A display portion 1702 is incorporated in the housing 1700, and a display portion 1703 is incorporated in the housing 1701. The display portions 1702 and 1703 may display a series of images or different images. In the case where the display portion 1702 and 1703 display different images, for example, a display portion on the right side (the display portion 1702 in FIG. 27A) can display text and a display portion on the left side (the display portion 1703 in FIG. 27A) can display images.

FIG. 27A illustrates an example in which the housing 1700 includes an operation portion and the like. For example, the housing 1700 includes a power input terminal 1705, operation keys 1706, a speaker 1707, and the like. With the operation keys 1706, pages can be turned. Note that a keyboard, a pointing device, or the like may be provided on a surface of the housing, on which the display portion is provided. Further, an external connection terminal (e.g. an earphone terminal, a USB terminal, or a terminal which can be connected to a variety of cables such as USB cables), a recording medium insertion portion, or the like may be provided on a back surface or a side surface of the housing. Furthermore, the e-book reader illustrated in FIG. 27A may serve as an electronic dictionary.

Further, the e-book reader illustrated in FIG. 27A may transmit and receive data wirelessly. Through wireless communication, data related to a desired book or the like can be purchased and downloaded from an electronic book server.

Figure 27B:
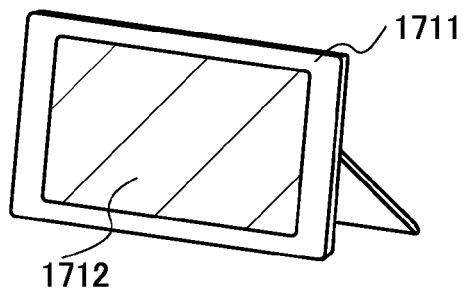

FIG. 27B shows an example of a digital photo frame using a display device such as electronic paper, a liquid crystal display device, or a light-emitting display device. For example, in the digital photo frame illustrated in FIG. 27B, a display portion 1712 is incorporated in a housing 1711. The display portion 1712 can display a variety of images. For example, the display portion 1712 can display data related to images photographed by a digital camera or the like, so that the digital photo frame can function as a normal photo frame.

Note that the digital photo frame illustrated in FIG. 27B includes an operation portion, an external connection portion (e.g., a USB terminal or a terminal which can be connected to a variety of cables such as USB cables), a recording medium insertion portion, and the like. Although they may be provided on a surface on which the display portion is provided, it is preferable to provide them on a side surface or a back surface because the design of the digital photo frame is improved. For example, a memory which stores data related to images photographed by a digital camera is inserted in the recording medium insertion portion of the digital photo frame, so that the data related to the images can be loaded to the digital photo frame and can be displayed on the display portion 1712.

Further, the digital photo frame illustrated in FIG. 27B may transmit and receive data wirelessly. Through wireless communication, data related to desired images can be loaded and displayed.

Figure 27C:
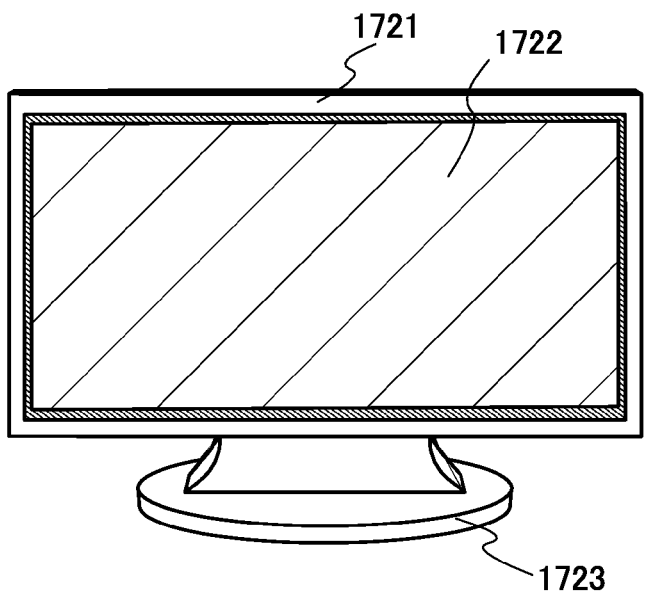

FIG. 27C shows an example of a television set in which a display device such as a liquid crystal display device or a light-emitting display device is used. In the television set illustrated in FIG. 27C, a display portion 1722 is incorporated in a housing 1721. The display portion 1722 can display images. Further, here, the housing 1721 is supported by a stand 1723. The display device described in any of the above embodiments can be used in the display portion 1722.

The television set illustrated in FIG. 27C can be operated by an operation switch of the housing 1721 or a separate remote controller. Channels and volume can be controlled by operation keys of the remote controller, so that images displayed on the display portion 1722 can be controlled. Further, the remote controller may include a display portion for displaying data output from the remote controller.

Note that the television set illustrated in FIG. 27C includes a receiver, a modem, and the like. With the receiver, a general television broadcast can be received. Further, by connecting the television set to a wired or wireless communication network via the modem, one-way (from, transmitter to a receiver) or two-way (between a transmitter and a receiver, between receivers, or the like) information communication can be performed.

Figure 27D:
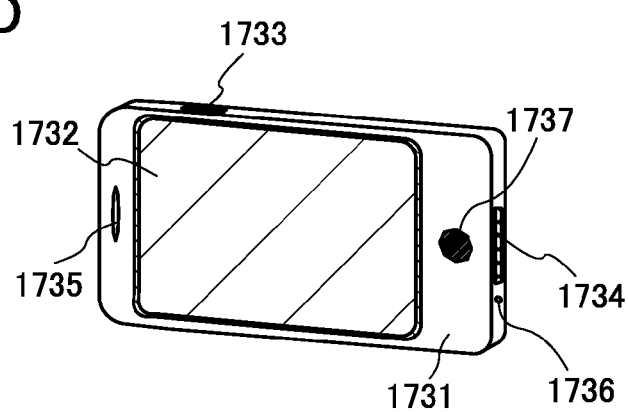

FIG. 27D shows an example of a mobile phone handset in which a display device such as electronic paper, a liquid crystal display device, or a light-emitting display device is used. The mobile phone handset illustrated in FIG. 27D includes a display portion 1732 incorporated in a housing 1731, operation buttons 1733 and 1737, an external connection port 1734, a speaker 1735, a microphone 1736, and the like.

The display portion 1732 of the mobile phone handset illustrated in FIG. 27D is a touch panel. By touching the display portion 1732 with a finger or the like, contents displayed on the display portion 1732 can be controlled. Further, operations such as making calls and composing mails can be performed by touching the display portion 1002 with a finger or the like.

The display portion 1732 has mainly three screen modes. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1732 so that text displayed on a screen can be inputted. In this case, it is preferable to display a keyboard or number buttons on a large area of the screen of the display portion 1732.

By providing a detection device including a sensor for detecting inclination, such as a gyroscope or an acceleration sensor, inside the mobile phone handset illustrated in FIG. 27D, data displayed on the display portion 1732 can be automatically changed by determining the orientation of the mobile phone handset (whether the mobile phone handset is placed horizontally or vertically).

Further, the screen modes are changed by touching the display portion 1732 or operating the operation button 1737 of the housing 1731. Alternatively, the screen modes may be changed depending on the kind of an image displayed on the display portion 1732. For example, when a signal of an image displayed on the display portion is moving image data, the screen mode can be changed into the display mode. When the signal is text data, the screen mode can be changed into the input mode.

Further, in the input mode, when input by touching the display portion 1732 is not performed for a certain period while a signal detected by an optical sensor in the display portion 1732 is detected, the screen mode may be controlled so as to be changed from the input mode into the display mode.

The display portion 1732 can also function as an image sensor. For example, the image of a palm print, a fingerprint, or the like is taken by an image sensor by touching the display portion 1732 with the palm or the finger, so that authentication can be performed. Further, by using a backlight which emits near-infrared light or a sensing light source which emits near-infrared light in the display portion, the image of a finger vein, a palm vein, or the like can be taken.

In this embodiment, examples of electronic devices each including the display device described in any of the above embodiments are described. The electronic devices each include a display device in which the shift register in Embodiment 1 or 2 is mounted on a driver circuit. In the case where a microcrystalline semiconductor is used for a channel region of a thin film transistor included in the shift register, an increase in the size of the display device, a reduction in cost, an improvement in yield, or the like can be achieved. Further, by the use of a microcrystalline semiconductor for the channel region of the thin film transistor, degradation of characteristics of the thin film transistor can be suppressed, so that the life of the display device can be extended.

Note that the contents described in each drawing in this embodiment can be freely combined with or replaced with the contents described in any of the other embodiments as appropriate.

This application is based on Japanese Patent Application serial no. 2009-029477 filed with Japan Patent Office on Feb. 12, 2009, the entire contents of which are hereby incorporated by reference.

What is claimed is:

1. A driver circuit comprising:
   a first transistor;
   a second transistor;
   a third transistor;
   a fourth transistor;
   a fifth transistor;
   a sixth transistor;
   a seventh transistor; and
   a eighth transistor,
   wherein one of a source and a drain of the first transistor is electrically connected to one of a source and a drain of the second transistor,
   wherein one of a source and a drain of the third transistor is electrically connected to a gate of the first transistor,
   wherein a gate of the fourth transistor is electrically connected to a gate of the second transistor,
   wherein one of a source and a drain of the fifth transistor is electrically connected to the other of the source and the drain of the third transistor,
   wherein one of a source and a drain of the sixth transistor is electrically connected to the gate of the second transistor,
   wherein one of a source and a drain of the seventh transistor is electrically connected to the gate of the second transistor,
   wherein one of a source and a drain of the eighth transistor is electrically connected to the gate of the second transistor,
   wherein the other of the source and the drain of the fifth transistor is electrically connected to the other of the source and the drain of the seventh transistor, and
   wherein the other of the source and the drain of the fifth transistor is electrically connected to the other of the source and the drain of the sixth transistor.

2. The driver circuit according to claim 1, wherein the other of the source and the drain of the second transistor is electrically connected to a first line,
   wherein the other of the source and the drain of the fourth transistor is electrically connected to the first line, and
   wherein the other of the source and the drain of the eighth transistor is electrically connected to the first line.

3. The driver circuit according to claim 1, wherein a gate of the third transistor is electrically connected to a second line,
   wherein the other of the source and the drain of the fifth transistor is electrically connected to the second line, and
   wherein the other of the source and the drain of the sixth transistor is electrically connected to the second line.

4. The driver circuit according to claim 1, further comprising:
   a ninth transistor;
   a tenth transistor; and
   an eleventh transistor,
   wherein a gate of the ninth transistor is electrically connected to the gate of the first transistor,
   wherein the gate of the tenth transistor is electrically connected to the gate of the second transistor,
   wherein one of a source and a drain of the ninth transistor is electrically connected to one of a source and a drain of the tenth transistor,
   wherein one of a source and a drain of the eleventh transistor is electrically connected to the one of the source and the drain of the ninth transistor, and
   wherein the other of the source and the drain of the first transistor is electrically connected to the other of the source and the drain of the ninth transistor.

5. The driver circuit according to claim 4, wherein the other of the source and the drain of the second transistor is electrically connected to a first line,
   wherein the other of the source and the drain of the fourth transistor is electrically connected to the first line,
   wherein the other of the source and the drain of the eighth transistor is electrically connected to the first line,
   wherein the other of the source and the drain of the tenth transistor is electrically connected to the first line,
   wherein the other of the source and the drain of the eleventh transistor is electrically connected to the first line,
   wherein the other of the source and the drain of the fifth transistor is electrically connected to a second line, and
   wherein the other of the source and the drain of the sixth transistor is electrically connected to the second line.

6. The driver circuit according to claim 5, wherein a gate of the third transistor is electrically connected to a third line.

7. The driver circuit according to claim 5, further comprising a twelfth transistor,
   wherein one of a source and a drain of the twelfth transistor is electrically connected to the gate of the tenth transistor,
   wherein a gate of the twelfth transistor is electrically connected to the one of the source and the drain of the first transistor, and
   wherein the other of the source and the drain of the twelfth transistor is electrically connected to the first line.

8. The driver circuit according to claim 5, further comprising a capacitor, wherein a first electrode of the capacitor is electrically connected to the gate of the second transistor, and wherein a second electrode of the capacitor is electrically connected to the first line.

9. The driver circuit according to claim 5, further comprising a thirteenth transistor, wherein one of a source and a drain of the thirteenth transistor is electrically connected to the one of the source and the drain of the eleventh transistor, and wherein the other of the source and the drain of the thirteenth transistor is electrically connected to the first line.

10. The driver circuit according to claim 6, wherein the first line is a first power supply line, wherein the second line is a second power supply line, and wherein the third line is a third power supply line.

11. A display device comprising:
a pixel portion formed over a substrate; and
a circuit formed over the substrate, the circuit comprising:
a first transistor;
a second transistor;
a third transistor;
a fourth transistor;
a fifth transistor;
a sixth transistor;
a seventh transistor; and
a eighth transistor,
wherein one of a source and a drain of the first transistor is electrically connected to one of a source and a drain of the second transistor,
wherein one of a source and a drain of the third transistor is electrically connected to a gate of the first transistor,
wherein a gate of the fourth transistor is electrically connected to a gate of the second transistor,
wherein one of a source and a drain of the fifth transistor is electrically connected to the other of the source and the drain of the third transistor,
wherein one of a source and a drain of the sixth transistor is electrically connected to the gate of the second transistor,
wherein one of a source and a drain of the seventh transistor is electrically connected to the gate of the second transistor,
wherein one of a source and a drain of the eighth transistor is electrically connected to the gate of the second transistor,
wherein the other of the source and the drain of the fifth transistor is electrically connected to the other of the source and the drain of the seventh transistor, and
wherein the other of the source and the drain of the fifth transistor is electrically connected to the other of the source and the drain of the sixth transistor.

12. The display device according to claim 11, wherein the other of the source and the drain of the second transistor is electrically connected to a first line, wherein the other of the source and the drain of the fourth transistor is electrically connected to the first line, and wherein the other of the source and the drain of the eighth transistor is electrically connected to the first line.

13. The display device according to claim 11, wherein a gate of the third transistor is electrically connected to a second line, wherein the other of the source and the drain of the fifth transistor is electrically connected to the second line, and wherein the other of the source and the drain of the sixth transistor is electrically connected to the second line.

14. The display device according to claim 11, further comprising:
a ninth transistor;
a tenth transistor; and
an eleventh transistor,
wherein a gate of the ninth transistor is electrically connected to the gate of the first transistor,
wherein the gate of the tenth transistor is electrically connected to the gate of the second transistor,
wherein one of a source and a drain of the ninth transistor is electrically connected to one of a source and a drain of the tenth transistor,
wherein one of a source and a drain of the eleventh transistor is electrically connected to the one of the source and the drain of the ninth transistor, and
wherein the other of the source and the drain of the first transistor is electrically connected to the other of the source and the drain of the ninth transistor.

15. The display device according to claim 14, wherein the other of the source and the drain of the second transistor is electrically connected to a first line, wherein the other of the source and the drain of the fourth transistor is electrically connected to the first line, wherein the other of the source and the drain of the eighth transistor is electrically connected to the first line, wherein the other of the source and the drain of the tenth transistor is electrically connected to the first line, wherein the other of the source and the drain of the eleventh transistor is electrically connected to the first line, wherein the other of the source and the drain of the fifth transistor is electrically connected to a second line, and wherein the other of the source and the drain of the sixth transistor is electrically connected to the second line.

16. The display device according to claim 15, wherein a gate of the third transistor is electrically connected to a third line.

17. The display device according to claim 15, further comprising a twelfth transistor, wherein one of a source and a drain of the twelfth transistor is electrically connected to the gate of the tenth transistor, wherein a gate of the twelfth transistor is electrically connected to the one of the source and the drain of the first transistor, and wherein the other of the source and the drain of the twelfth transistor is electrically connected to the first line.

18. The display device according to claim 15, further comprising a capacitor, wherein a first electrode of the capacitor is electrically connected to the gate of the second transistor, and wherein a second electrode of the capacitor is electrically connected to the first line.

19. The display device according to claim 15, further comprising a thirteenth transistor, wherein one of a source and a drain of the thirteenth transistor is electrically connected to the one of the source and the drain of the eleventh transistor, and wherein the other of the source and the drain of the thirteenth transistor is electrically connected to the first line.

20. The display device according to claim 16, wherein the first line is a first power supply line, wherein the second line is a second power supply line, and wherein the third line is a third power supply line.

21. An electronic device comprising the display device according to claim 11, wherein the electronic device further comprises at least one selected from the group consisting of an antenna and an operation key.

* * * * *